(12) United States Patent | (10) Patent No.: US 12,696,404 B2
Kim et al. | (45) Date of Patent: Jul. 28, 2026

(54) DISPLAY DEVICE

(71) Applicant: LG ELECTRONICS INC., Seoul (KR)

(72) Inventors: Yonghan Kim, Seoul (KR); Byungkil Lim, Seoul (KR); Juhyun Lee, Seoul (KR); Kiyoon Nam, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 84 days.

(21) Appl. No.: 18/758,224

(22) Filed: Jun. 28, 2024

(65) Prior Publication Data

US 2025/0133670 A1 Apr. 24, 2025

(30) Foreign Application Priority Data

Oct. 20, 2023 (KR) ........................ 10-2023-0141136

(51) Int. Cl.
H05K 5/02 (2006.01)

(52) U.S. Cl.
CPC .................................. H05K 5/0217 (2013.01)

(58) Field of Classification Search
CPC .. H05K 5/0217; H05K 5/03; G02F 1/133325; G02F 1/133314; G06F 1/1637
See application file for complete search history.

(56) References Cited

U.S. PATENT DOCUMENTS

2017/0060187 A1* 3/2017 Amano ............... H04M 1/0249
2018/0073544 A1* 3/2018 Uchiyama ............... F16B 33/02

2018/0116058 A1 4/2018 Sullivan et al.
2020/0201382 A1* 6/2020 Lee ........................ G06F 1/1601
2021/0072794 A1* 3/2021 Lee ........................ G06F 1/1637
2021/0263372 A1* 8/2021 Kang ........................ G06F 1/20
2022/0346287 A1* 10/2022 Kang ................. H05K 7/20963

FOREIGN PATENT DOCUMENTS

AU 2023200877 8/2023
KR 20050075862 7/2005
KR 20110008709 1/2011
(Continued)

OTHER PUBLICATIONS

Machine translation of KR 20110008709A (Year: 2025).*
(Continued)

*Primary Examiner* — Sagar Shrestha
(74) *Attorney, Agent, or Firm* — LEE, HONG, DEGERMAN, KANG & WAIMEY

(57) ABSTRACT

A display device is disclosed. The display device includes a display panel, a composite panel coupled to the display panel, and a fastening member coupled to the composite panel. The composite panel includes a front skin defining a front surface of the composite panel, a rear skin defining a rear surface of the composite panel and opposed to the front skin, a core positioned between the front skin and the rear skin and including fibers, and a fastening hole formed through the front skin, the rear skin, and the core. The fastening member includes a shaft body disposed in the fastening hole, and a head connected to the shaft body and pushed into one of the front skin or the rear skin. One of the front skin or the rear skin is in contact with a lateral surface of the head.

14 Claims, 49 Drawing Sheets

(56) References Cited

FOREIGN PATENT DOCUMENTS

| KR | 1020200020417 | 2/2020 |
| KR | 1020220147364 | 11/2022 |

OTHER PUBLICATIONS

Machine translation of KR 20050075862A (Year: 2025).*
Korean Intellectual Property Office Application No. 10-2023-0141136, Office Action dated Jan. 7, 2025, 7 pages.
European Patent Office Application Serial No. 24184853.0, Search Report dated Jan. 29, 2025, 10 pages.
Japan Patent Office Application No. 2024-104621, Office Action dated May 7, 2025, 4 pages.

* cited by examiner

DISPLAY DEVICE

CROSS-REFERENCE TO RELATED APPLICATION

Pursuant to 35 U.S.C. § 119, this application claims the benefit of earlier filing date and right of priority to Korean Application No(s). 10-2023-0141136, filed on Oct. 20, 2023, the contents of which are all incorporated by reference herein in its entirety.

BACKGROUND OF THE INVENTION

1. Field of the Invention

The present disclosure relates to a display device.

2. Description of the Related Art

With the development of information society, demand for various kinds of display devices is increasing. In response to this demand, various kinds of display devices, such as LCDs (Liquid Crystal Displays), PDPs (Plasma Display Panels), ELDs (Electro-luminescent Displays), VFDs (Vacuum Fluorescent Displays) and OLEDs (Organic Light-Emitting Diodes) have been recently researched and used.

There among, a display device which utilizes organic light emitting diodes is excellent in brightness and a viewing angle and does not need to include a backlight unit, compared to a liquid crystal display device, thereby conveying an advantage of realizing an ultra-thin display device.

In recent years, various studies have been intensively conducted in order to ensure rigidity and structural stability of an ultra-thin display device having a large screen.

SUMMARY OF THE INVENTION

It is an object of the present disclosure to solve the above and other problems.

It is another object of the present disclosure to ensure structural rigidity of an ultra-thin display device having a large screen.

It is another object of the present disclosure to ensure structural rigidity of a display device.

It is another object of the present disclosure to improve flatness of a frame of a display device.

It is another object of the present disclosure to improve a coupling structure of a display device.

It is another object of the present disclosure to improve durability and stability of a coupling structure between a composite panel and a fastening member.

In order to accomplish the above and other objects, a display device according to one aspect of the present disclosure may include a display panel, a composite panel coupled to the display panel, and a fastening member coupled to the composite panel. The composite panel includes a front skin defining a front surface of the composite panel, a rear skin defining a rear surface of the composite panel and opposed to the front skin, a core positioned between the front skin and the rear skin and including fibers, and a fastening hole formed through the front skin, the rear skin, and the core. The fastening member includes a shaft body disposed in the fastening hole, and a head connected to the shaft body and pushed into one of the front skin or the rear skin. One of the front skin or the rear skin is in contact with a lateral surface of the head.

BRIEF DESCRIPTION OF THE DRAWINGS

The above and other objects, features and other advantages of the present disclosure will be more clearly understood from the following detailed description taken in conjunction with the accompanying drawings, in which:

FIGS. 1 to 49 are views illustrating display devices according to embodiments of the present disclosure.

DETAILED DESCRIPTION OF THE PREFERRED EMBODIMENTS

Figure 1:
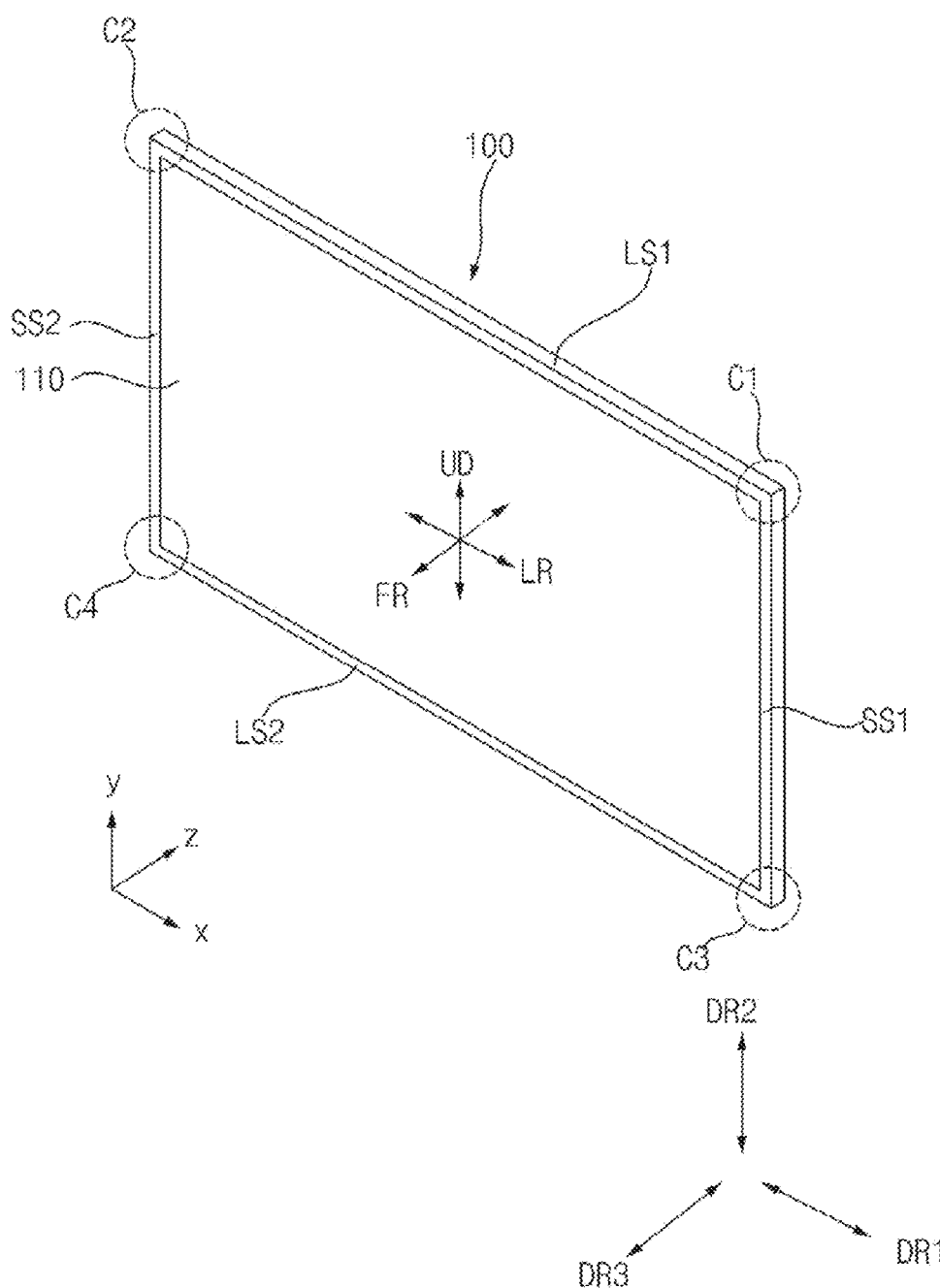

A description will now be given in detail according to exemplary embodiments disclosed herein, with reference to the accompanying drawings. For the sake of brevity of description with reference to the drawings, the same or equivalent components are denoted by the same reference numbers, and a description thereof will not be repeated.

In general, suffixes such as "module" and "unit" may be used to refer to elements or components. The use of such suffixes herein is merely intended to facilitate description of the specification, and the suffixes do not have any special meaning or function.

In the present disclosure, that which is well known to one of ordinary skill in the relevant art has generally been omitted for the sake of brevity. The accompanying drawings are used to facilitate understanding of various technical features, and it should be understood that the embodiments presented herein are not limited by the accompanying drawings. As such, the present disclosure should be construed to extend to any alterations, equivalents and substitutes, in addition to those that are particularly set out in the accompanying drawings.

It is to be understood that, although the terms "first," "second," etc. may be used herein to describe various elements, these elements should not be limited by these terms. These terms are only used to distinguish one element from another.

It will be understood that when an element is referred to as being "connected to" another element, intervening elements may be present. In contrast, it will be understood that when an element is referred to as being "directly connected to" another element, there are no intervening elements present.

A singular representation may include a plural representation unless the context clearly indicates otherwise.

In the following description, when an example is described with reference to a specific figure, a reference numeral that is not illustrated in the specific figure may be mentioned. The reference numeral that is not illustrated with the specific figure is used in the case in which the reference numeral appears in other figures.

Referring to FIG. 1, the display device 100 may include a display panel 110. The display panel 110 may display a screen.

The display device 100 may include a first long side LS1, a second long side LS2, which faces the first long side LS1, a first short side SS1 adjacent to the first long side LS1 and the second long side LS2, and a second short side SS2, which faces the first short side SS1.

Although each of the first and second long sides LS1 and LS2 is illustrated and described as being longer than each of the first and second short sides SS1 and SS2 for convenience of explanation, the length of each of the first and second long sides LS1 and LS2 may be almost the same as that of each of the first and second short sides SS1 and SS2.

A direction parallel to the first and second long sides LS1 and LS2 of the display device 100 may be referred to as a first direction DR1 or a lateral direction LR. A direction parallel to the first and second short sides SS1 and SS2 of the display device 1 may be referred to as a second direction DR2 or a vertical direction UD.

A direction perpendicular to the first and second long sides LS1 and LS2 and the first and second short sides SS1 and SS2 of the display device 100 may be referred to as a third direction DR3 or an anteroposterior direction FR. Here, the direction in which the display panel 110 displays an image may be referred to as a forward direction, and the direction opposite the forward direction may be referred to as a rearward direction.

Hereinafter, a display panel, which is composed of, for example, an organic light emitting diode (OLED), will be described. However, the display device applicable to the present disclosure is not limited thereto.

The display panel 110 may define the front surface of the display device 100, and may display an image on the front surface of the display device 110. The display panel 110 may divide an image into a plurality of pixels, and may control the color, brightness and chroma of each of the pixels, thereby outputting the image. The display panel 110 may be divided into an active area, in which an image is displayed, and an inactive area, in which an image is not displayed. The display panel 110 may generate light corresponding to red, green or blue in response to a control signal.

Figure 2:
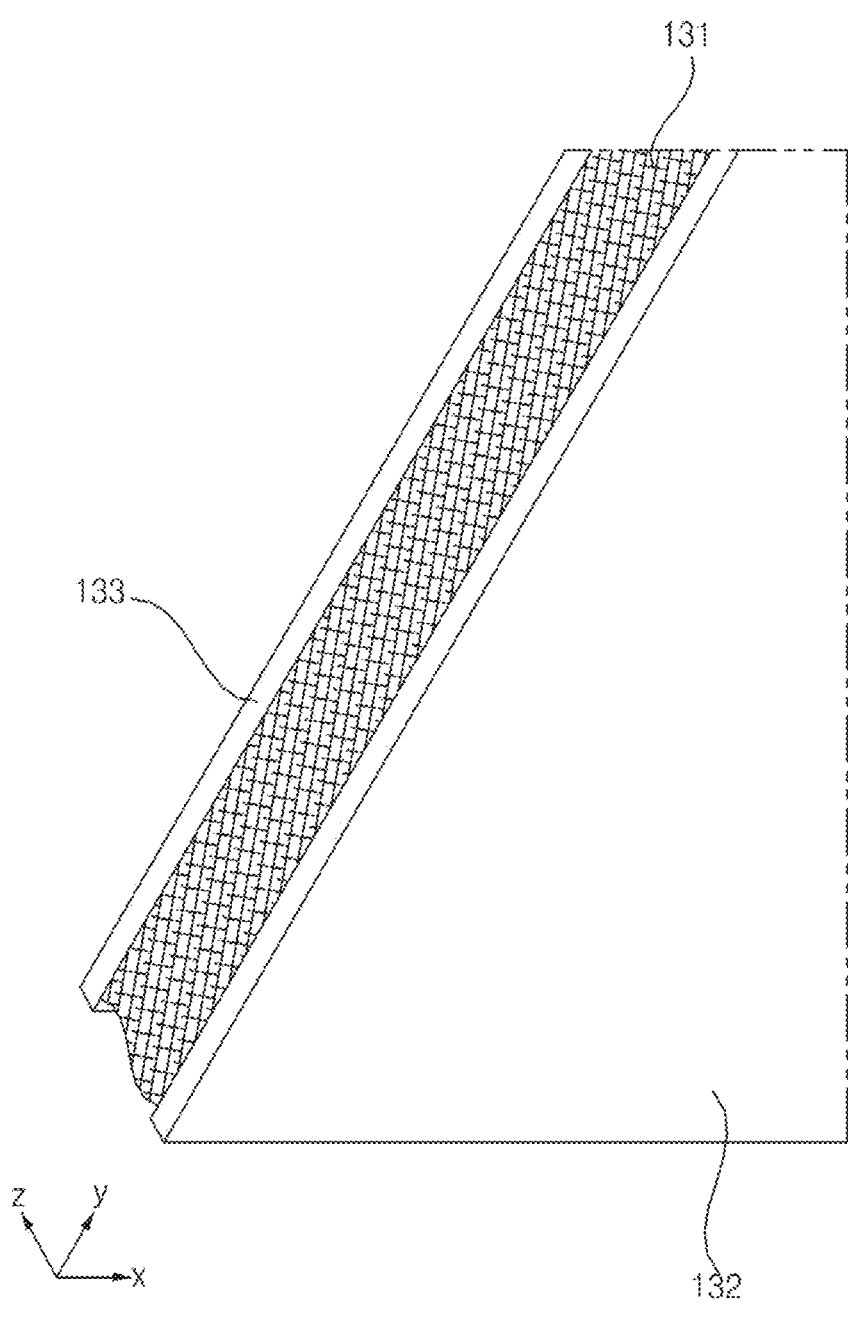

Referring to FIG. 2, a composite panel 130 may include a core 131, a front skin 132, and a rear skin 133. The core 131, the front skin 132, and the rear skin 133 may be coupled to one another. The composite panel 130 may be referred to as a fiber complexed panel 130, a fiber complexed plate 130, a composite panel 130, or a middle frame 130 or a rear cover 130, or a rear panel 130.

The front skin 132 may define the front surface of the composite panel 130. The rear skin 133 may define the rear surface of the composite panel 130. The front skin 132 and the rear skin 133 may include a metal material.

For example, the front skin 132 and the rear skin 133 may be a galvanized iron. In another example, the front skin 132 and the rear skin 133 may include aluminum (Al).

For example, the thickness of each of the front skin 132 and the rear skin 133 may range from 0.2 mm to 0.5 mm. In another example, the thickness of each of the front skin 132 and the rear skin 133, which are made of a galvanized iron, may be 0.27 mm. In a further example, the thickness of each of the front skin 132 and the rear skin 133, which include aluminum, may be 0.5 mm.

The front skin 132 and the rear skin 133 may be opposed to each other based on the core which will be described later. The core 131 may be disposed between the front skin 132 and the rear skin 133. The core 131 may include fibers. The core 131 may be made of a complexed material. The core 131 may include main fibers and binder fibers. The binder fibers may be mixed with the main fibers in the state of being interposed therebetween.

The front skin 132 and/or the rear skin 133 may be coupled to the core 131 through hot melt technology. A hot melt sheet may be disposed between the front skin 132 and the core 131, and a hot melt sheet may be disposed between the rear skin 133 and the core 131. The hot melt sheet may be a film. For example, the hot melt sheet may be a film, such as an EVA film, an acryl film and a polyurethane film, having a thickness of 50 micrometer or more. The core 131 may be positioned between the front skin 132 and the rear skin 133 with the hot melt sheet interposed therebetween, and may be bonded to one another through rolls at 190° C. or higher for 1 minute or longer.

Consequently, the display device may have improved bending rigidity and/or torsional rigidity.

Figure 3:
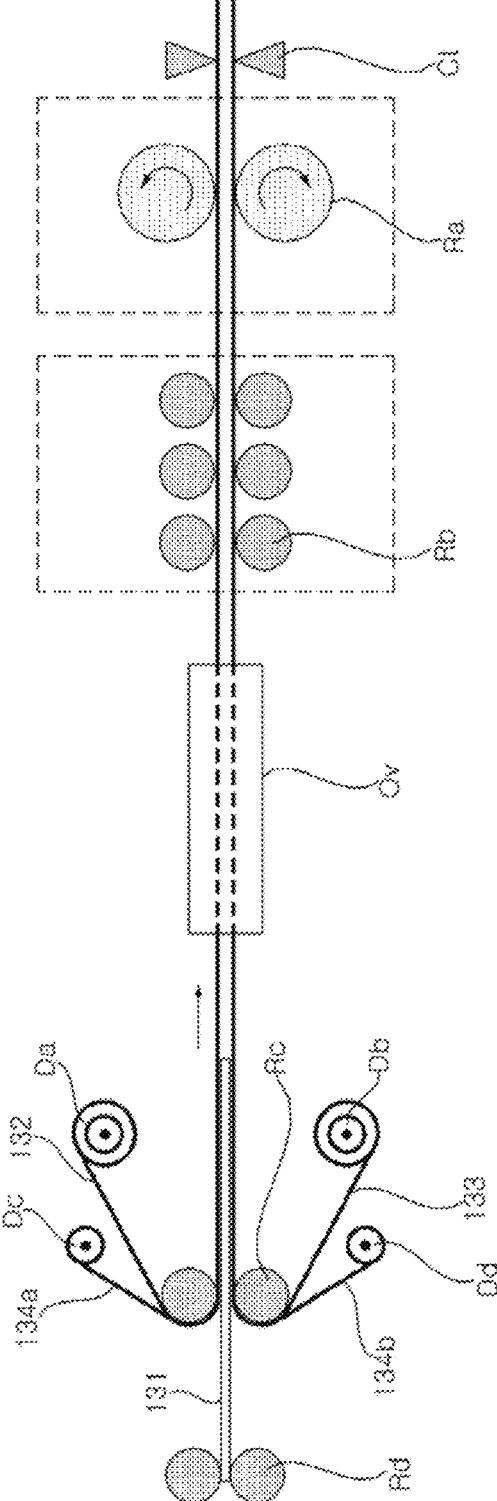
Figure 4:
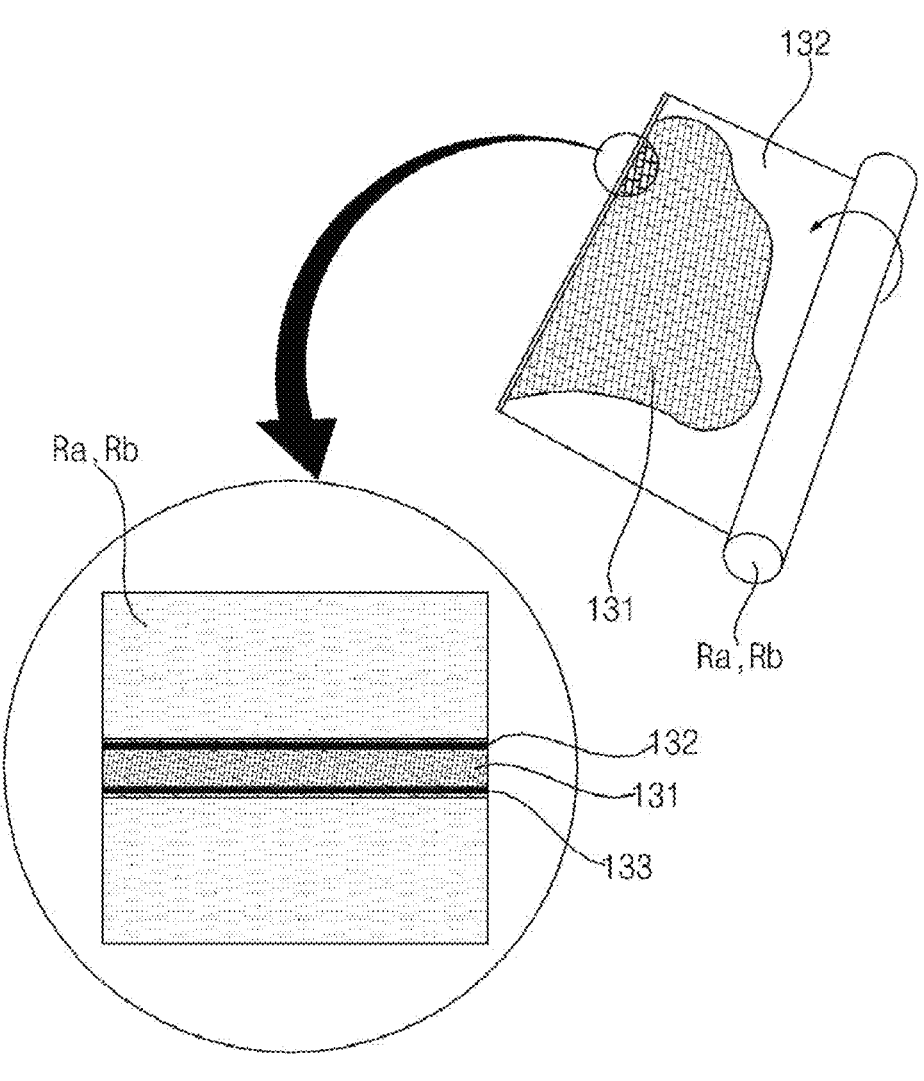

Referring to FIGS. 3 and 4, the composite panel 130 may be manufactured through such a process as to press the front skin 132 and the rear skin 133 to the core 131 using a plurality of rollers. This process may be referred to as a roll-to-roll process.

Referring to FIG. 3, with rotation of pinch rollers Ra, which serve as a driving motor, the front skin 132 may be unwound from a front drum Da and the rear skin 133 may be unwound from the rear drum Db while the core 131 is moved through feeding rollers Rd. At the same time, a first adhesive 134a, configured to couple the front skin 132 to the core 131, may be unwound from a first drum DC, and a second adhesive 134b, configured to couple the rear skin 133 to the core 131, may be unwound from a second drum Db. Here, the front skin 132, the first adhesive 134a, the core 131, the second adhesive 134b, and the rear skin 133 may be stacked in that order, and may be guided toward an oven Ov by means of guide rollers Rc. The first and second adhesives 134a and 134b may be hot melt sheets, respectively.

The first and second adhesives 134a and 134b may be melted in the oven Ov, thereby coupling each of the front skin 132 and the rear skin 133 to the core 131. For example, the melting temperature of each of the first and second adhesives 134a and 134b may be about 150° C., and the atmosphere temperature of the oven Ov may be about 200° C. For example, the peel-off force of each of the first and second adhesives 134a and 134b may be about 10 kgf or higher.

The front skin 132, the core 131, and the rear skin 133, which have passed through the oven Ov, may be guided to the press rollers Rb by virtue of rotation of the pinch rollers Ra, and may be pressed by means of the press rollers Rb. As a result, the binding force between the front skin 132, the core 131, and the rear skin 133 may be further increased. The front skin 132, the core 131, and the rear skin 133, which are coupled to one another, may pass through the pinch rollers Ra, and may be cut by means of a cutter Ct, thereby manufacturing the composite panel 130 having a certain size.

Referring to FIG. 4, the press rollers Rb or the pinch rollers Ra may be in contact with the outer surfaces of the front skin 132 and the rear skin 133. When the press rollers Rb or the pinch rollers Ra rotate, the composite panel 130 may be moved in the longitudinal direction (that is, the lateral direction LR) of the core 131. Here, the front skin 132 and the rear skin 133 may be continuously coupled to each other from one end to the other end of the core 132 in the longitudinal direction of the core 131.

The front skin 132 and the rear skin 133 of the composite panel 130 may be made flat. Specifically, the rear surface of the rear skin 133, which defines the rear surface of the display device 100, may be made flat such that additional procedures of painting the rear surface of the rear skin 133 or adhering a sheet to the rear surface for pleasant appearance is facilitated.

In addition to the roll-to-roll process of making the front skin 132 and the rear skin 133 flat, which is described with reference to FIGS. 3 and 4, the core 131, the front skin 132, and the rear skin 133 may also be coupled to one another through a process of sequentially layering the front skin 132, the front skin 132, and the rear skin 133 and intercoupling the same.

Figure 5:
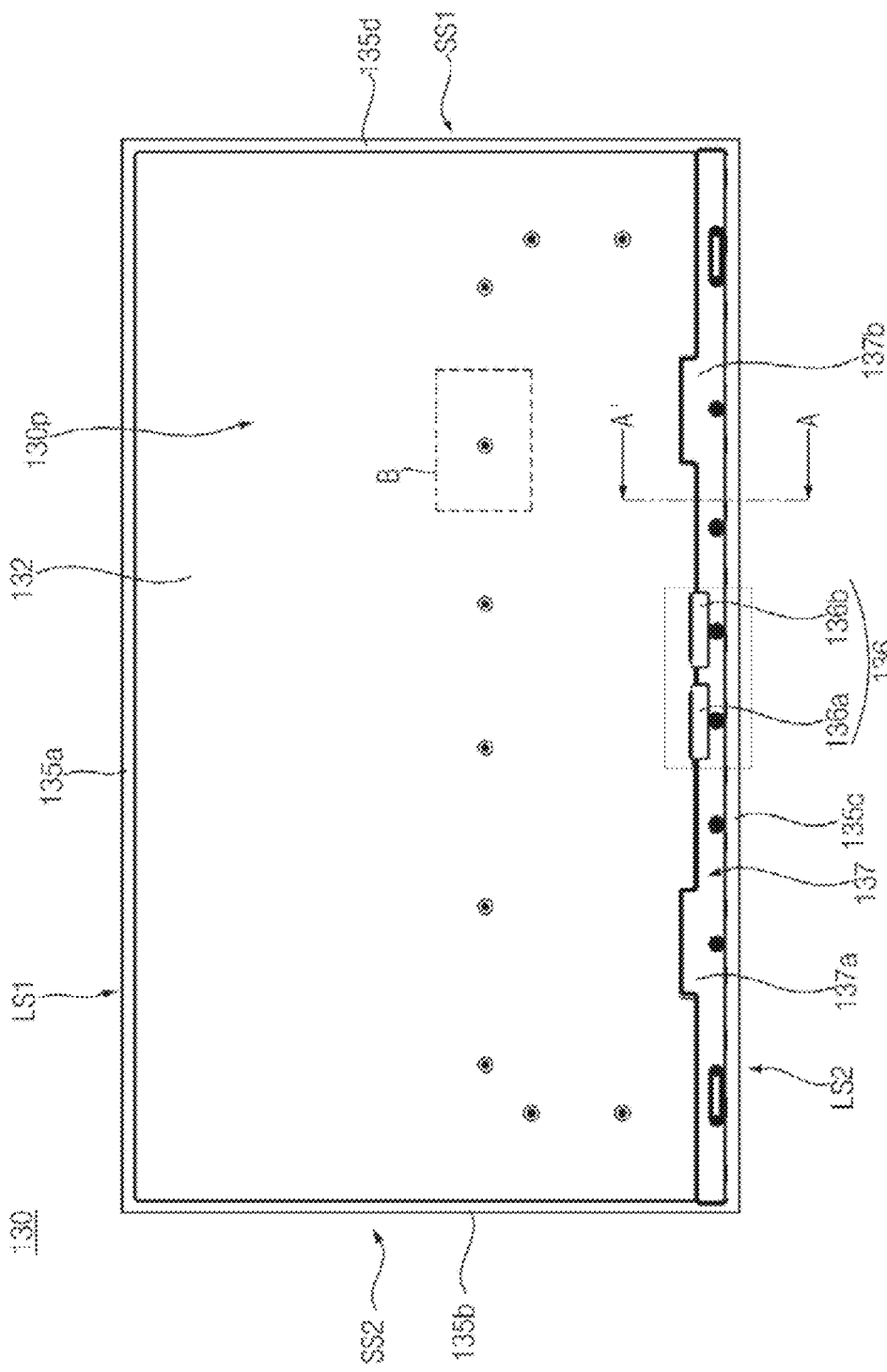

Referring to FIG. 5, the composite panel 130 may include a flat plate portion 130P, a receiving portion 137, and an outer part 135. The outer part 135 may be formed at the periphery of the flat plate portion 130P. A first outer part 135a may be formed along the upper side of the flat plate portion 130P, and a second outer part 135b may be formed along the left side of the flat plate portion 130P. Furthermore, a third outer part 135c may be formed along the right side of the flat plate portion 130P, and a fourth outer part 135d may be formed along the right side of the flat plate portion 130P. The outer part 135 may be formed by pressing the flat plate portion 130P. The outer part 135 may be lowered from the flat plate portion 130P so as to form a stepped portion. The thickness of the flat plate portion 130P may be greater than the thickness of the outer part 135.

A cable hole 136 may be formed through the front skin 132 (see FIG. 2) and the rear skin 133 (see FIG. 2) in the receiving portion 137. The cable hole 136 may be formed in the receiving portion 137 adjacent to the lower side of the flat plate portion 130P. The cable hole 136 may include a plurality of cable holes. A first cable hole 136a may be positioned close to a second cable hole 136b.

The receiving portion 137 may be formed between the flat plate portion 130P and the third outer part 135c adjacent to the lower side of the flat plate portion 130P. The receiving portion 137 may include a plurality of receiving portions. A first receiving portion 137a may be positioned between the first cable hole 136a and the short side SS2. A second receiving portion 137b may be positioned between the second cable hole 136b and the first short side SS1. The receiving portion 137 may be formed by pressing the flat plate portion 130P. The receiving portion 137 may be lowered from the flat plate portion 130P and/or the third outer part 135c.

Figure 6:
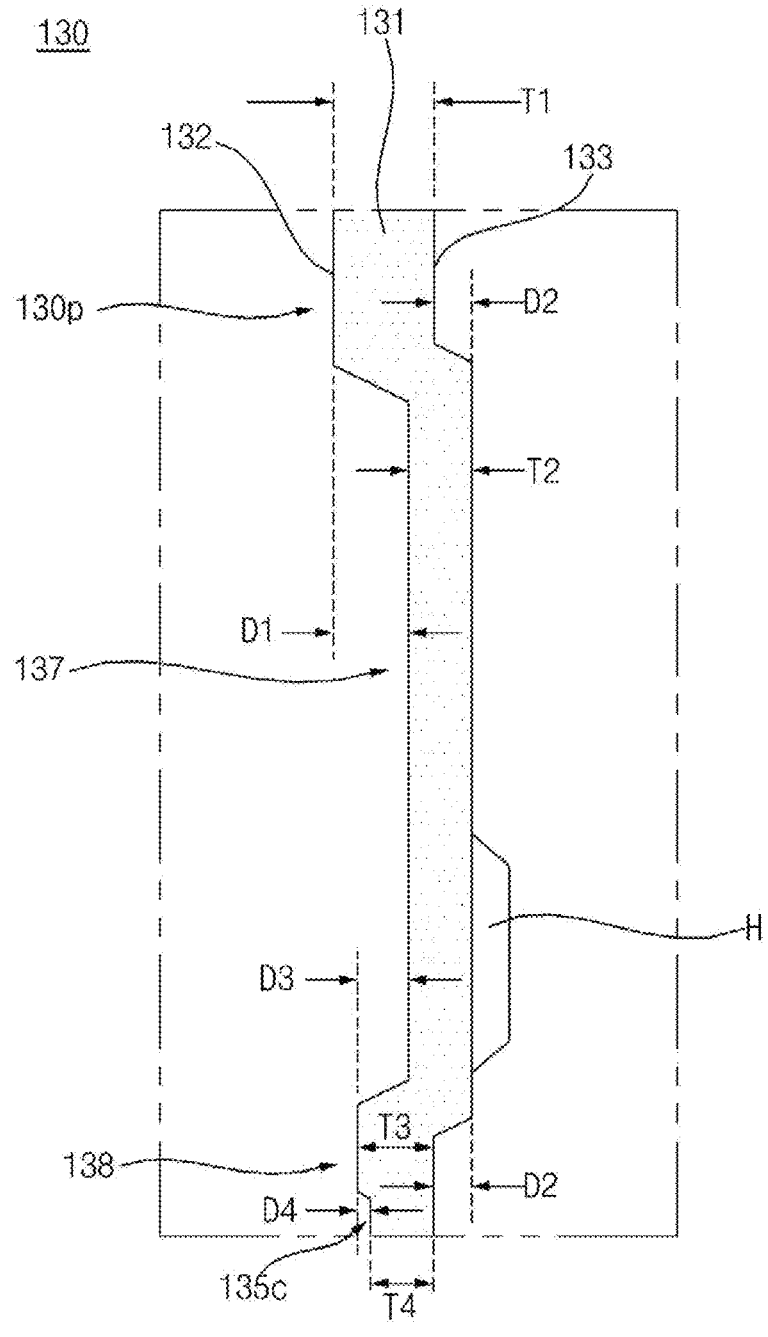

Referring to FIG. 6, the receiving portion 137 may be formed by pressing the flat plate portion 130P. The front skin 132 of the receiving portion 137 may be lowered from the front skin 132 of the flat plate portion 130P so as to form a stepped portion D1. Meanwhile, the rear skin 133 of the receiving portion 137 may be raised from the rear skin 133 of the flat plate portion 130P so as to form a stepped portion D2. Here, the height of the stepped portion D1 between the front skin 132 of the flat plate portion 130P and the front skin 132 of the receiving portion 137 which is lowered from the front skin 132 of the flat plate portion 130P may be greater than the height of the stepped portion D2 between the rear skin 133 of the flat plate portion 130P and the rear skin 133 of the receiving portion 137 which is raised from the rear skin 133 of the flat plate portion 130P. The thickness T1 of the flat plate portion 130P may be greater than the thickness T2 of the receiving portion 137.

The core 131 of the composite panel 130 is capable of absorbing external force while the composite panel 130 is pressed toward the rear skin 133 from the front skin 132 of the flat plate portion 130P. External force applied to the front skin 132 of the flat plate portion 130P may be stronger than external force applied to the rear skin 133 of the flat plate portion 130P. The composite panel 130 is capable not only of ensuring rigidity but also of absorbing impact.

The thickness T4 of the third outer part 135c may be greater than the thickness T2 of the receiving portion 137. A stepped portion D2 may be defined between the rear skin 133 of the third outer part 135c and the rear skin 133 of the receiving portion 137. The height of the stepped portion D2 between the rear skin 133 of the third outer part 135c and the rear skin 133 of the receiving portion 137 may be equal to the height of the stepped portion D2 between the rear skin 133 of the receiving portion 137 and the rear skin 133 of the flat plate portion 130P.

A projection pad 138 may formed so as to project from the front skin 132 of the third outer part 135c. The front skin 132 of the projection pad 138 may define a stepped portion D4 with respect to the front skin 132 of the third outer part 135c. The height of the stepped portion D4 defined between the third outer part 135c and the projection pad 138 may be less than the height of the stepped portions D1 and D2 defined between the flat plate portion 130P and the receiving portion 137. A stepped portion D3 may be defined between the front skin 132 of the projection pad 138 and the front skin 132 of the receiving portion 137. The thickness T3 of the projection pad 138 may be greater than the thickness T4 of the third outer part 135c, be less than the thickness T1 of the flat plate portion 130P, and be less than the thickness T2 of the receiving portion 137.

A fastening recess H may project from the rear skin 133 of the receiving portion 137. The fastening recess H may be depressed from the front skin 132 of the receiving portion 137, and may project from the rear skin 133 of the receiving portion 137. The center of the fastening recess may be perforated.

Figure 7:
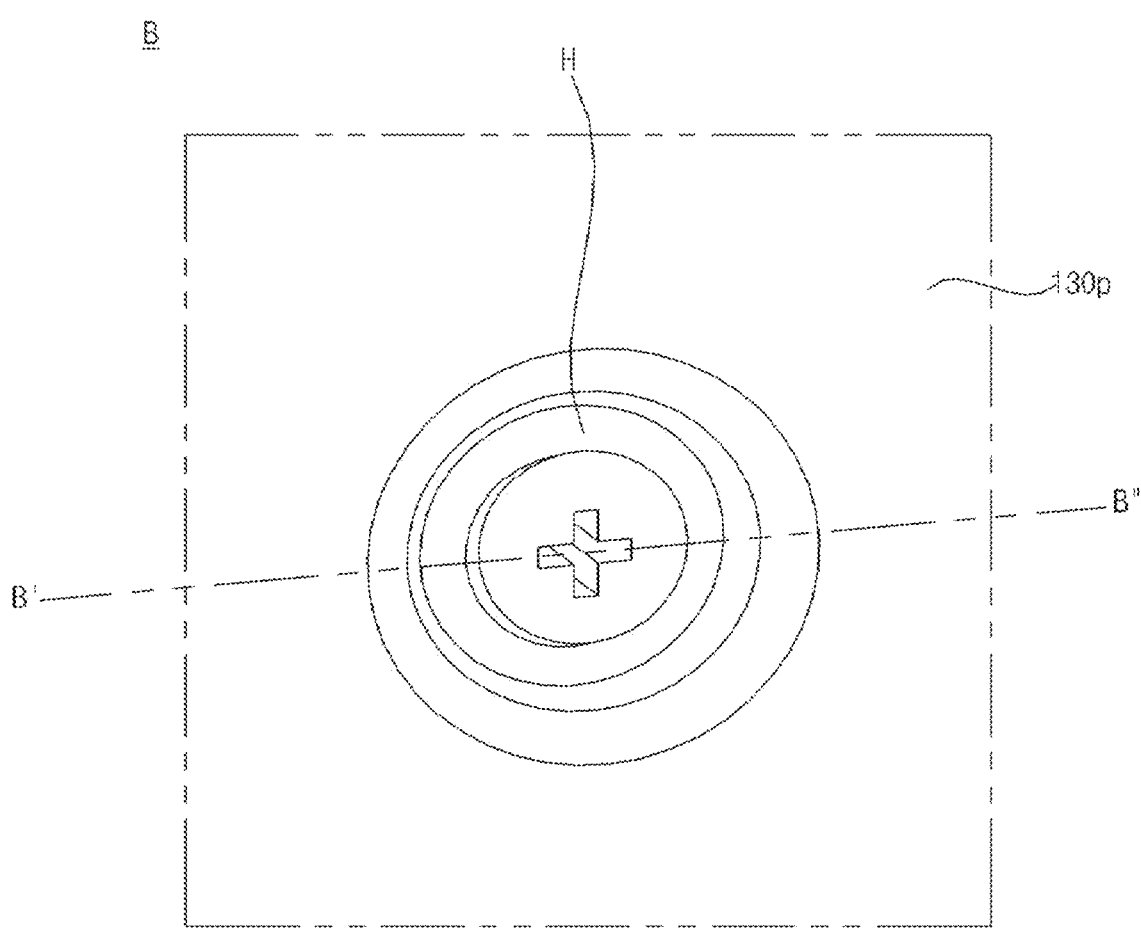
Figure 8:

Referring to FIGS. 7 and 8, the fastening recess H may be formed in the flat plate portion 130P. The fastening recess H may be formed by pressing the flat plate portion 130P. The front skin 132 of the fastening recess H may be depressed from the front skin 132 of the flat plate portion 130P. The rear skin 133 of the flat plate portion 130P may be flush with the rear skin 133 of the fastening recess H. The thickness TO of the fastening recess H may be less than the thickness T1 of the flat plate portion 130P.

A fastening hole h may be formed in the center of the fastening recess H. The fastening hole h may be formed by punching the fastening recess H. The fastening hole h may be formed through the front skin 132 and the rear skin 133 of the fastening recess H. The length of a shaft SA of a fastening member S may be greater than the thickness TO of the fastening recess H. The shaft SA of the fastening member S may be may be inserted into the fastening recess H, and may then project to the outside of the rear skin 132 of the fastening recess H through the fastening hole h. The depth of the fastening recess H may be greater than the thickness of the head SH of the fastening member S. The head SH of the fastening member S may be hidden in the fastening recess H.

Figure 9:
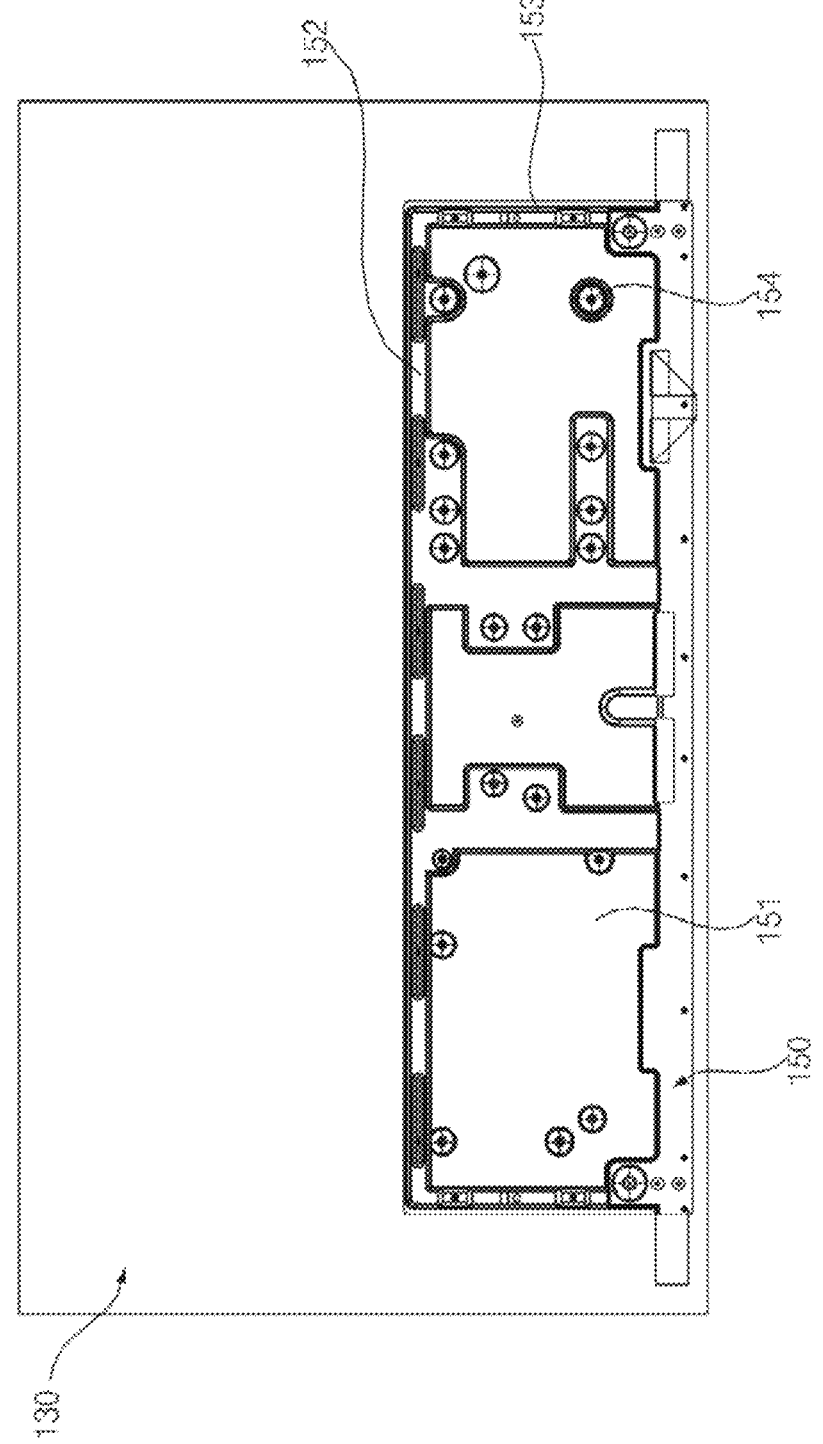
Figure 10:
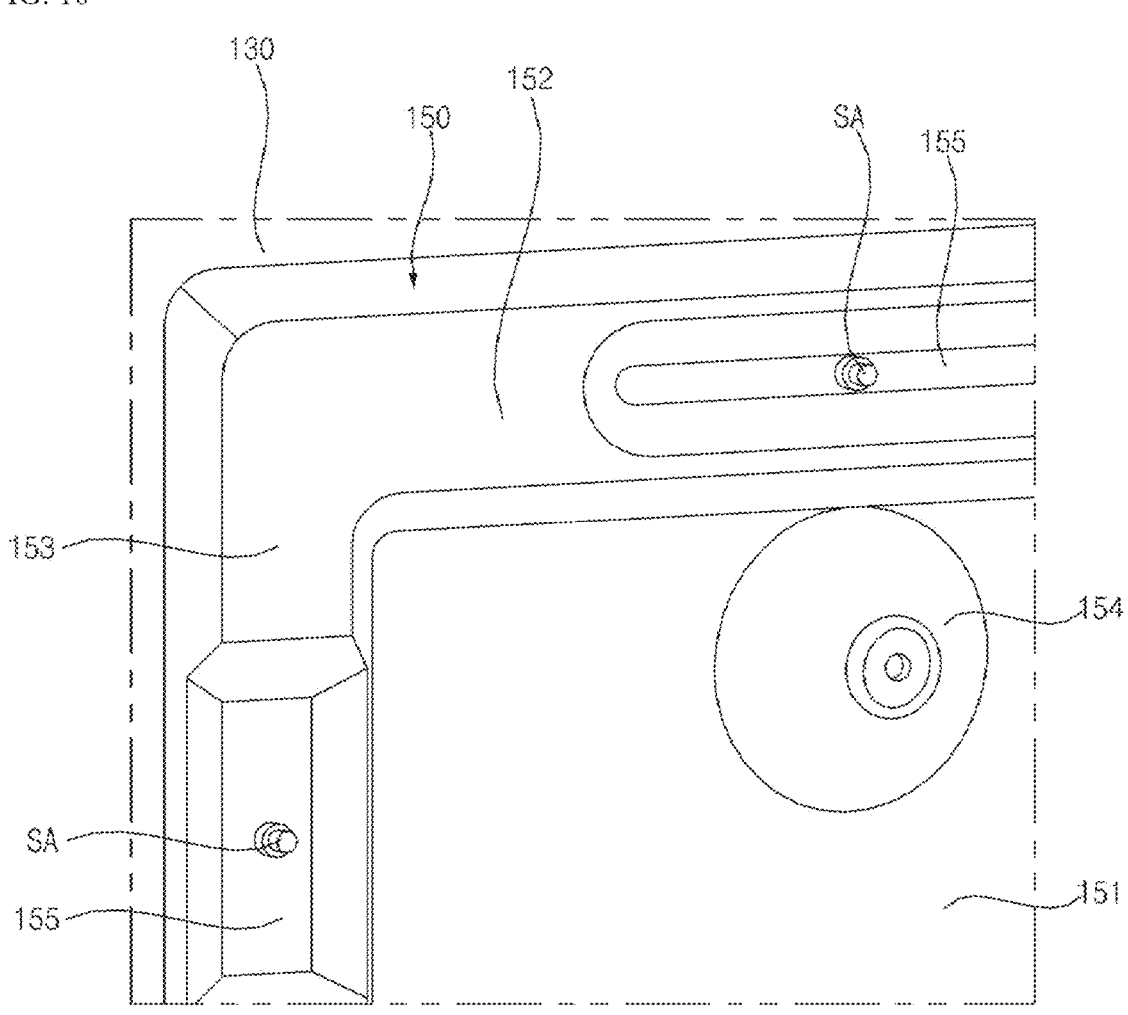

Referring to FIGS. 9 and 10 in conjunction with FIG. 8, a PCB plate 150 may be coupled to the rear surface of the composite panel 130. The PCB plate 150 may be fixed to the rear surface of the composite panel 130 by means of the fastening member S.

The PCB plate 150 may be formed by pressing a plate 151 including metal. The PCB plate 150 may include a horizontal portion 152, a vertical portion 153, a dome portion 154, and a depressed portion 155. The horizontal portion 152 may project backwards from the front of the PCB plate 151, and may extend long in a horizontal direction. The vertical portion 153 may project backwards from the front of the PCB plate 151, and may project in an up-and-down direction of the PCB plate 150. The dome portion 154 may project backwards from the front of the PCB plate 150. The depressed portion 155 may be depressed forwards from the rear of the vertical portion 153 and/or the horizontal portion 152.

The shaft SA of the fastening member S may pass through the depressed portion 155 formed in the vertical portion 153 and/or the horizontal portion 152, and may couple the PCB plate 150 to the composite panel 130. The depth of the depressed portion 155 may be greater than the length of the portion of the shaft SA of the fastening member S that projects backwards through the composite panel 130.

Figure 11:
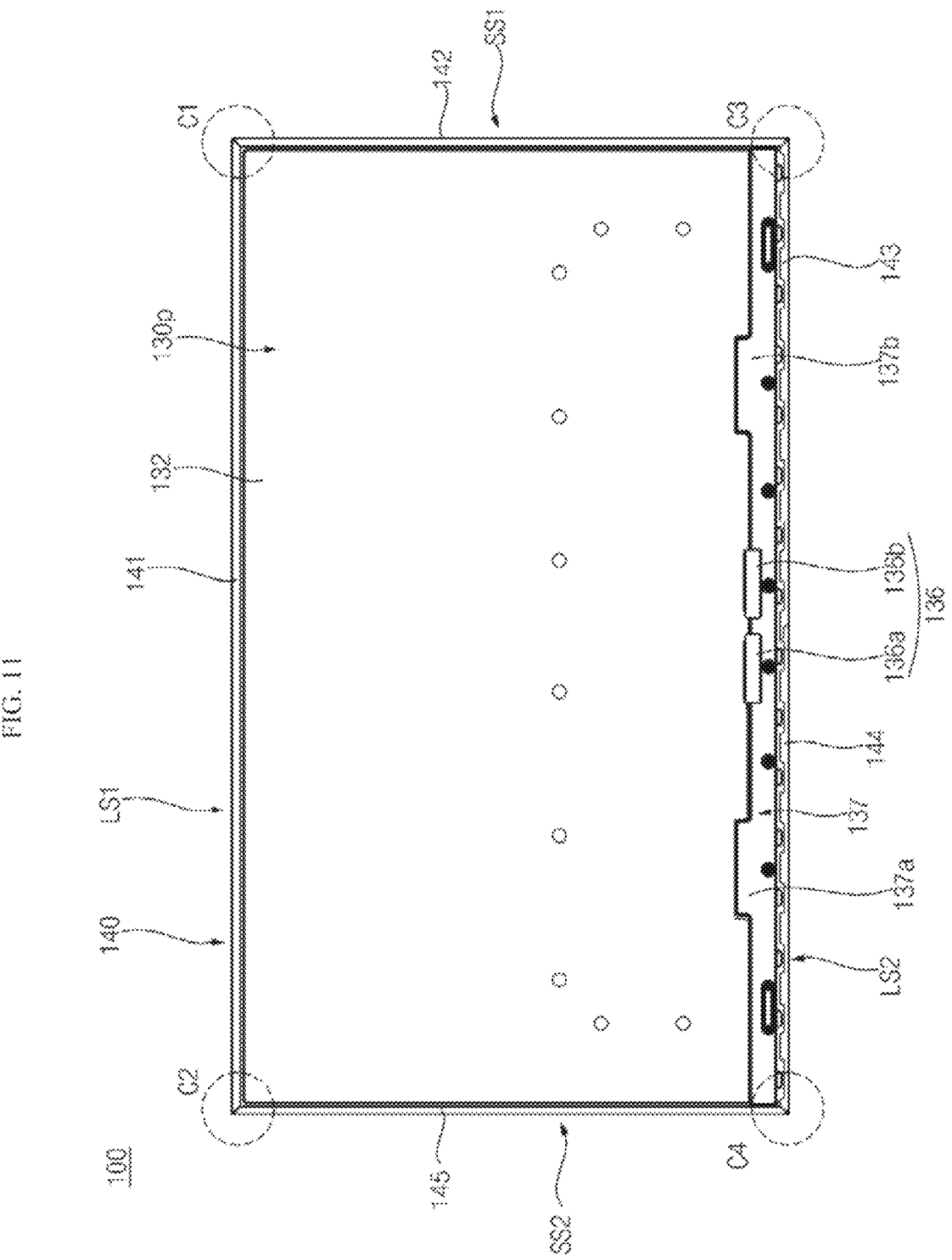
Figure 12:
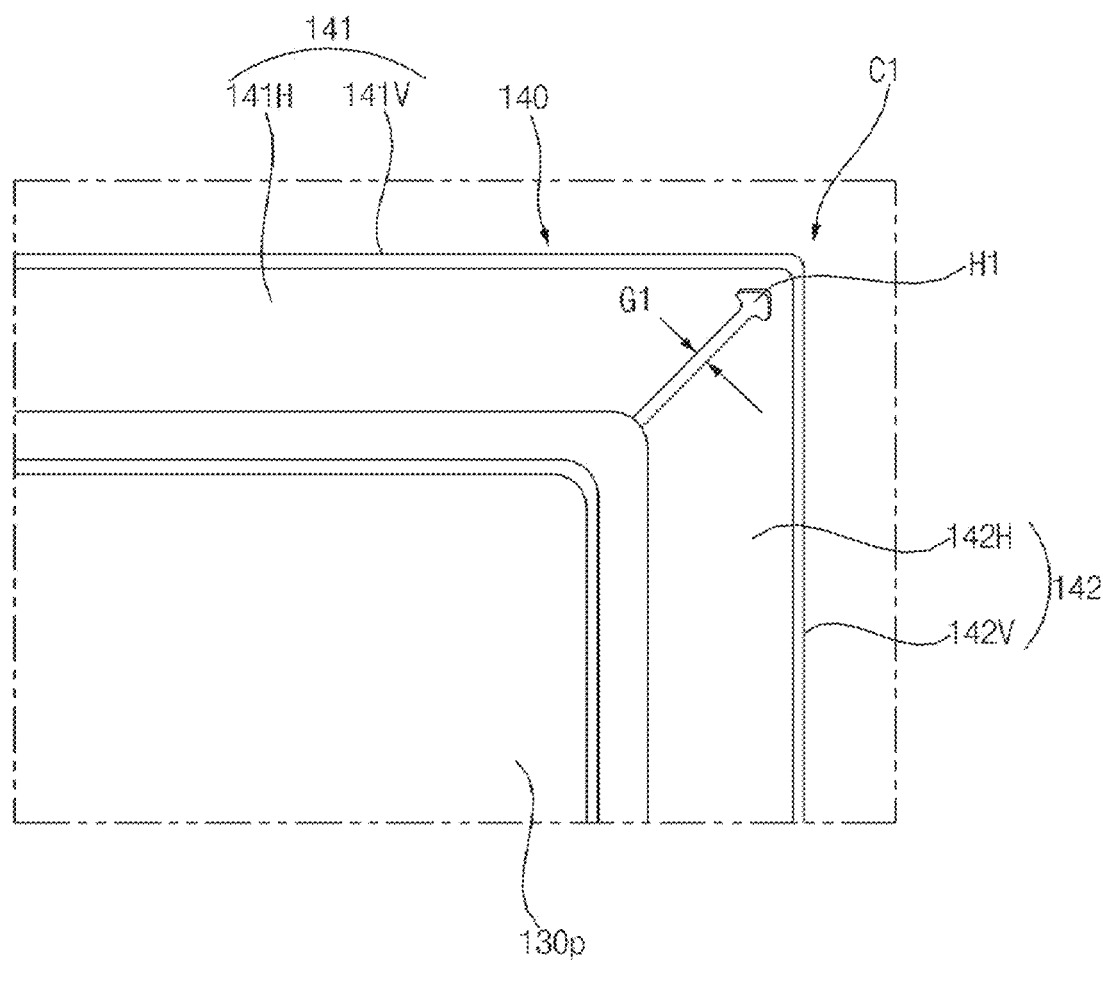

Referring to FIGS. 11 and 12, a side frame 140 may be coupled to the outer part 135 (see FIG. 5) adjacent to the flat plate portion 130P. The side frame 140 may include a first part 141, a second part 142, a third part 143, a fourth part 144, and a fifth part 145. The second part 142 may be bent at a first corner C1 and may extend from the first part 141.

The first part 141 may include a horizontal portion 141H and a vertical portion 141V. The horizontal portion 141H of the first part 141 may be fixed to the first outer part 135a (see FIG. 5). The second part 142 may include a horizontal portion 142H and a vertical portion 142V. The horizontal portion 142H of the second part 142 may be fixed to the fourth outer part 135d (see FIG. 5).

A gap G1 may be formed between the horizontal portion 141H of the first part 141 and the horizontal portion 142H of the second part 142. The vertical portion 141V of the first part 141 and the vertical portion 142V of the second part 142 may be connected to each other while forming a bent portion. A hole H1, which is connected to the gap G1, may be formed between the horizontal portions 141H and 142H adjacent to the vertical portions 141V and 142V. The size or diameter of the hole H1 may be greater than the width of the gap G1. The description of the first corner C1 of the side frame 140 may be applied to a second corner C2 of the side frame 140 without modification.

Figure 13:
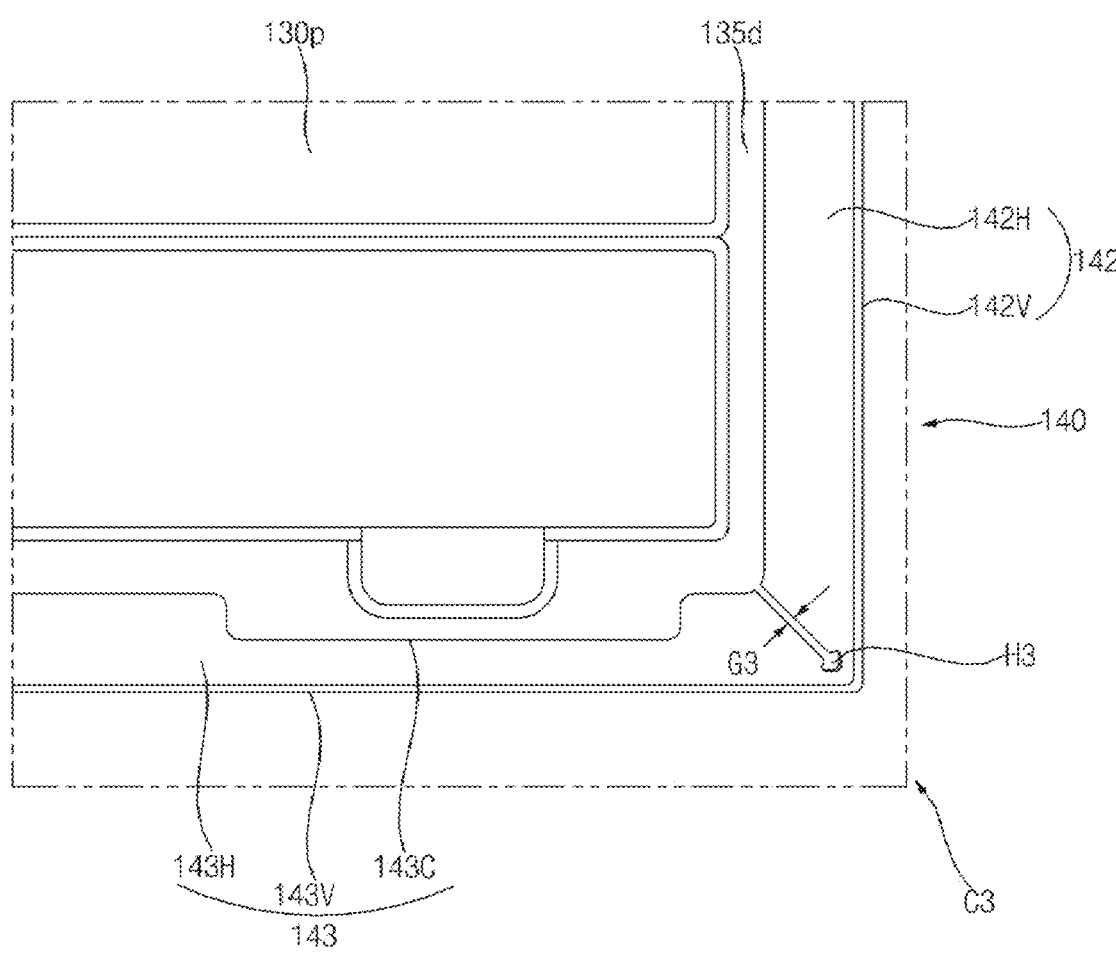

Referring to FIGS. 11 and 13, the side frame 140 may be coupled to the outer part 135 (see FIG. 5) adjacent to the flat plate portion 130P. The side frame 140 may include the first part 141, the second part 142, the third part 143, the fourth part 144, and the fifth part 145. The second part 142 may be bent at a third corner C3 and may extend from the third part 143.

The third part 143 may include a horizontal portion 143H and a vertical portion 143V. The horizontal portion 143H of the third part 143 may be fixed to the third outer part 135c (see FIG. 5). The second part 142 may include the horizontal portion 142H and the vertical portion 142V. The horizontal portion 142H of the second part 142 may be fixed to the fourth outer part 135d (see FIG. 5).

A gap G3 may be formed between the horizontal portion 143H of the third part 143 and the horizontal portion 142H of the second part 142. The vertical portion 143V of the third part 143 and the vertical portion 142V of the second part 142 may be connected to each other while forming a bent portion. A hole H3, which is connected to the gap G3, may be formed between the horizontal portions 143H and 142H adjacent to the vertical portions 143V and 142V. The size or diameter of the hole H3 may be greater than the width of the gap G3. The description of the first corner C3 of the side frame 140 may be applied to a fourth corner C4 of the side frame 140.

Figure 14:
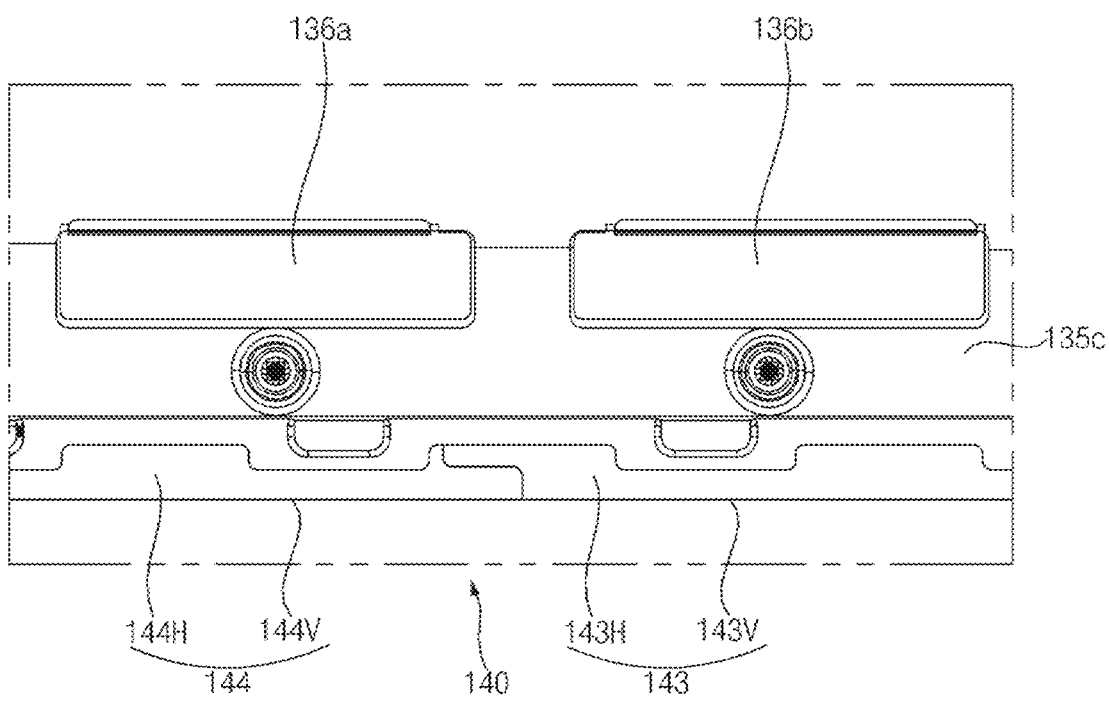

Referring to FIGS. 11 and 14, the third part 143 and the fourth part 144 of the side frame 140 may be positioned on or be fixed to the third outer part 135c. The end of the third part 143 of the side frame 140 may be coupled to the end of the fourth part 144 of the side frame 140.

The horizontal portion 144H of the fourth part 144 may be in contact with the horizontal portion 143H and the vertical portion 143V of the third part 143. The vertical portion 144V of the fourth part 144 may be in contact with the vertical portion 143V of the third part 143. The vertical portion 143V of the third part 143 may be in contact with the horizontal portion 144H and the vertical portion 144V of the fourth part 144. The end of the third part 143 may be fixed to the end of the fourth part 144. For example, the end of the third part 143 and the end of the fourth part 144 may be fixed to each other via welding.

Figure 15:
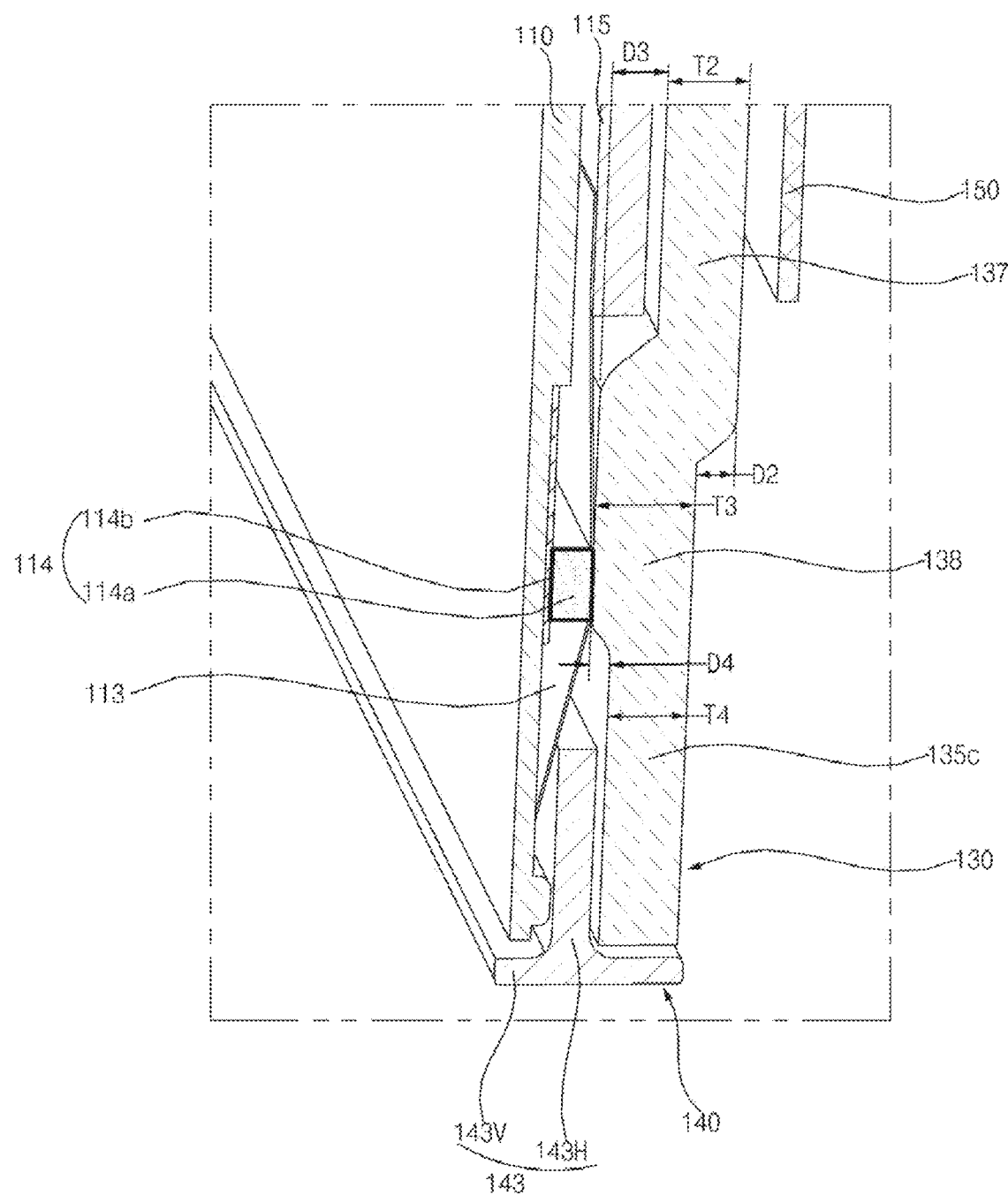

Referring to FIG. 15, the display panel 110 may be coupled or fixed to the side frame 140. The horizontal portion 143H of the side frame 140 may support the rear surface of the display panel 110, and the vertical portion 143V may cover the lateral surface of the display panel 110. For example, the vertical portion 143V of the third part 143 of the side frame 140 may cover the lateral surface of the lower side of the display panel 110.

The vertical portion 143V may cover the lateral surface of the composite panel 130. For example, the vertical portion 143V of the third part 143 of the side frame 140 may cover the lateral surface of the third outer part 135c of the composite panel 130.

A flexible cable 113 may extend the display panel 110 and the horizontal portion 143H of the side frame 140 from the lower side of the display panel 110. The flexible cable 113 may extend between the rear surface of the display panel 110 and the composite panel 130. The flexible cable 113 may be, for example, a COF 113.

A source signal substrate 115 may be electrically connected to the flexible cable 113. The source signal substrate 115 may be fixed to one surface of the flexible cable 113. The source signal substrate 115 may be, for example, an S-PCB 115. The source signal substrate 115 may be positioned in the receiving portion 137 of the composite panel 130.

The flexible cable 113 may be positioned between the projection pad 138 of the composite panel 130 and the display panel 110. The flexible cable 113 may be in contact with the projection pad 138. Heat generated by the source signal substrate 115 and/or the flexible cable 113 may be dissipated through the projection pad 138.

A heat dissipation pad 114 may be disposed between the flexible cable 113 contacting the projection pad 138 and the rear surface of the display panel 110. The heat dissipation pad 114 may include an elastic core 114a and a conductive layer 114b. The core 114a of the heat dissipation pad 114 may be made of an elastic material, and the conductive layer 114b may cover the core 114a of the heat dissipation pad 114. Consequently, the flexible cable 113 may be maintained in the state of being in contact with the projection pad 138.

Figure 16:
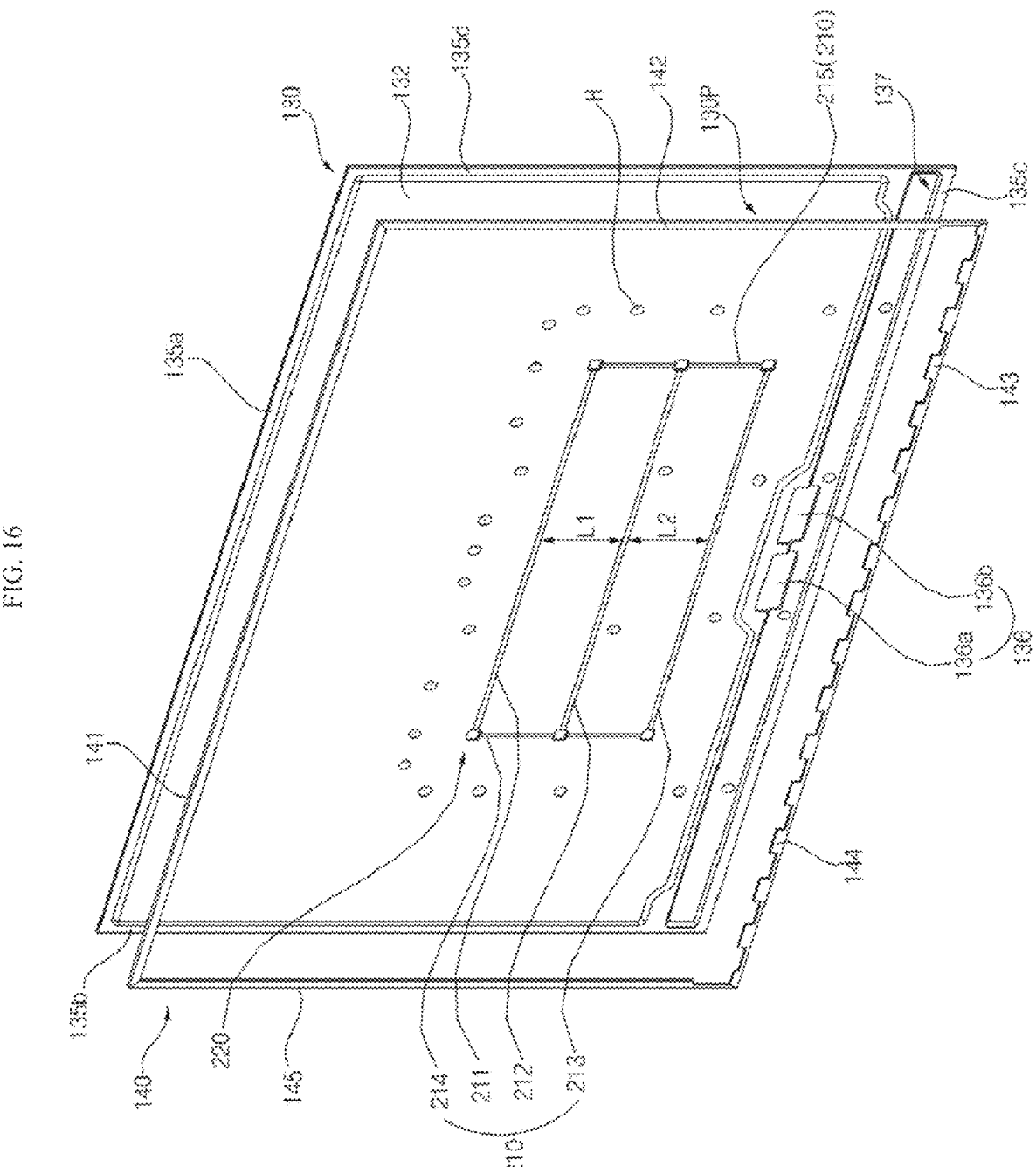
Figure 17:
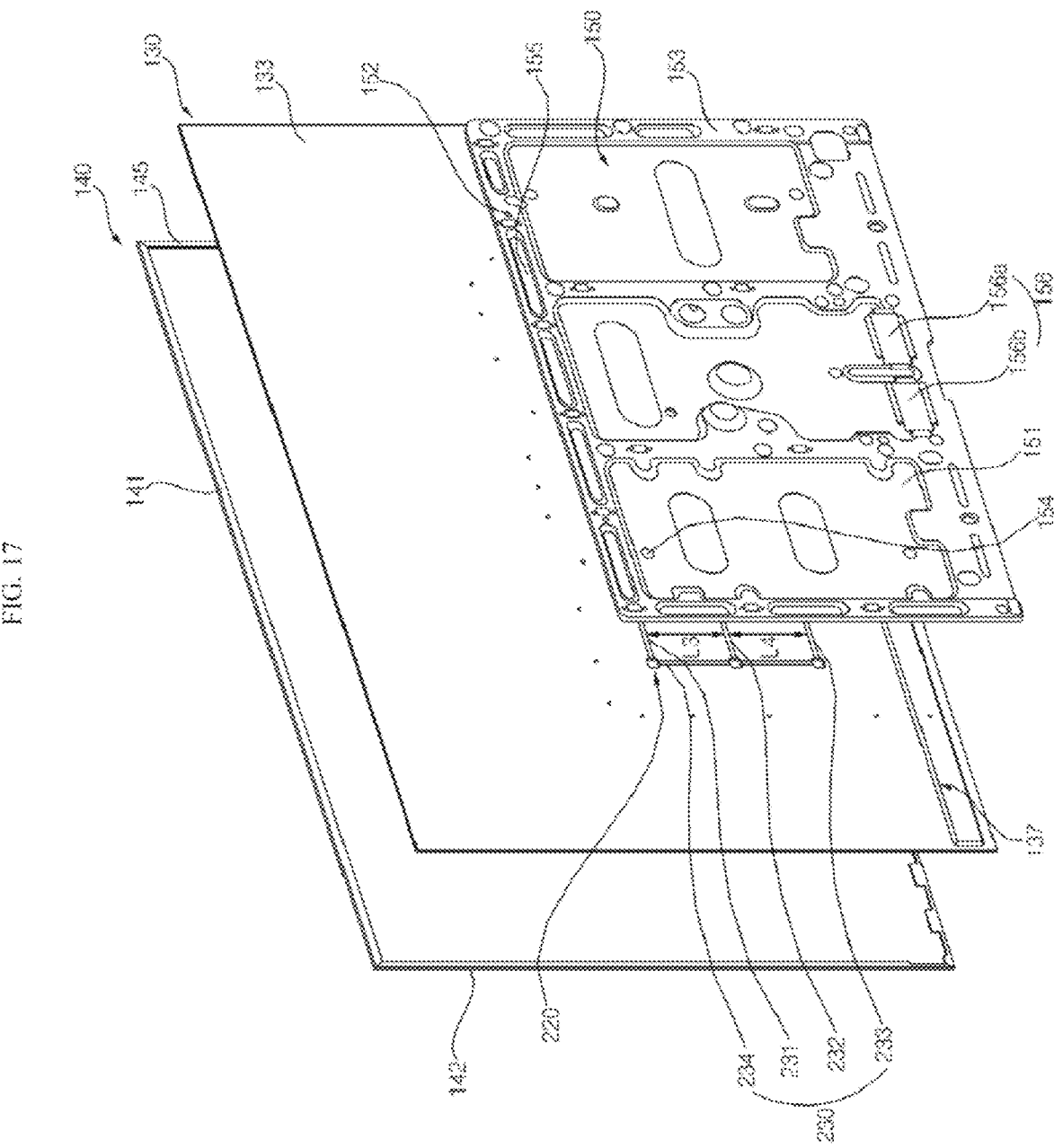

Referring to FIGS. 16 and 17, inner frames 210 and 230 may be formed on the front surface and/or the rear surface of the composite panel 130. The inner frames 210 and 230 may be referred to as depressed frames 210 and 230 or rigid lines 210 and 230. The inner frames 210 and 230 may be formed by depressing the front skin 132 and/or the rear skin 133 of the composite panel 130 and compressing the core 131 (see FIG. 2).

The inner frames 210 and 230 may include a front inner line 210, a rear inner line 230, and node holes 220. The front inner line 210 may be formed by depressing the front skin 132 of the composite panel 130. The rear inner line 230 may be formed by depressing the rear skin 133 of the composite panel 130.

The front inner line 210 may include a first front horizontal line 211, a second front horizontal line 212, a third front horizontal line 213, a first front vertical line 214, and a second front vertical line 215. The first front horizontal line 214 may define the upper side of the front inner line 210. The third front horizontal line 213 may define the lower side of the front inner line 210. The second front horizontal line 212 may be positioned between the first front horizontal line 211 and the third front horizontal line 213. The first front vertical line 214 may connect a first end of the first front horizontal line 211, a first end of the second front horizontal line 212, and a first end of the third front horizontal line 213 to one another. The second front vertical line 215 may connect a second end of the first front horizontal line 211, a second end of the second front horizontal line 212, and a second end of the third front horizontal line 213 to one another. For example, the first distance L1 between the first front horizontal line 211 and the second front horizontal line 212 may be less than the second distance L2 between the second front horizontal line 212 and the third front horizontal line 213.

The node holes 220 may be formed at points at which the front horizontal lines 211, 212 and 213 meet the front vertical lines 214 and 215. The node holes 220 may be formed through the front skin 132, the core 131 and the rear skin 133 of the composite panel 130.

The rear inner line 230 may include a first rear horizontal line 231, a second rear horizontal line 232, a third rear horizontal line 233, a first rear vertical line 234, and a second rear vertical line 235. The first rear horizontal line 231 may define the upper side of the rear inner line 230. The third horizontal line 233 may define the lower side of the rear inner line 230. The second rear horizontal line 232 may be positioned between the first rear horizontal line 231 and the third rear horizontal line 233. The first rear vertical line 234 may connect a first end of the first rear horizontal line 231, a first end of the second rear horizontal line 232, and a first end of the third rear horizontal line 233 to one another. The second rear vertical line 235 may connect a second end of the first rear horizontal line 231, a second end of the second rear horizontal line 232, and a second end of the third rear horizontal line 233 to one another. For example, the third distance L3 between the first rear horizontal line 231 and the second rear horizontal line 232 may be less than the fourth distance L4 between the second rear horizontal line 232 and the third rear horizontal line 233.

The node holes 220 may be formed at points at which the rear horizontal lines 231, 232 and 233 meet the rear vertical lines 234 and 235. The node holes 220 may be formed through the front skin 132, the core 131 and the rear skin 133 of the composite panel 130.

The length of the rear inner line 230 may be less than the length of the PCB plate 150. The width of the rear inner line 230 may be less than the width of the PCB plate 150. The PCB plate 150 may cover the rear inner line 230.

Consequently, the composite panel 130 may have improved bending rigidity and/or torsional rigidity.

Figure 18:
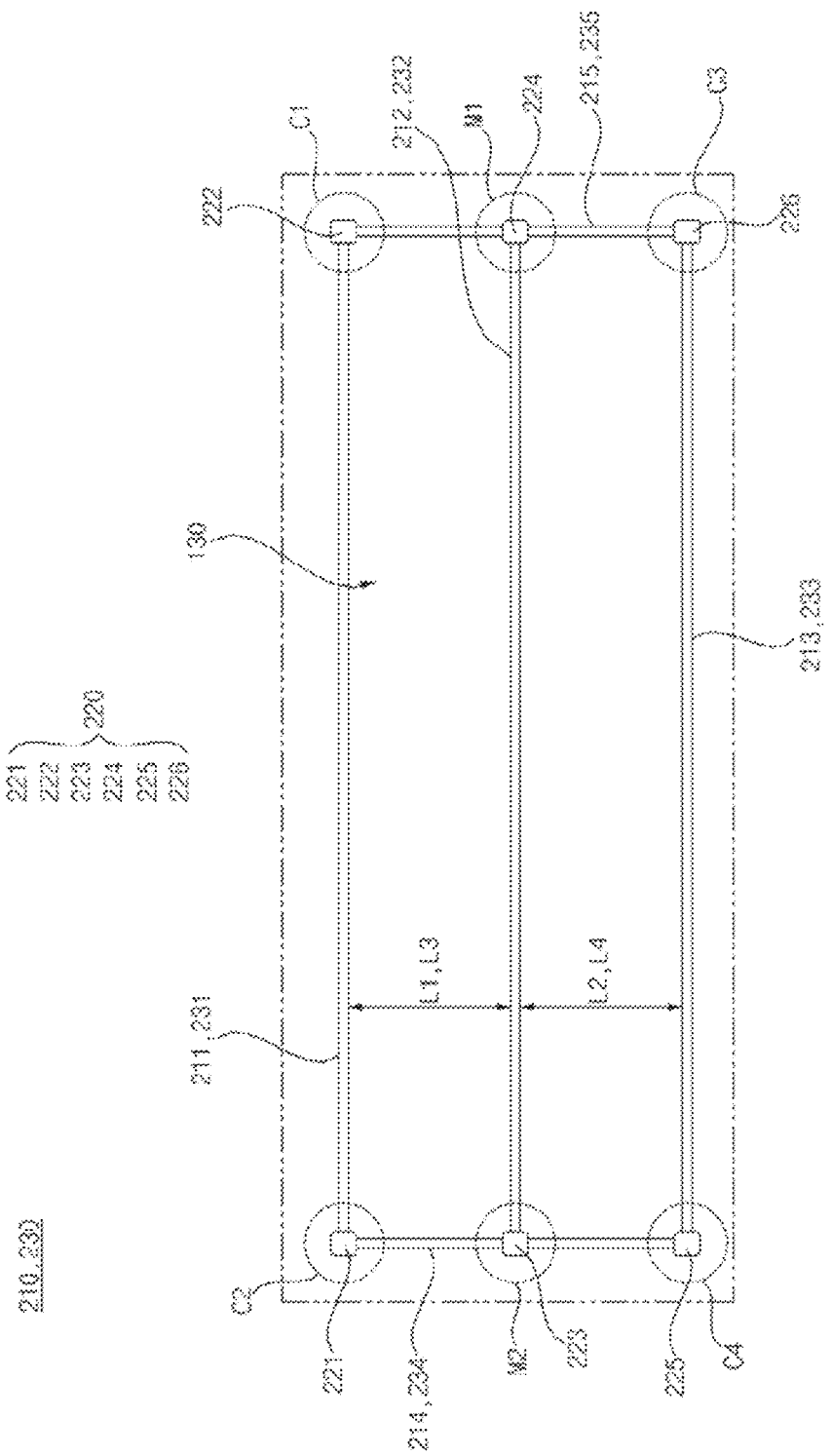

Referring to FIG. 18, the node holes 220 may include a plurality of node holes. The plurality of node holes 220 may include a first node hole 221, a second node hole 222, a third node hole 223, a fourth node hole 224, a fifth node hole 225, and a sixth node hole 226.

The first node hole 221 may be positioned at the corner C2 which is defined by the first horizontal line 211 or 231 and the first vertical line 214 or 234. The first node hole 221 may be formed through the composite panel 130 at the corner C2 between the first horizontal line 211 or 231 and the first vertical line 214 or 234.

The second node hole 222 may be positioned at the corner C1 which is defined by the first horizontal line 211 or 231 and the second vertical line 212 or 232. The second node hole 222 may be formed through the composite panel 130 at the corner C1 between the first horizontal line 211 or 231 and the second vertical line 212 or 232.

The third node hole 223 may be positioned at a node M2 which is formed by the second horizontal line 212 or 232 and the first vertical line 214 or 234. The third node hole 223 may be formed through the composite panel 130 at the node M2 between the second horizontal line 212 or 232 and the first vertical line 214 or 234.

The fourth node hole 224 may be positioned at a node M1 which is formed by the second horizontal line 212 or 232 and the second vertical line 212 or 232. The fourth node hole 224 may be formed through the composite panel 130 at the node M1 between the second horizontal line 212 or 232 and the second vertical line 212 or 232.

The fifth node hole 225 may be positioned at the corner C4 which is defined by the third horizontal line 213 or 233 and the first vertical line 214 or 234. The fifth node hole 225 may be formed through the composite panel 130 at the corner C4 between the third horizontal line 213 or 233 and the first vertical line 214 or 234.

The sixth node hole 226 may be positioned at the corner C3 which is defined by the third horizontal line 213 or 233 and the second vertical line 212 or 232. The sixth node hole 226 may be formed through the composite panel 130 at the corner C3 between the third horizontal line 213 or 233 and the second vertical line 212 or 232.

Consequently, the composite panel 130 may have improved bending rigidity and/or torsional rigidity, and the flatness of the display panel 110 coupled to the composite panel 130 may be improved.

Figure 19:
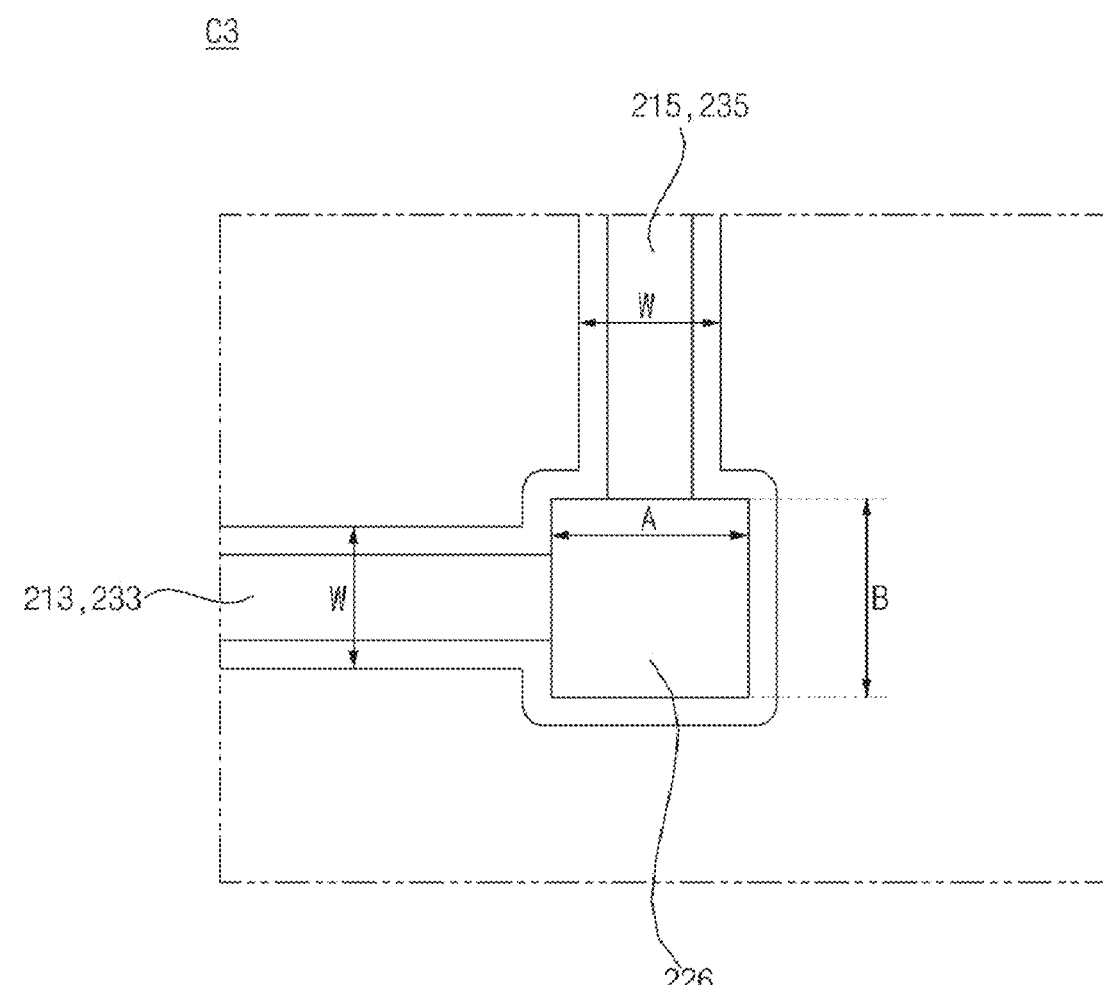

Referring to FIG. 19, the magnitude of the sixth node hole 226 may be greater than the width of the third horizontal line 213 or 233 and/or the second vertical line 215 or 235. When the sixth node hole 226 has, for example, a square shape, the width A or B of the sixth node hole 226 may be greater than the width W of the third horizontal line 213 or 233 and/or the second vertical line 215 or 235. In another example, when the sixth node hole 226 has a circular shape, the diameter of the sixth node hole 226 may be greater than the width of the third horizontal line 213 or 233 and/or the second vertical line 215 or 235. The description of the sixth node hole 226 may be applied to the first node hole 221, the second node hole 222 and/or the fifth node hole 225.

Figure 20:

Referring to FIG. 20, the magnitude of the fourth node hole 224 may be greater than the width of the second horizontal line 212 or 232 and/or the second vertical line 215 or 235. When the fourth node hole 224 has, for example, a square shape, the width A or B of the fourth node hole 224 may be greater than the width of the second horizontal line 212 or 232 and/or the second vertical line 215 or 235. In another example, when the fourth node hole 224 has a circular shape, the diameter of the fourth node hole 224 may be greater than the width of the second horizontal line 212 or 232 and/or the second vertical line 215 or 235. The description of the fourth node hole 224 may be applied to the third node hole 223.

Figure 21:
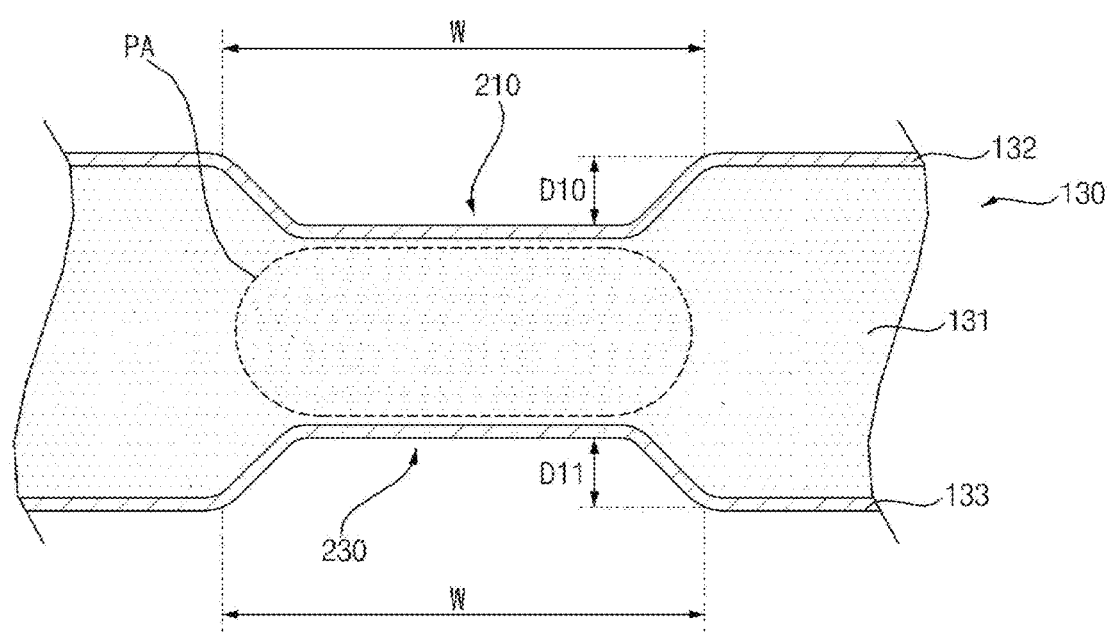

Referring to FIG. 21, the front inner line 210 may be formed in the composite panel 130 in such a way that the core 131 is compressed and thus the front skin 132 is depressed. The rear inner line 230 may be formed in the composite panel 130 in such a way that the core 131 is compressed and thus the rear skin 133 is depressed.

The front inner line 210 and the rear inner line 230 may be symmetrical with each other based on the core 131. For example, the width W of the front inner line 210 may be substantially equal to the width W of the rear inner line 230. In another example, the depth D10 of the front inner line 210 may be substantially equal to the depth D11 of the rear inner line 230.

The core 131 between the front inner line 210 and the rear inner line 230 may be compressed so as to form a pressed area PA. The density of the core 131 in the compressed area PA may be higher than the density of the core 131 in the uncompressed area.

Consequently, the composite panel 130 may have improved bending rigidity and/or torsional rigidity.

Figure 22:
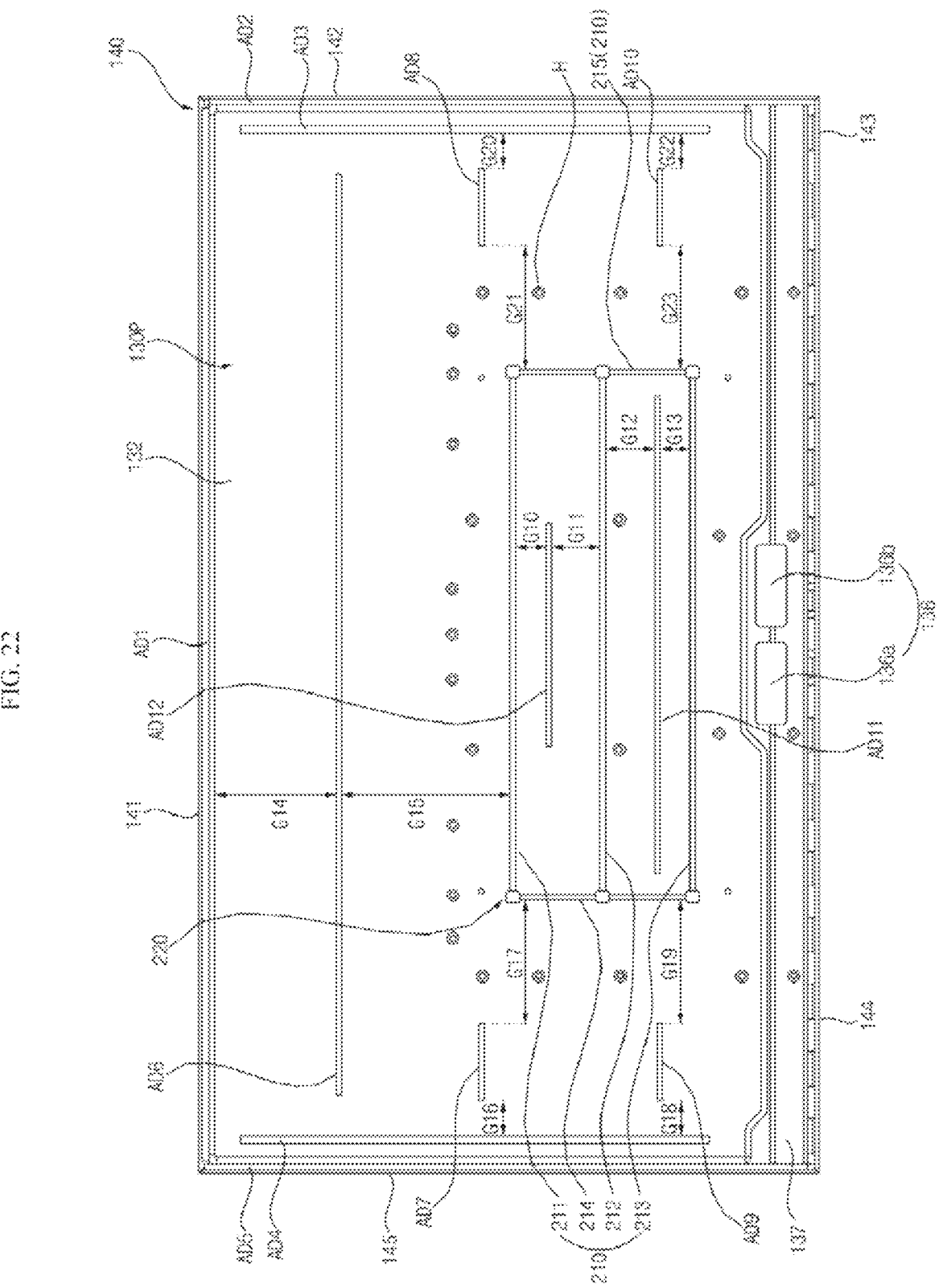

Referring to FIG. 22, an adhesive member AD may be disposed on the flat plate portion 130P of the composite panel 130. The adhesive member AD may be adhered to the front skin 132 of the composite panel 130. The adhesive member AD may include a plurality of adhesive members.

A first adhesive member AD1 may be fixed to the first part 141 of the side frame 140. The first adhesive member AD1 may extend long in the longitudinal direction of the first part 141 of the side frame 140. A second adhesive member AD2 may extend long in the longitudinal direction of the second part 142 of the side frame 140, and may be fixed to the second part 142. A third adhesive member AD3 may extend long along and parallel to the second part 142 of the side frame 140, and may be fixed to the flat plate portion 130P in the state of being spaced apart from the first adhesive member AD1.

A fifth adhesive member AD5 may extend long in the longitudinal direction of the fifth part 145 of the side frame 140, and may be fixed to the fifth part 145. A fourth adhesive member AD4 may extend long along and parallel to the fifth part 145 of the side frame 140, and may be fixed to the flat plate portion 130P in the stated of being spaced apart from the fifth adhesive member AD5.

A sixth adhesive member AD6 may extend long in the longitudinal direction of the first part 141 of the side frame 140, and may be fixed to the flat plate portion 130P in the state of being spaced apart from the first adhesive member AD1. The fourteenth distance G14 between the first part 141 of the side frame 140 and the sixth adhesive member AD6 may be less than the fifteenth distance G15 between the sixth adhesive member AD6 and the first front horizontal inner line 211.

A seventh adhesive member AD7 may extend in the longitudinal direction of the sixth adhesive member AD6, and may be fixed to the flat plate portion 130P between the first front vertical line 214 and the fourth adhesive member AD4. The seventh adhesive member AD7 may be positioned between the sixth adhesive member AD6 and a ninth adhesive member AD9. The sixteenth distance G16 between the fourth adhesive member AD4 and one end of the seventh adhesive member AD7 may be less than the seventeenth distance G17 between the first front vertical line 214 and the other end of the seventh adhesive member AD7.

The ninth adhesive member AD9 may extend in the longitudinal direction of the sixth adhesive member AD6, and may be fixed to the flat plate portion 130P between the first front vertical line 214 and the fourth adhesive member AD4. The ninth adhesive member AD9 may be positioned between the seventh adhesive member AD7 and the receiving portion 137. The eighteenth distance G18 between the fourth adhesive member AD4 and one end of the ninth adhesive member AD9 may be less than the nineteenth distance G19 between the first front vertical line 214 and the other end of the ninth adhesive member AD9.

An eighth adhesive member AD8 may extend in the longitudinal direction of the sixth adhesive member AD6, and may be fixed to the flat plate portion 130P between the second front vertical line 215 and the third adhesive member AD3. The eighth adhesive member AD8 may be positioned between the sixth adhesive member AD6 and the receiving portion 137. The twentieth distance G20 between the third adhesive member AD3 and one end of the eighth adhesive member AD8 may be less than the twenty first distance G21 between the second front vertical line 215 and the other end of the eighth adhesive member AD8.

A tenth adhesive member AD10 may extend in the longitudinal direction of the sixth adhesive member AD6, and may be fixed to the flat plate portion 130P between the second front vertical line 215 and the third adhesive member AD3. The tenth adhesive member AD10 may be positioned between the eighth adhesive member AD8 and the receiving portion 137. The twenty second distance G22 between the third adhesive member AD3 and one end of the tenth adhesive member AD10 may be less than the twenty third distance G23 between the second front vertical line 215 and the other end of the tenth adhesive member AD10.

An eleventh adhesive member AD11 may extend in the longitudinal direction of the second front horizontal line 212, and may be fixed to the flat plate portion 130P between the second front horizontal line 212 and the third front horizontal line 213. A twelfth adhesive member AD12 may extend long in the longitudinal direction of the second front horizontal line 212, and may be positioned between the first front horizontal line 211 and the second front horizontal line 212. The length of the twelfth adhesive member AD12 may be less than the length of the eleventh adhesive member AD11.

The tenth distance G10 between the first front horizontal line 211 and the twelfth adhesive member AD12 may be less than the eleventh distance G11 between the twelfth adhesive member AD12 and the second front horizontal line 212. For example, the tenth distance G10 may be 40 mm or more. For example, the distance between one end of the twelfth adhesive member AD12 and the first front vertical line 214 may be 20 mm or more. In another example, the distance between the other end of the twelfth adhesive member AD12 and the second front vertical line 215 may be 20 mm or more.

The twelfth distance G12 between the second front horizontal line 212 and the eleventh adhesive member AD11 may be greater than the thirteenth distance G13 between the eleventh adhesive member AD11 and the third front horizontal line 213. For example, the thirteenth distance G13 may be 40 mm or more.

By virtue of the adhesive member AD, the display panel 110 may be coupled or fixed to the composite panel 130. Consequently, the display panel 110 may be fixed to the composite panel 130 in the flat state.

Figure 23:
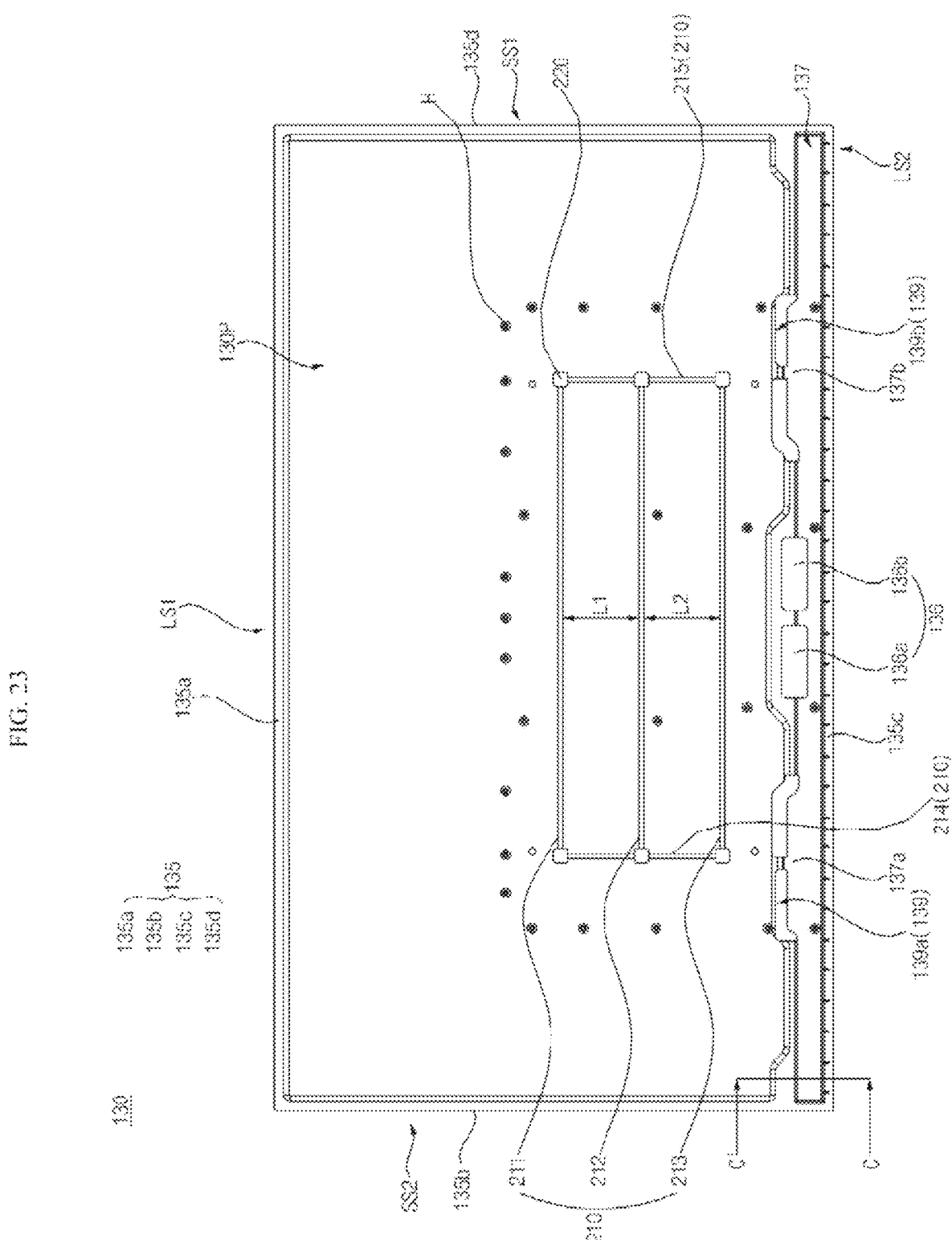
Figure 24:
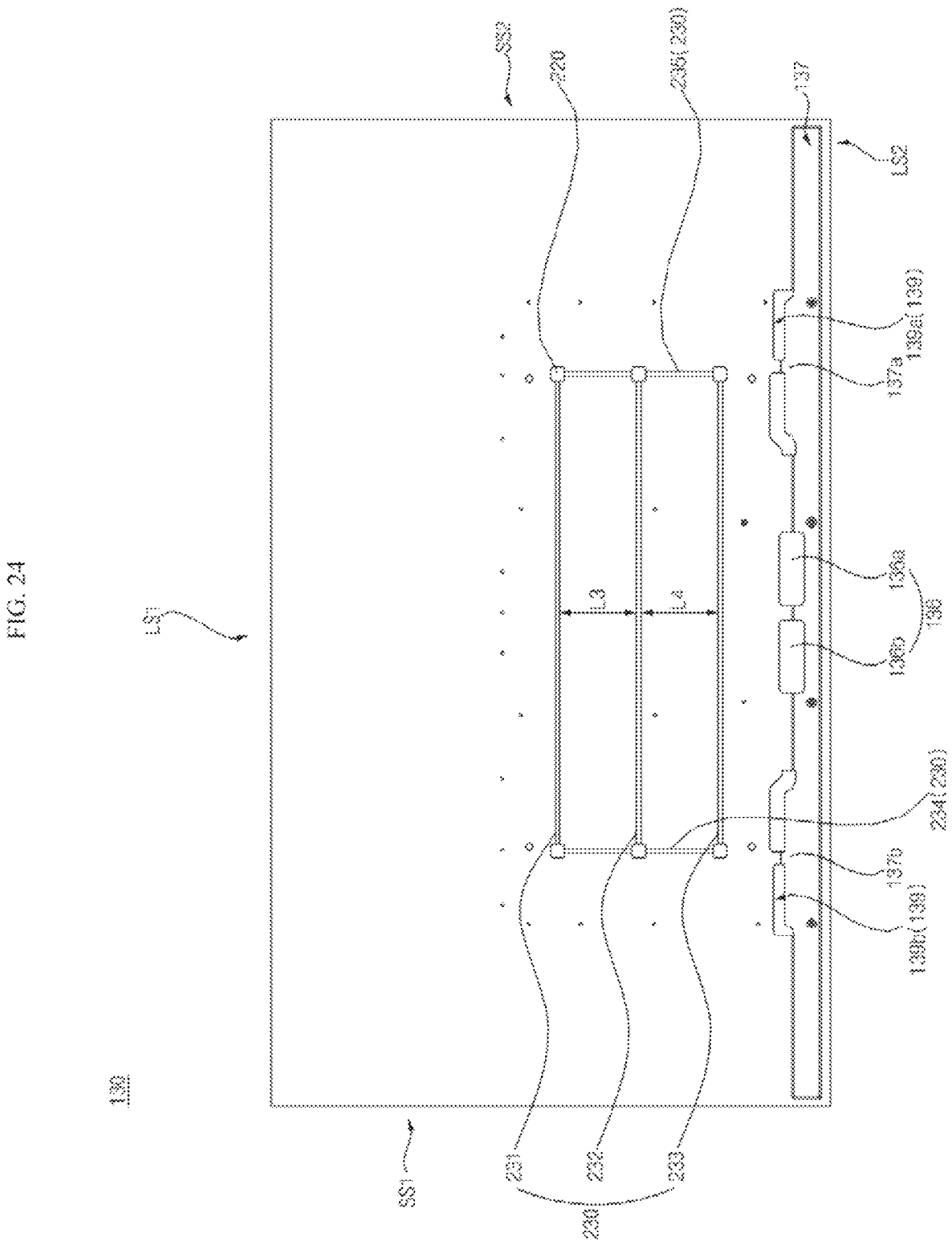

Referring to FIGS. 23 and 24, the composite panel 130 may include a flat plate portion 130P, a receiving portion 137, and an outer part 135. The outer part 135 may define the periphery of the flat plate portion 130P, and may form the edge of the composite panel 130. The first outer part 135a may be formed along the upper side of the flat plate portion 130P, and the second outer part 135b may be formed along the left side of the flat plate portion 130P. The third outer part 135c may be formed along the lower side of the flat plate portion 130P, and the fourth outer part 135d may be formed along the right side of the flat plate portion 130P. The outer part 135 may be formed by pressing the flat plate portion 130P. The outer part 135 may be lowered from the flat plate portion 130P so as to form a stepped portion. The thickness of the flat plate portion 130P may be greater than the thickness of the outer part 135. The lower side of the flat plate portion 130P may form a line having a curved portion.

The receiving portion 137 may be formed at the third outer part 135c adjacent to the lower side of the flat plate portion 130P. The receiving portion 137 may include a plurality of receiving portions. The first receiving portion 137a may be positioned between the first cable hole 136a and the second short side SS2. The second receiving portion 137b may be positioned between the second cable hole 136b and the first short side SS1. The first receiving portion 137a may be connected to the second receiving portion 137b. The receiving portion 137 may be formed by pressing the third outer part 135c backwards from the front. The receiving portion 137 may be lowered from the front surface of the third outer part 135c so as to form a stepped portion.

The cable hole 136 may be formed through the front skin 132 (see FIG. 2) and the rear skin 133 (see FIG. 2) of the receiving portion 137. The cable hole 136 may be formed in the receiving portion 137 and/or the third outer part 130P adjacent to the lower side of the flat plate portion 130P. The cable hole 136 may include a plurality of cable holes. The first cable hole 136a may be positioned close to the second cable hole 136b.

The inner frames 210 and 230 may be formed on the front surface and/or the rear surface of the composite panel 130. The inner frames 210 and 230 may be referred to as depressed frames 210 and 230 or rigid lines 210 and 230. The inner frames 210 and 230 may be formed by depressing the front skin 132 and/or the rear skin 133 of the composite panel 130 and compressing the core 131 (see FIG. 2).

The inner frames 210 and 230 may include a front inner line 210, a rear inner line 230, and node holes 220. The front inner line 210 may be formed by depressing the front skin 132 of the composite panel 130. The rear inner line 230 may be formed by depressing the rear skin 133 of the composite panel 130.

The front inner line 210 may include the first front horizontal line 211, the second front horizontal line 212, the third front horizontal line 213, the first front vertical line 214, and the second front vertical line 215. The first front horizontal line 214 may define the upper side of the front inner line 210. The third front horizontal line 213 may define the lower side of the front inner line 210. The second front horizontal line 212 may be positioned between the first front horizontal line 211 and the third front horizontal line 213. The first front vertical line 214 may connect the first end of the first front horizontal line 211, the first end of the second front horizontal line 212, and the first end of the third front horizontal line 213 to one another. The second front vertical line 215 may connect the second end of the first front horizontal line 211, the second end of the second front horizontal line 212, and the second end of the third front horizontal line 213 to one another. For example, the first distance L1 between the first front horizontal line 211 and the second front horizontal line 212 may be less than the second distance L2 between the second front horizontal line 212 and the third front horizontal line 213.

The node holes 220 may be formed at points at which the front horizontal lines 211, 212 and 213 meet the front vertical lines 214 and 215. The node holes 220 may be formed through the front skin 132, the core 131 and the rear skin 133 of the composite panel 130.

The rear inner line 230 may include the first rear horizontal line 231, the second rear horizontal line 232, the third rear horizontal line 233, the first rear vertical line 234, and the second rear vertical line 235. The first rear horizontal line 231 may define the upper side of the rear inner line 230. The third rear horizontal line 233 may define the lower side of the rear inner line 230. The second rear horizontal line 232 may be positioned between the first rear horizontal line 231 and the third rear horizontal line 233. The first rear vertical line 234 may connect the first end of the first rear horizontal line 231, the first end of the second rear horizontal line 232, and the first end of the third rear horizontal line 233 to one another. The second rear vertical line 235 may connect the second end of the first rear horizontal line 231, the second end of the second rear horizontal line 232, and the second end of the third rear horizontal line 233 to one another. For example, the third distance L3 between the first rear horizontal line 231 and the second rear horizontal line 232 may be less than the fourth distance LA between the second rear horizontal line 232 and the third rear horizontal line 233.

The node holes 220 may be formed at points at which the rear horizontal lines 231, 232 and 233 meet the rear vertical lines 234 and 235. The node holes 220 may be formed through the front skin 132, the core 131 and the rear skin 133 of the composite panel 130.

The receiving portion 137 may be formed by pressing the third outer part 135c backwards from the front. The receiving portion 137 may be raised from the rear surface of the third outer part 135c so as to form a stepped portion.

A cut-out portion 139 may be formed at at least a portion of a curved line formed along the lower side of the flat plate portion 130P. The cut-out portion 139 may include a plurality of cut-out portions. A first cut-out portion 139a may be arranged in the first receiving portion 137a, and a second cut-out portion 139b may be arranged in the second receiving portion 137b.

Consequently, the composite panel 130 may have improved bending rigidity and/or torsional rigidity, and the flatness of the composite panel 130 may be improved.

Figure 25:
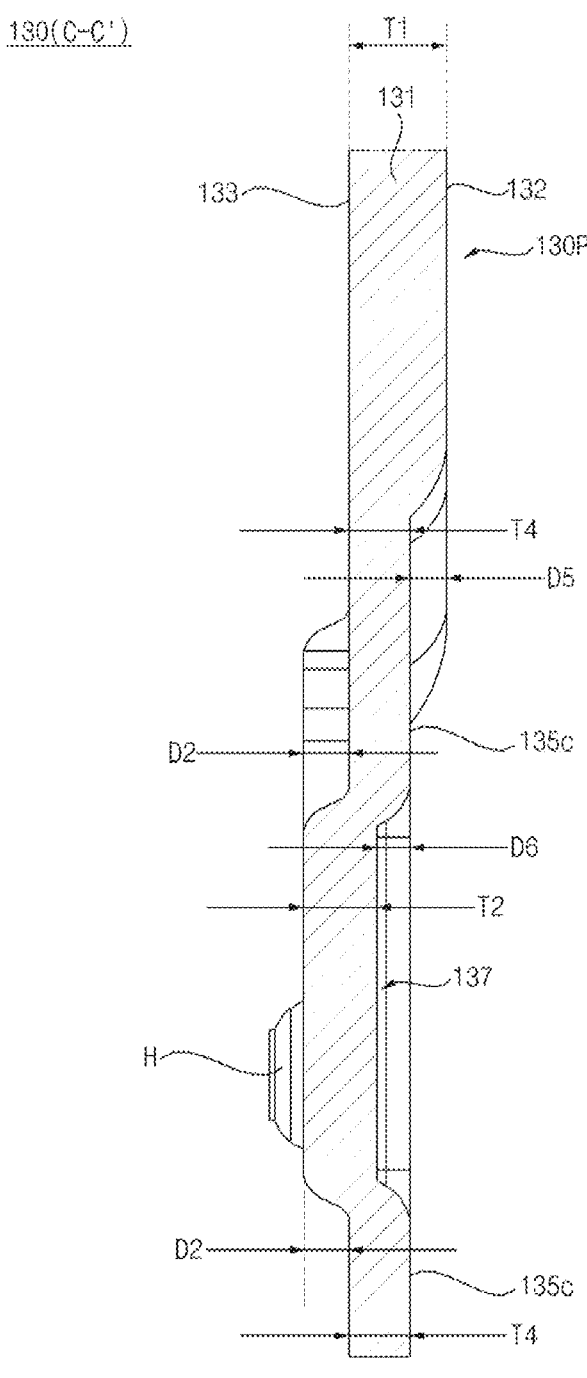

Referring to FIG. 25, the third outer part 135c may be formed by pressing the flat plate portion 130P. The front skin 132 of the third outer part 135c may be lowered from the front skin 132 of the flat plate portion 130P so as to form a stepped portion D5.

The receiving portion 137 may be formed when the third outer part 135c is pressed. The front skin 132 of the receiving portion 137 may be lowered from the front skin 132 of the third outer part 135c so as to form a stepped portion D6.

The rear skin 133 of the receiving portion 137 may be raised from the rear skin 133 of the third outer part 135c so as to form the stepped portion D2. The height of the stepped portion D6 between the front skin 132 of the third outer part 135c and the front skin 132 of the receiving portion 137 may be less than the height of the stepped portion D2 between the rear skin 133 of the third outer part 135c and the rear skin 133 of the receiving portion 137. The thickness T1 of the flat plate portion 130P may be greater than the thickness T2 of the receiving portion 137. The thickness T4 of the third outer part 135c may be less than the thickness T1 of the flat plate portion 130P. The thickness T2 of the receiving portion 137 may be greater than the thickness T4 of the third outer part 135c.

The core 131 of the composite panel 130 is capable of absorbing external force while the composite panel 130 is pressed toward the rear skin 133 from the front skin 132 of the flat plate portion 130P. External force applied to the front skin 132 of the flat plate portion 130P may be stronger than external force applied to the rear skin 133 of the flat plate portion 130P. The composite panel 130 is capable not only of ensuring rigidity but also of absorbing impact.

The fastening recess H may project from the rear skin 133 of the receiving portion 137. The fastening recess H may be depressed from the front skin 132 of the receiving portion 137, and may project from the rear skin 133 of the receiving portion 137. The center of the fastening recess may be perforated.

Figure 26:
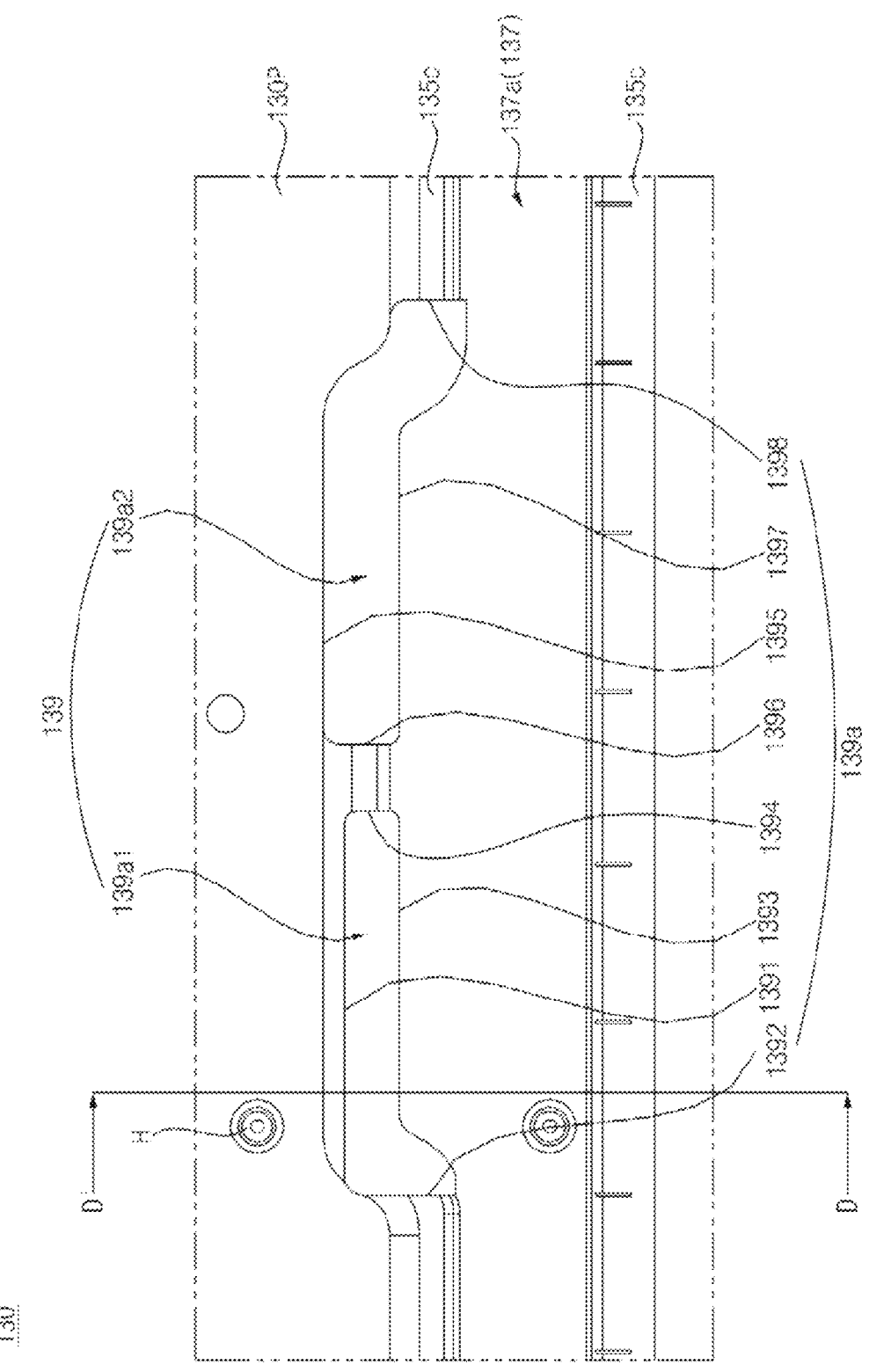

Referring to FIG. 26, the first cut-out portion 139a may include a first slit 139a1 and a second slit 139a2. The first slit 139al and/or the second slit 139a2 may extend long in the longitudinal direction of the receiving portion 137. The first slit 139al may be formed at the boundary of the flat plate portion 130P, the boundary of the third outer part 135c and/or the boundary of the first receiving portion 137a. The second slit 139a2 may be adjacent to the first slit 139a1, and may be formed at the boundary of the flat plate portion 130P, the boundary of the third outer part 135c and/or the boundary of the first receiving portion 137a.

The first slit 139al may include an upper side 139a, a left side 1392, a right side 1394, and a lower side 1393. The upper side 1391 may be formed at the stepped portion formed at the boundary of the lower side of the flat plate portion 130P. The lower side 1393 may be formed at the first receiving portion 137a adjacent to the upper side of the first receiving portion 137a. The left side 1392 may connect the left end of the upper side 1391 to the left end of the lower side 1393, and may be formed at the stepped portion of the lower side of the flat plate portion 130P, the third outer part 135c and/or the first receiving portion 137a. The right side 1394 may be formed at the stepped portion formed at the boundary of the lower side 1393 of the flat plate portion 130P, the third outer part 135c and/or the first receiving portion 137a. For example, the length of the left side 1392 may be greater than the length of the right side 1394. The upper side 1391 may be linear, and the lower side 1393 may include a linear portion and a curved portion.

The second slit 1392a may include an upper side 1395, a left side 1396, a right side 1398, and a lower side 1397. The upper side 1395 may be formed at the boundary of the lower side of the flat plate portion 130P. The lower side 1397 may be formed at the first receiving portion 137a adjacent to the upper side of the first receiving portion 137a. The left side 1396 may connect the left end of the upper side 1395 to the left end of the lower side 1397, and may be formed at the stepped portion of the lower side of the flat plate portion 130P, the third outer part 135c and/or the first receiving portion 137a. The right side 1398 may be formed at the stepped portion formed at the boundary of the lower side of the flat plate portion 130P, the third outer part 135c and/or the first receiving portion 137a. For example, the length of the left side 1396 may be substantially equal to the length of the right side 1398. The upper side 1395 may include a linear portion and a curved portion, and the lower side 1397 may include a linear portion and a curved portion. The upper side 1395 may be parallel to the lower side 1397.

Figure 27:
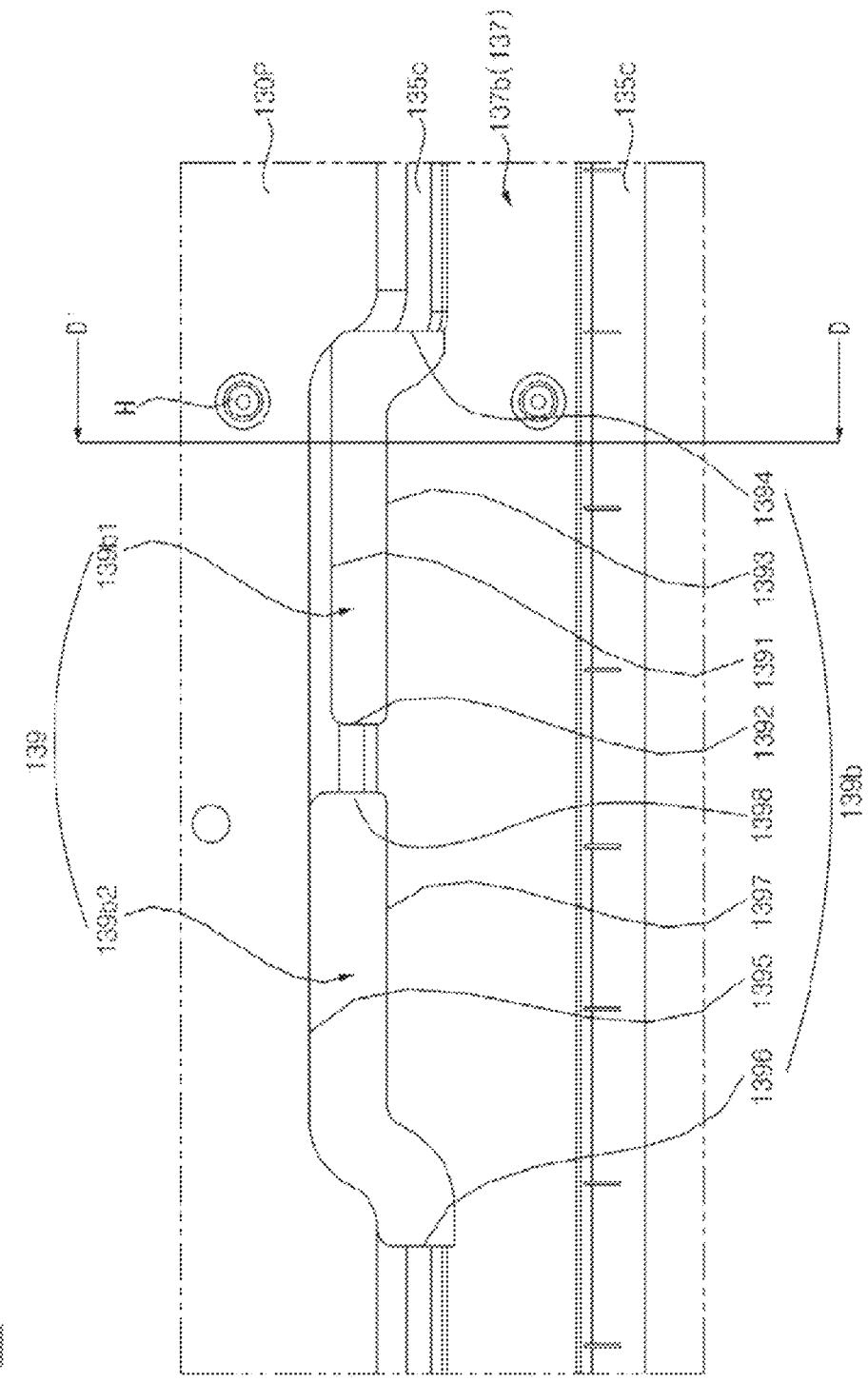

Referring to FIG. 27, the second cut-out portion 139b may include a first slit 139b1 and a second slit 139b2. The first lit 139b1 and/or the second slit 139b2 may extend long in the longitudinal direction of the receiving portion 137. The first slit 139b1 may be formed at the boundary of the flat plate portion 130P, the boundary of the third outer part 135c and/or the boundary of the second receiving portion 137b. The second slit 139b2 may be adjacent to the first slit 139b1, and may be formed at the boundary of the flat plate portion 130P, the boundary of the third outer part 135c and/or the boundary of the second receiving portion 137b.

The first slit 139b1 may include the upper side 1391, the left side 1392, the right side 1394, and the lower side 1393. The upper side 1391 may be formed at the stepped portion formed at the boundary of the lower side of the flat plate portion 130P. The lower side 1393 may be formed at the second receiving portion 137b adjacent to the upper side of the second receiving portion 137b. The left side 1392 may connect the left end of the upper side 1391 to the left end of the lower side 1393, and may be formed at the stepped portion of the lower side of the flat plate portion 130P, the third outer part 136c and/or the second receiving portion 137b. The right side 1394 may be formed at the stepped portion formed at the boundary of the lower side 1393 of the flat plate portion 130P, the third outer part 135c and/or the second receiving portion 137b. For example, the length of the left side 1392 may be less than the length of the right side 1394. The upper side 1391 may be linear, and the lower side 1393 may include a linear portion and a curved portion.

The second slit 139b2 may include the upper side 1395, the left side 1396, the right side 1398, and the lower side 1397. The upper side 1395 may be formed at the boundary of the lower side of the flat plate portion 130P. The lower side 1397 may be formed at the second receiving portion 137b adjacent to the upper side of the second receiving portion 137b. The left side 1396 may connect the left end of the upper side 1395 to the left end of the lower side 1397, and may be formed at the stepped portion of the lower side of the flat plate portion 130P, the third outer part 135c and/or the second receiving portion 137b. The right side 1398 may be formed at the stepped portion formed at the boundary of the lower side of the flat plate portion 130P, the third outer part 135c and/or the second receiving portion 137b. For example, the length of the left side 1396 may be substantially equal to the length of the right side 1398. The upper side 1395 may include a linear portion and a curved portion, and the lower side 1397 may include a linear portion and a curved portion. The upper side 1395 may be parallel to the lower side 1397.

Figure 28:
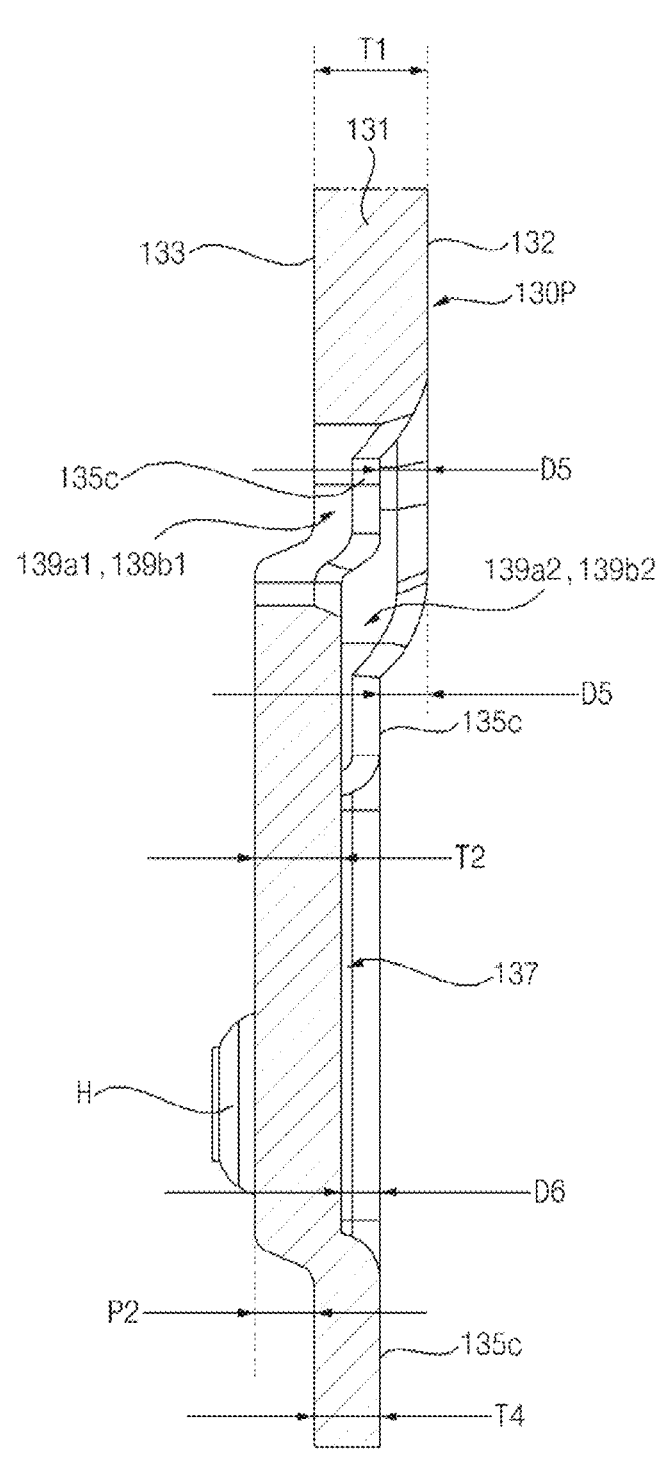

Referring to FIG. 28, the third outer part 135c may be formed by pressing the flat plate portion 130P. The front skin 132 of the third outer part 135c may be lowered from the front skin 132 of the flat plate portion 130P so as to form the stepped portion D5.

The receiving portion 137 may be formed by pressing the third outer part 135c. The front skin 132 of the receiving portion 137 may be lowered from the front skin 132 of the third outer part 135c so as to form the stepped portion D6.

The rear skin 133 of the receiving portion 137 may be raised from the rear skin 133 of the third outer part 135c so as to form the stepped portion D2. For example, the height of the stepped portion D6 between the front skin 132 of the third outer part 135c and the front skin 132 of the receiving portion 137 may be less than the height of the stepped portion D2 between the rear skin 133 of the third outer part 135c and the rear skin 133 of the receiving portion 137. The thickness T1 of the flat plate portion 130P may be greater than the thickness T2 of the receiving portion 137. The thickness T4 of the third outer part 135c may be less than the thickness T1 of the flat plate portion 130P. The thickness T2 of the receiving portion 137 may be greater than the thickness T4 of the third outer part 135c.

The core 131 of the composite panel 130 may absorb external force while the composite panel 130 is pressed toward the rear skin 133 from the front skin 132 of the flat plate portion 130P. External force applied to the front skin 132 of the flat plate portion 130P may be stronger than external force applied to the rear skin 133 of the flat plate portion 130P. The core 131 of the composite panel 130 is capable not only of ensuring rigidity but also of absorbing impact.

The fastening recess H may project from the rear skin 133 of the receiving portion 137. The fastening recess H may be depressed from the front skin 132 of the receiving portion 137, and may project from the rear skin 133 of the receiving portion 137. The center of the fastening recess may be perforated.

The first slits 139a1 and 139b1 may be formed through the front skin 132, the core 131 and/or the rear skin 133. The second slits 139a2 and 139b2 may be formed through the front skin 132, the core 131 and/or the rear skin 133.

Figure 29:
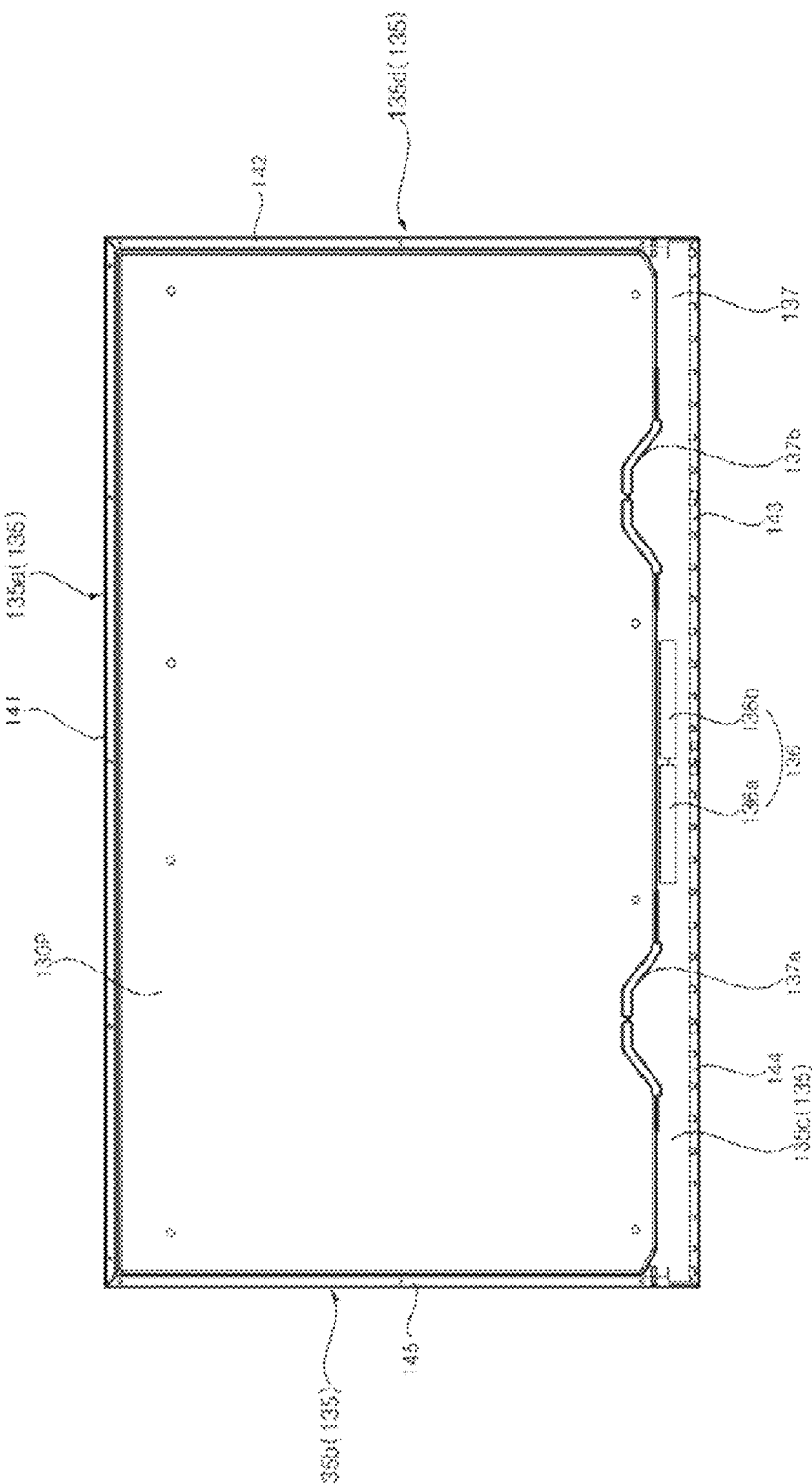
Figure 30:
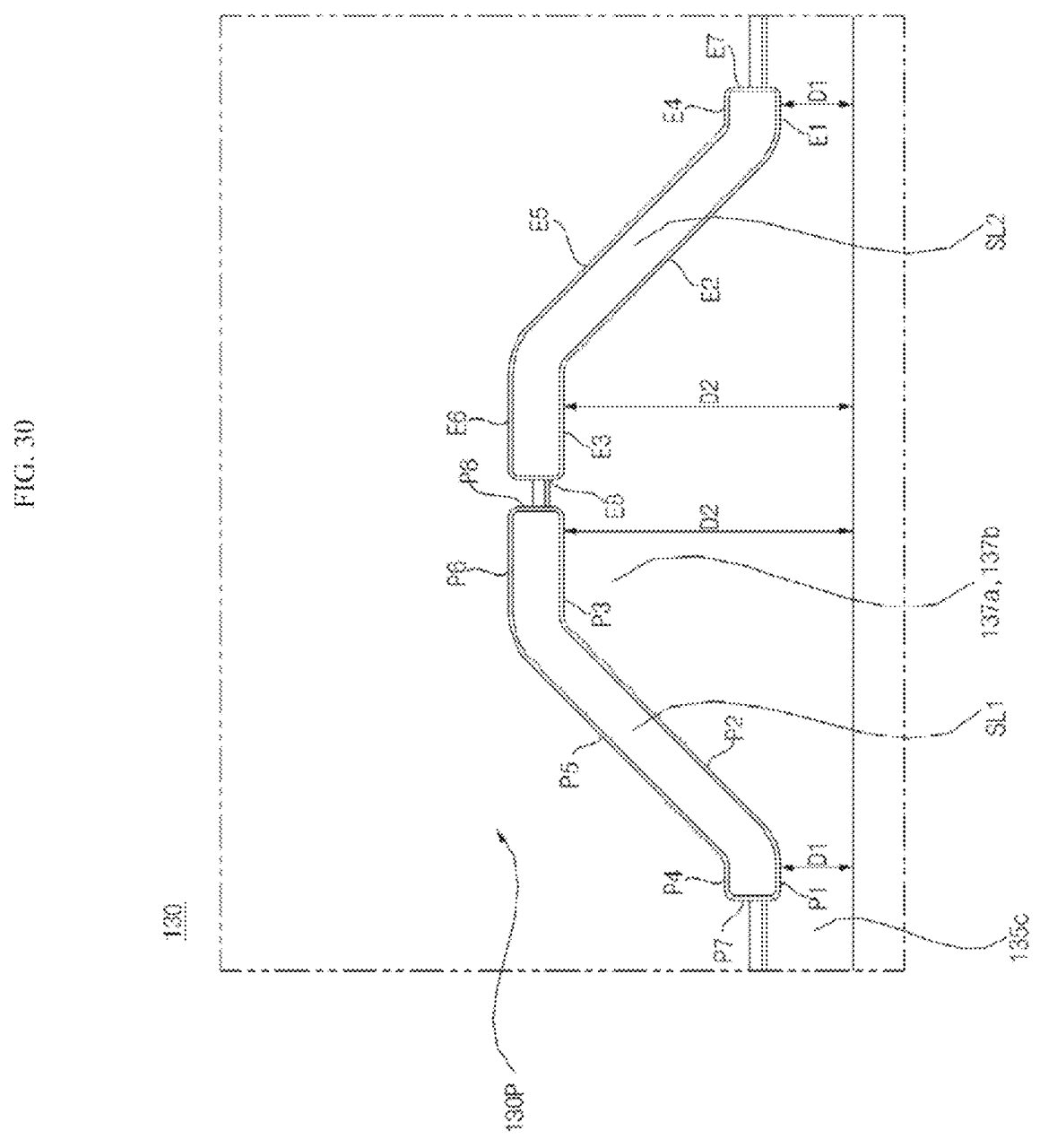

Referring to FIGS. 29 and 30, the outer part 135 may be formed at the periphery of the flat plate portion 130P. The outer part 135 may be lowered from the flat plate portion 130P so as to form a stepped portion. The outer part 135 may be formed in such a way that the core 131 (see FIG. 2) is compressed and thus front skin 132 is depressed.

The third outer part 135c may be formed adjacent to the lower side of the flat plate portion 130P. The third outer part 135c may be lowered from the flat plate portion 130P so as to form a stepped portion, and may be formed at the lower end of the flat plate portion 130P.

The receiving portions 137, 137a and 137b may be formed at the third outer part 135c. The receiving portions 137, 137a and 137b may be formed by pressing the flat plate portion 130P. The receiving portions 137, 137a and 137b may be lowered from the flat plate portion 130P so as to form a stepped portion. For example, the receiving portions 137, 137a and 137b may be flush with the third outer part 135c. In another example, the receiving portions 137, 137a and 137b may be formed by pressing the third outer part 135c.

Barrier slits SL1 and SL2 may be positioned at the boundary between the flat plate portion 130P and the receiving portions 137a and 137b. The barrier slits SL1 and SL2 may be referred to as barriers SL1 and SL2. The barrier slits SL1 and SL2 may be referred to as cut-out portions SL1 and SL2. The barrier slits SL1 and SL2 may be referred to as barrier cut-outs SL1 and SL2.

The barrier slits SL1 and SL2 may be formed in a sloping surface of the stepped portion which is inclined downwards in a direction toward the receiving portions 137a and 137b from the flat plate portion 130P. The barrier slits SL1 and SL2 may be formed by cutting out a portion of the flat plate portion 130P and portions of the receiving portions 137a and 137b. The barrier slits SL1 and SL2 may include a plurality of barrier slits. The plurality of barrier slits SL1 and SL2 may include a first slit SL1 and a second slit SL2.

The first slit SL1 may include a first part P1, a second part P2, a third part P3, a fourth part P4, a fifth part P5, a sixth part P6, a seventh part P7, and an eighth part P8. The first part P1, the second part P2, and the third part P3 may define the lower side of the first slit SL1. The fourth part P4, the fifth part P5, and the sixth part P6 may define the upper side of the first slit SL1. The upper side of the first slit SL1 may be parallel to the lower side of the first slit SL1. The seventh part P7 may connect a first end of the upper side of the first slit SL1 to a first end of the lower side of the first slit SL1, and the eighth part P8 may connect a second end of the upper side of the first slit SL1 to a second end of the lower side of the first slit SL1. The seventh part P7 may be parallel to the eighth part P8.

The first part P1 may be parallel to the third part P3. The third part P3 may be spaced apart from the first part P1. The second part P2 may connect the first part P1 to the third part P3. The fourth part P4 may be parallel to the sixth part P6. The sixth part P6 may be spaced apart from the fourth part P4. The fifth part P5 may connect the fourth part P4 to the sixth part P6.

The fourth part P4, the fifth part P5, and the sixth part P6 may form one edge of the flat plate portion 130P. The first part P1, the second part P2, and the third part P3 may form one edge of each of the receiving portions 137a and 137b. The seventh part P7 and the eighth part P8 may form edges of the stepped portion which connects each of the receiving portions 137a and 137b to the flat plate portion 130P.

The second distance D2 between the lower side of each of the receiving portions 137a and 137b and the third part P3 may be greater than the first distance D1 between the lower side of each of the receiving portions 137a and 137b and the first part P1.

The second slit SL2 may include a first part E1, a second part E2, a third part E3, a fourth part E4, a fifth part E5, a sixth part E6, a seventh part E7, and an eighth part E8. The first part E1, the second part E2, and the third part E3 may define the lower side of the second slit SL2. The fourth part E4, the fifth part E5, and the sixth part E6 may define the upper side of the second slit SL2. The upper side of the second slit SL2 may be parallel to the lower side of the second slit SL2. The seventh part E7 may connect a first end of the upper side of the second slit SL2 to a first end of the lower side of the second slit SL2, and the eighth part E8 may connect a second end of the upper side of the second slit SL2 to a second end of the lower side of the second slit SL2. The seventh part E7 may be parallel to the eighth part E8.

The first part E1 may be parallel to the third part E3. The third part E3 may be spaced apart from the first part E1. The second part E2 may connect the first part E1 to the third part E3. The fourth part E4 may be parallel to the sixth part E6. The sixth part E6 may be spaced apart from the fourth part E4. The fifth part E5 may connect the fourth part E4 to the sixth part E6.

The fourth part E4, the fifth part E5, and the sixth part E6 may form one edge of the flat plate portion 130P. The first part E1, the second part E2, and the third part E3 may form one edge of each of the receiving portions 137a and 137b. The seventh part E7 and the eighth part E8 may form one edge of the stepped portion which connects each of the receiving portions 137a and 137b to the flat plate portion 130P.

The second distance D2 between the lower side of each of the receiving portions 137a and 137b and the third part E3 may be greater than the first distance D1 between the lower side of each of the receiving portions 137a and 137b and the first part E1. The first slit SL1 may be symmetrical with the second slit SL2.

Accordingly, it is possible to solve a problem in that the display panel 110 is defectively coupled to the composite panel 130 due to flexure of the skins 132 and 133 which occurs during formation of the receiving portions 137a and 137b.

Figure 31:
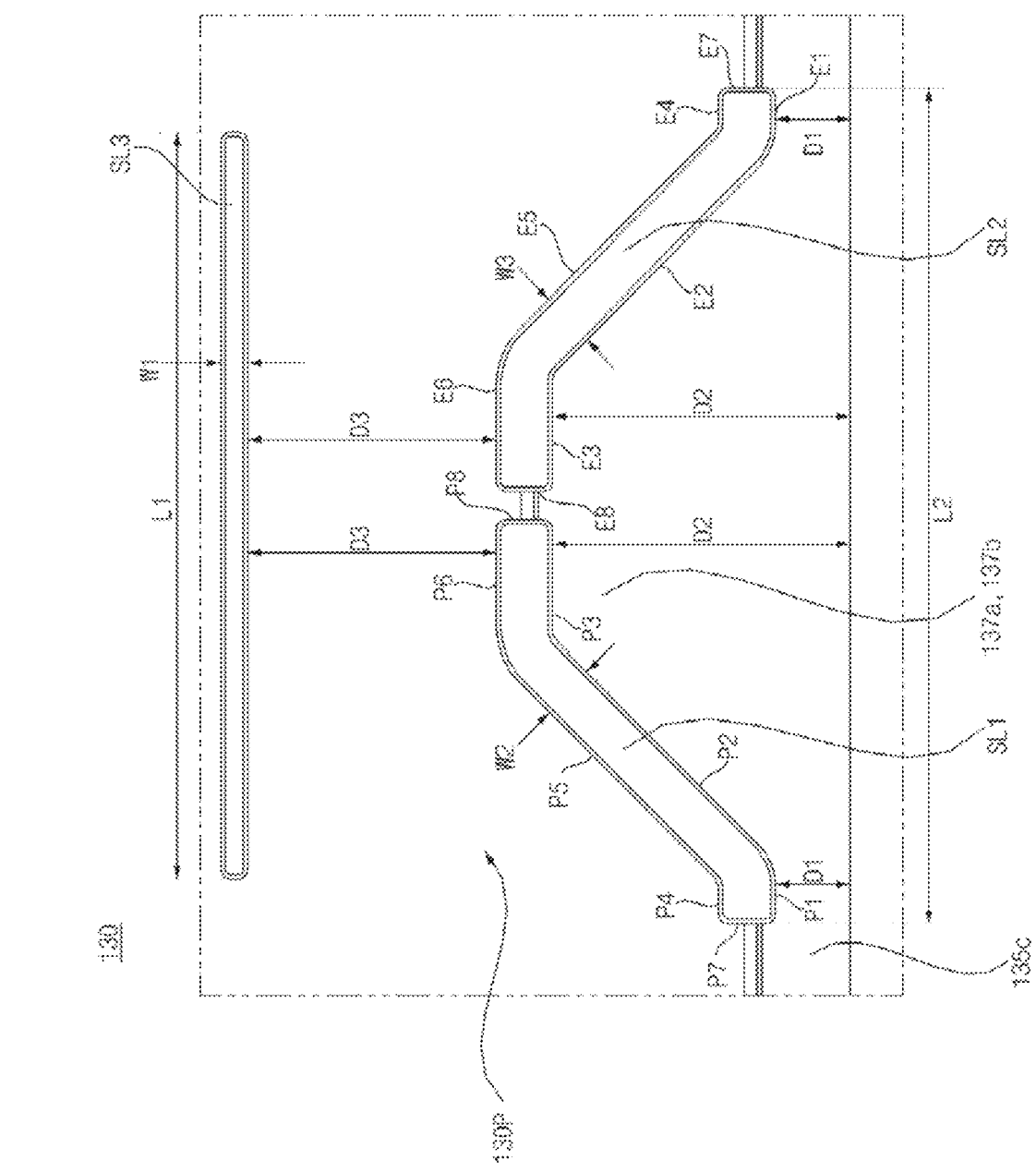

Referring to FIG. 31, the plurality of barrier slits SL1 and SL2 may include the first slit SL1, the second slit SL2, and a third slit SL3. The third slit SL3 may extend long, and may be spaced apart from the first slit SL1 and the second slit SL2. The third slit SL3 may be opposed to the receiving portions 137a and 137b based on the first slit SL1 and the second slit SL2.

The length L1 of the third slit SL3 may be less than the distance L2 between the seventh part P7 of the first slit SL1 and the seventh part E7 of the second slit SL2. The width w1 of the third slit SL3 may be less than the width W2 of the first slit SL1 and/or the width W3 of the second slit SL2.

The third distance D3 between the sixth part P6 of the first slit SL1 and the third slit SL3 may be less than the second distance D2 between the lower side of each of the receiving portions 137a and 137b and the third part P3 of the first slit SL1.

Consequently, it is possible to further solve a problem in that the display panel 110 is defectively coupled to the composite panel 130 due to flexure of the composite panel 130.

Figure 32:
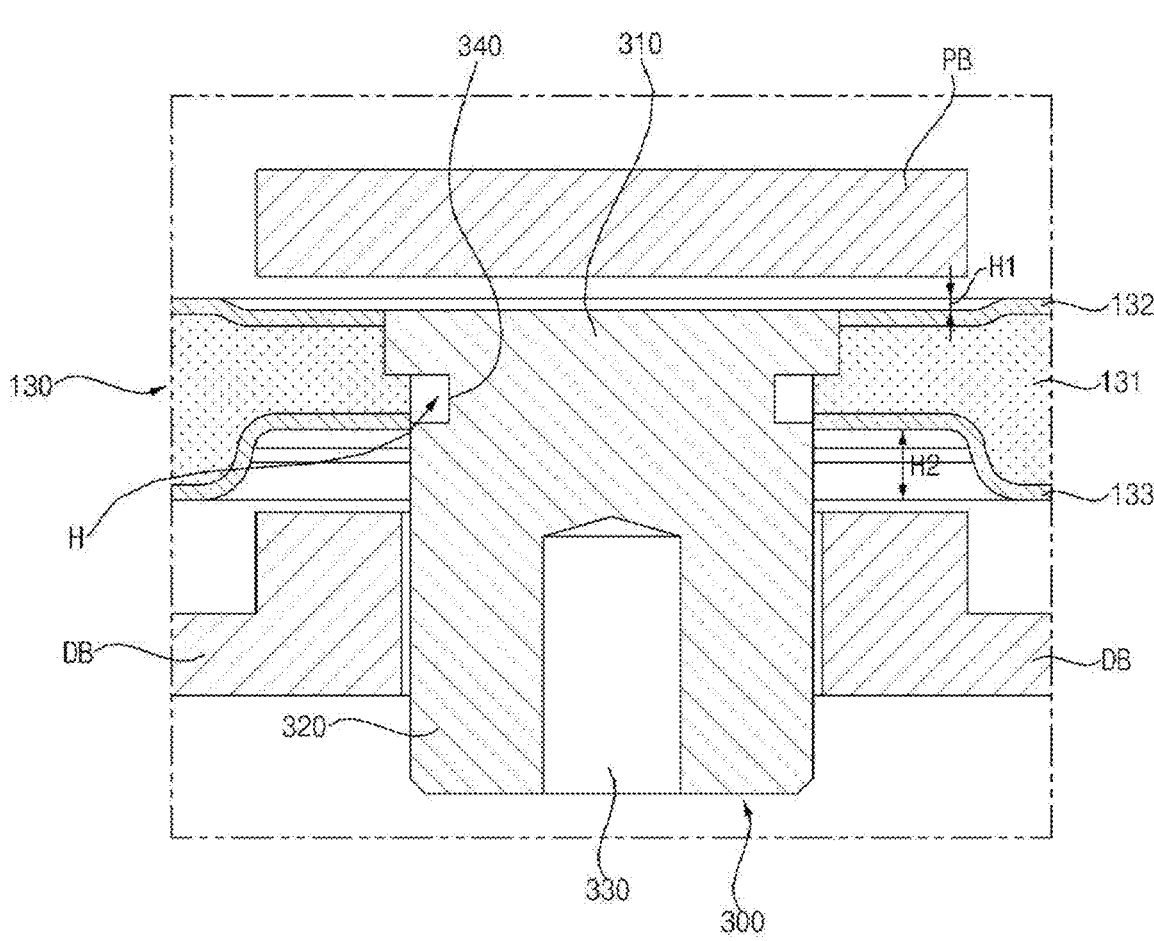

Referring to FIG. 32, a fastening member 300 may be coupled to the composite panel 130. The fastening member 300 may be, for example, a PEM nut. A fastening hole H may be formed through the composite panel 130. The fastening hole H may be formed through the front skin 132, the core 131, and the rear skin 133.

The fastening member 300 may be inserted into the fastening hole H. The fastening member 300 may be forcibly inserted into the composite panel 130 and be coupled thereto. When the fastening member 300 is coupled to the composite panel 130, the portion of the composite panel 130 around the fastening member 300 may be compressed. For example, the rear skin 133 of the composite panel 130 may be supported by a die block DB, and the front skin 132 of the composite panel 130 may be compressed by a press block PB. As the press block PB moves toward the die block DB, the composite panel 130 and the fastening member 300 may be pressed.

The portion of the front skin 132 of the composite panel 130 which comes into contact with the press block PB may be depressed so as to form a stepped portion. The portion of the rear skin 133 of the composite panel 130 which comes into contact with the die block DB may be depressed so as to form a stepped portion. The core 131 may be compressed as the front skin 132 and the rear skin 133 are pressed. The height H2 of the stepped portion of the rear skin 133 may be greater than the height H1 of the stepped portion of the front skin 132.

The fastening member 300 may include a head 310, a shaft body 320, a shaft hole 330, and a neck 340. The shaft body 320 may have the shape of an elongated circular cylinder. The head 310 may be formed on the upper end of the shaft body 320, and the neck 340 may be positioned between the upper end of the shaft body 320 and the head 310 so as to connect the shaft body 320 to the head 310. The diameter of the neck 340 may be smaller than the diameter of the shaft body 320, and the diameter of the head 310 may be larger than the diameter of the shaft body 320. The shaft hole 330 may be formed by removing the interior portion of the shaft body 320 toward the head 310 from the lower end of the shaft body 320 in the longitudinal direction of the shaft body 320. The shaft body 320 may have a cylindrical shape due to the shaft hole 330.

Figure 33:
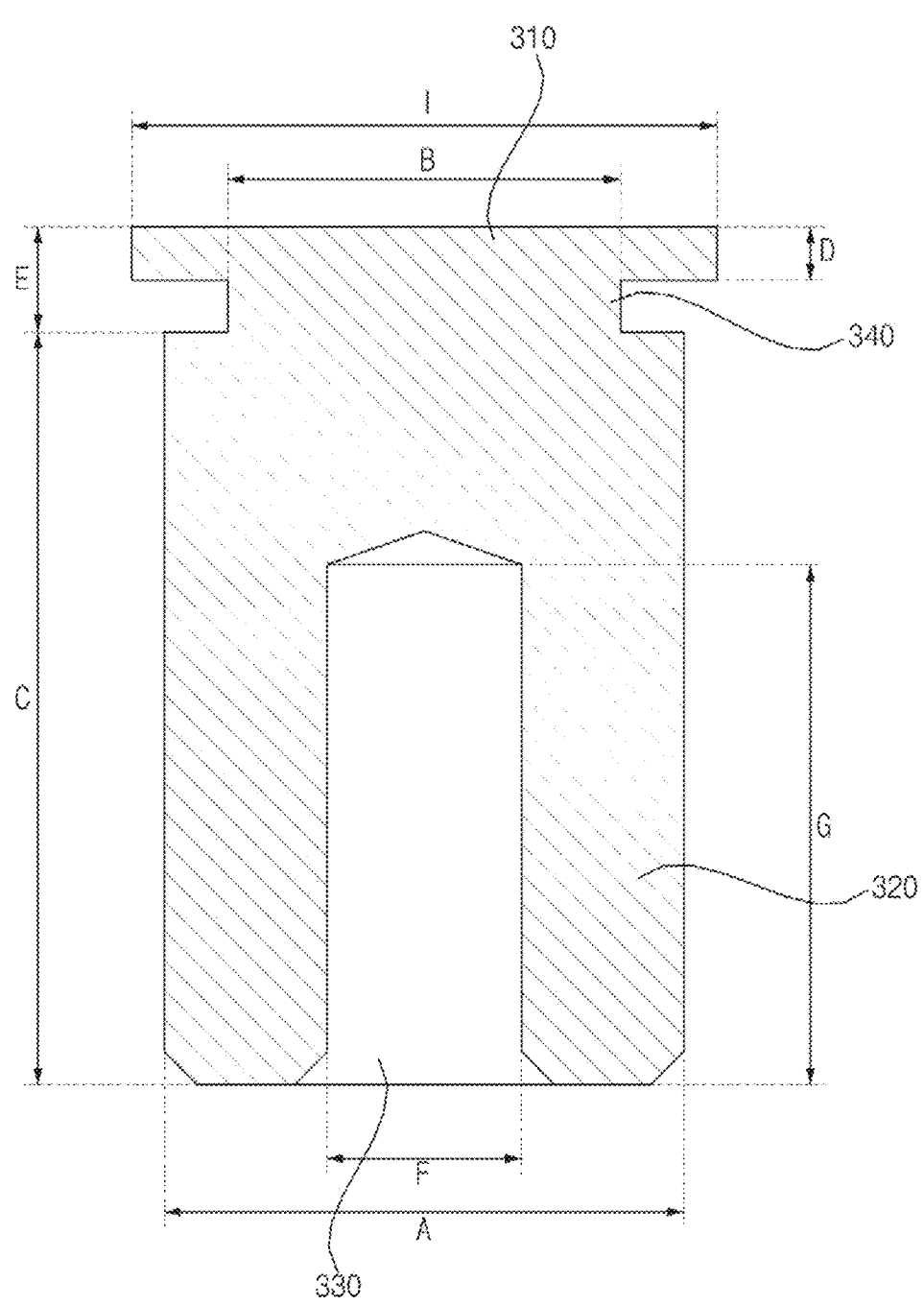

Referring to FIG. 33, the fastening member 300 may include the head 310, the shaft body 320, the shaft hole 330, and the neck 340. The shaft body 320 may have the shape of an elongated circular cylinder. The shaft body 320 may have a diameter A and a length C. The head 310 may be formed on the upper end of the shaft body 320, and the neck 340 may be positioned between the upper end of the shaft body 320 and the head 310 so as to connect the shaft body 320 to the head 310. The head 310 may have a diameter I and a thickness D. The diameter B of the neck 340 may be smaller than the diameter A of the shaft body 320, and the diameter I of the head 310 may be larger than the diameter A of the shaft body 320. The thickness E of the head 310 plus the neck 340 may be referred to as a coupled thickness E.

The shaft hole 330 may be formed by removing the interior portion of the shaft body 320 toward the head 310 from the lower end of the shaft body 320 in the longitudinal direction of the shaft body 320. The shaft body 320 may have the shape of a cylinder due to the shaft hole 330. The shaft hole 330 may have a diameter F and a length G. The length G of the shaft hole 330 may be less than the length G of the shaft body 320, and the diameter F of the shaft hole 330 may be smaller than the diameter A of the shaft body 320.

Figure 34:
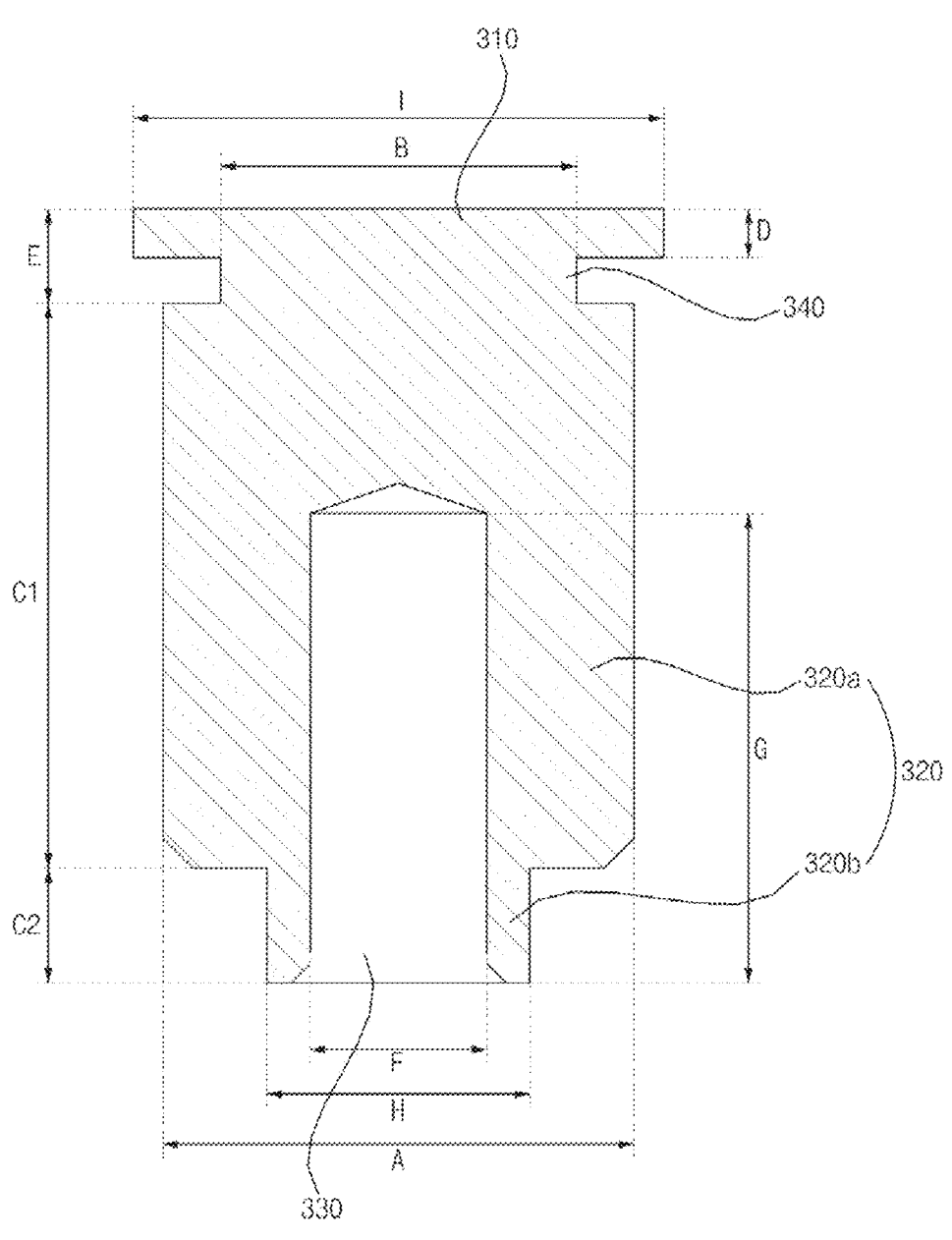

Referring to FIG. 34, the fastening member 300 may include the head 310, the shaft body 320, the shaft hole 330, and the neck 340. The shaft body 320 may have the shape of an elongated circular cylinder. The shaft body 320 may have a diameter A and a length C. The head 310 may be formed on the upper end of the shaft body 320, and the neck 340 may be positioned between the upper end of the shaft body 320 and the head 310 so as to connect the shaft body 320 to the head 310. The head 310 may have a diameter I and a thickness D. The diameter B of the neck 340 may be smaller than the diameter A of the shaft body 320, and the diameter I of the head 310 may be larger than the diameter A of the shaft body 320. The thickness E of the head 310 plus the neck 340 may be referred to as a coupled thickness E.

The shaft body 320 may include a main body 320a and a tail body 320b. The main body 320a may be connected to the neck 340, and the tail body 320b may form the end of the shaft body 320. The tail body 320b may be opposed to the neck 340 based on the main body 320a. The diameter H of the tail body 320b may be smaller than the diameter A of the main body 320a. The length C1 of the main body 320a may be greater than the length C2 of the tail body 320b.

The shaft hole 330 may be formed by removing the interior portion of the shaft body 320 toward the head 310 from the lower end of the shaft body 320 in the longitudinal direction of the shaft body 320. The shaft body 320 may have the shape of a cylinder due to the shaft hole 330. The shaft hole 330 may have a diameter F and a length G. The length G of the shaft hole 330 may be less than the length G of the shaft body 320, and the diameter F of the shaft hole 330 may be smaller than the diameter A of the shaft body 320. The diameter F of the shaft hole 330 may be smaller than the diameter H of the tail body 320b.

Figure 35:
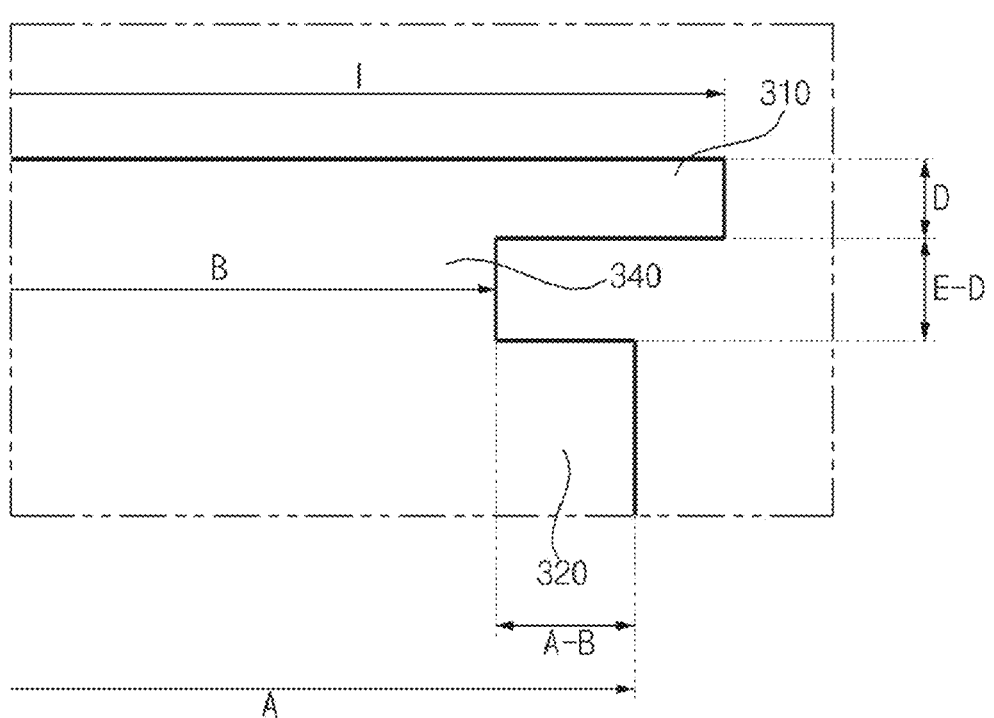
Figure 36:
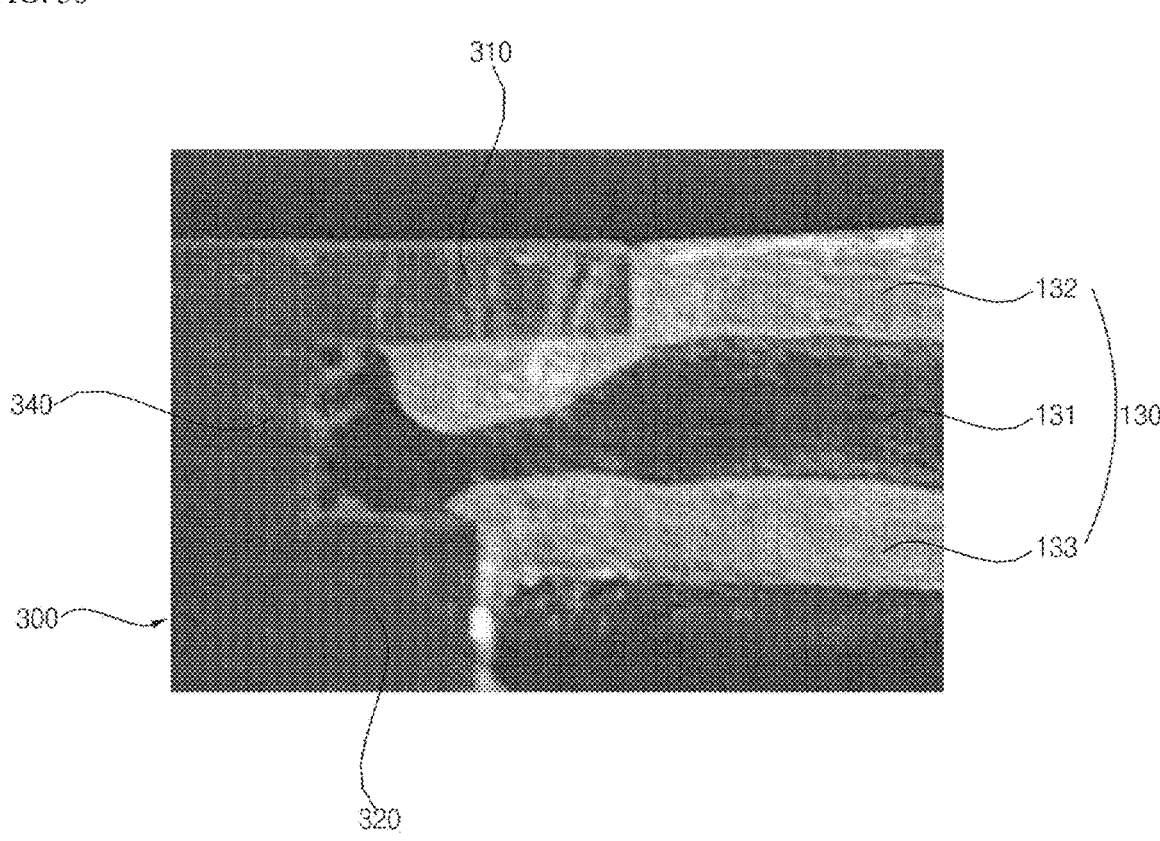

Referring to FIGS. 35 and 36, the thickness D of the head 310 may be less than the thickness E-D of the neck 340. The thickness D of the head 310 may correspond to the thickness of the front skin 132. For example, the thickness of the front skin 132 may be 0.5 mm, the thickness of the rear skin 133 may be 0.5 mm, and the thickness of the core 131 may be 3 mm. For example, the thickness E-D of the neck 340 may be 1.5 to 2.3 times the thickness D of the head 310. In another example, the thickness E-D of the neck 340 may be twice the thickness D of the head 310. In a further example, the thickness D of the head 310 may be 0.5 mm, and the thickness E-D of the neck 340 may be 1 mm. The diameter A of the shaft body 320 may be larger than the diameter B of the neck 340. For example, the difference A-B between the diameter A of the shaft body 320 and the diameter B of the neck 340 may be 0.8 mm.

As described with reference to FIG. 32, as the fastening member 300 is coupled to the composite panel 130, the portion of the core 131 around the fastening member 300 may be compressed and thus the front skin 132 and/or the rear skin 133 may be pressed. The front surface of the front skin 132 may be flush with the front surface of the head 310. The front skin 132 may come into contact with the lateral surface and the lower surface of the head 310. The front skin 132 may be press-fitted between the head 310 and the neck 340 of the fastening member 300.

The rear skin 133 may be opposed to the front skin 132 based on the core 131. The rear skin 133 may come into contact with the outer surface of the shaft body 320 of the fastening member 300. The core 132 may be press-fitted between the upper surface of the shaft body 320 and the lower surface of the head 310 while being compressed between the front skin 132 and the rear skin 133, and may then come into contact with the lateral surface of the neck 340. Consequently, horizontal fastening force of the fastening member 300 with respect to the composite panel 130 may be improved. The horizontal fastening force may be a force resisting a moment applied to the fastening member 300.

Accordingly, the fastening member 300 may be firmly coupled to the composite panel 130 having a thin thickness.

Figure 37:
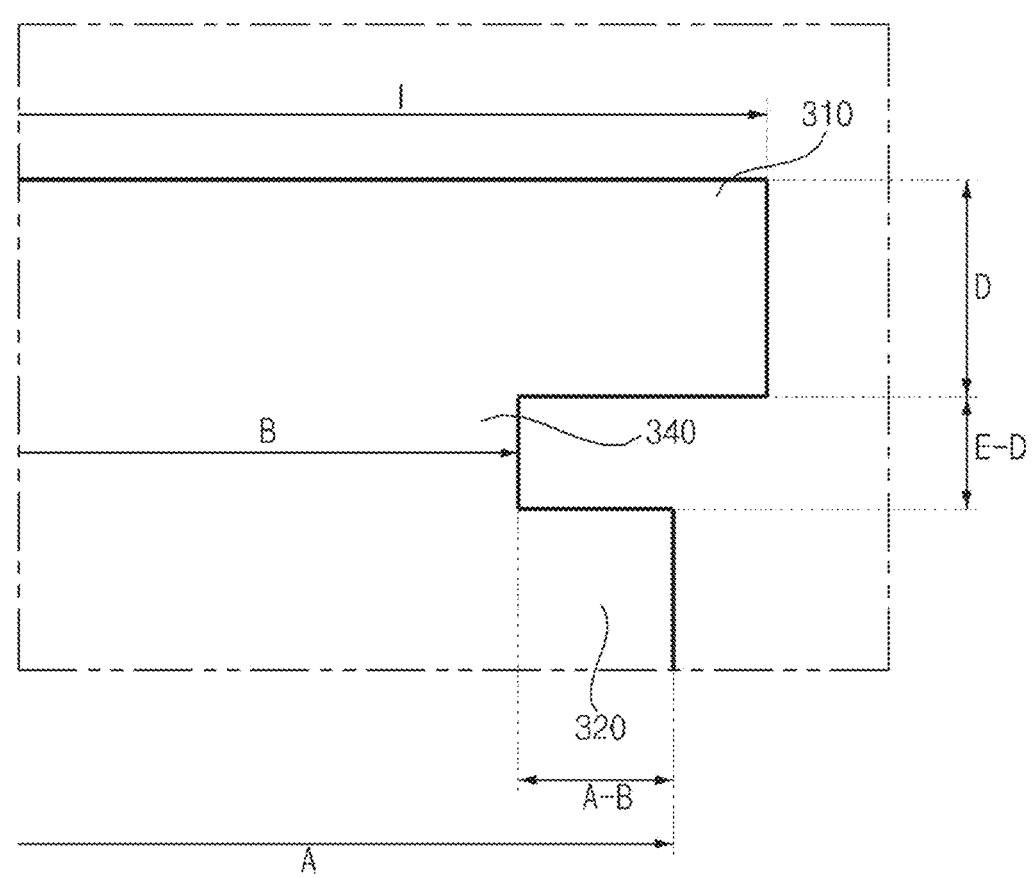
Figure 38:
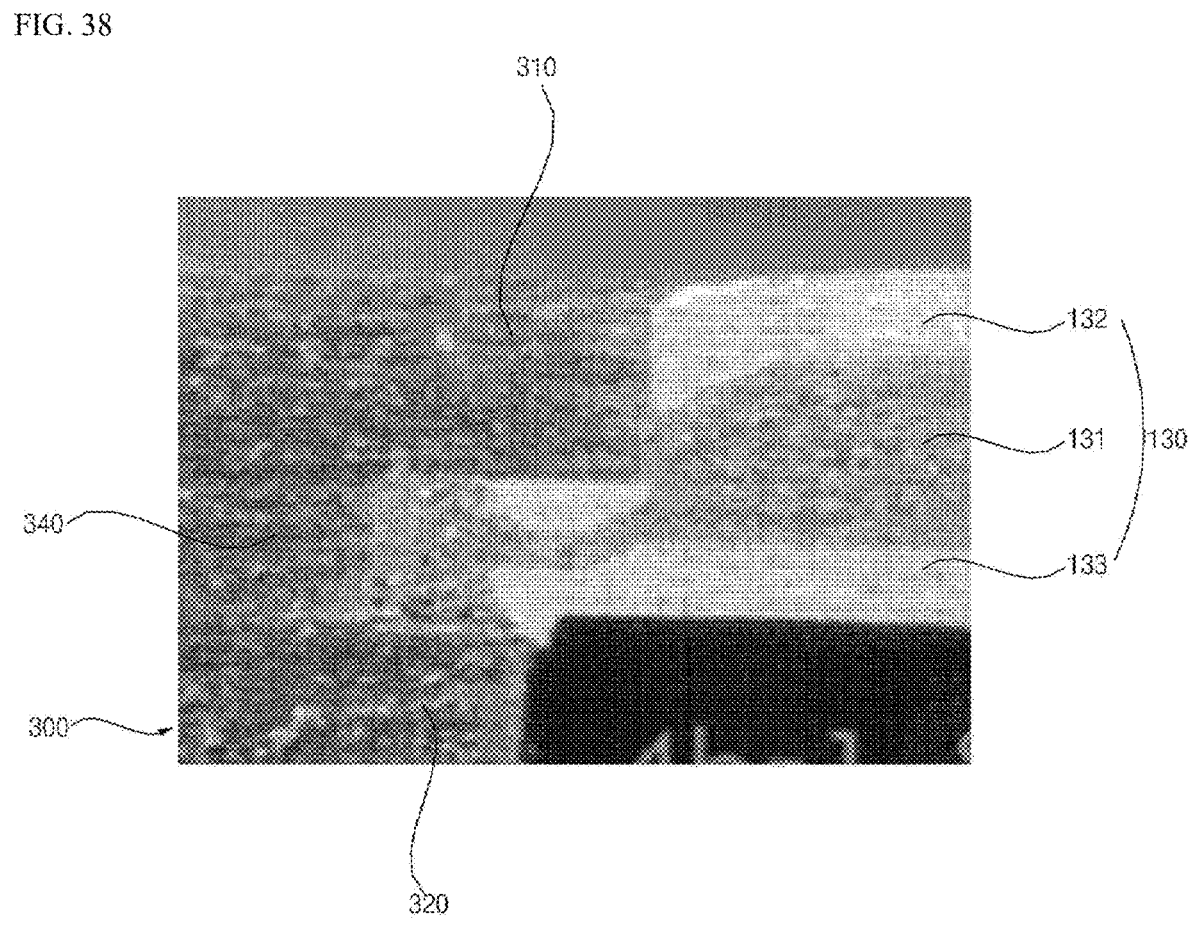

Referring to FIGS. 37 and 38, the thickness D of the head 310 may be greater than the thickness E-D of the neck 340. The thickness D of the head 310 may be greater than the thickness of the front skin 132. For example, the thickness of the front skin 132 may be 0.5 mm, the thickness of the rear skin 133 may be 0.5 mm, and the thickness of the core 131 may be 3 mm. For example, the thickness D of the head 310 may be 1.1 to 1.5 times the thickness E-D of the neck 340. In another example, the thickness D of the head 310 may be 1.3 times the thickness E-D of the neck 340. In a further example, the thickness D of the head 310 may be 1.3 mm, and the thickness E-D of the neck 340 may be 1 mm. The diameter A of the shaft body 320 may be larger than the diameter B of the neck 340. For example, the difference between the diameter A of the shaft body 320 and the diameter B of the neck 340 may be 0.8 mm.

As described with reference to FIG. 32, as the fastening member 300 is coupled to the composite panel 130, the portion of the core 131 around the fastening member 300 is compressed and thus the front skin 132 and/or the rear skin 133 may be pressed. The front surface of the front skin 132 may be flush with the front surface of the head 310. The front skin 132 may come into contact with the lateral surface and the lower surface of the head 310. The front skin 132 may be press-fitted between the head 310 and the neck 340 of the fastening member 300.

The rear skin 133 may be opposed to the front skin 132 based on the core 131. The rear skin 133 may come into contact with the outer surface and/or the upper surface of the shaft body 320 of the fastening member 300. The core 131 may be forcibly pushed into the space defined between the upper surface of the shaft body 320, the lower surface of the head 310 and the lateral surface of the neck 340 while being compressed between the front skin 132 and the rear skin 133. Consequently, a vertical fastening force of the fastening member 300 with respect to the composite panel 130 may be improved. The vertical fastening force may be a force resisting a force applied in the longitudinal direction of the fastening member 300.

As a result, the fastening member 300 may be firmly coupled to the composite panel 130 having a thin thickness.

Figure 39:
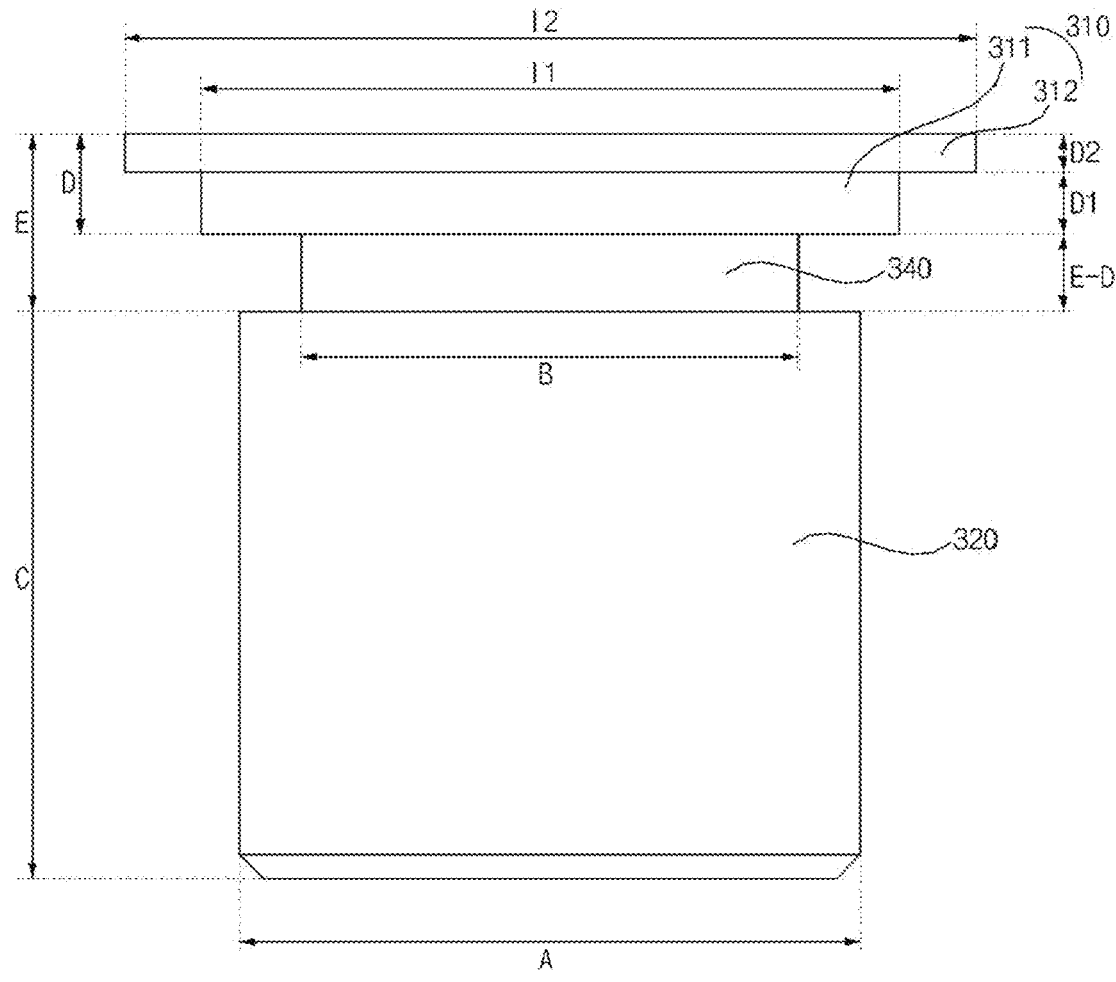
Figure 40:
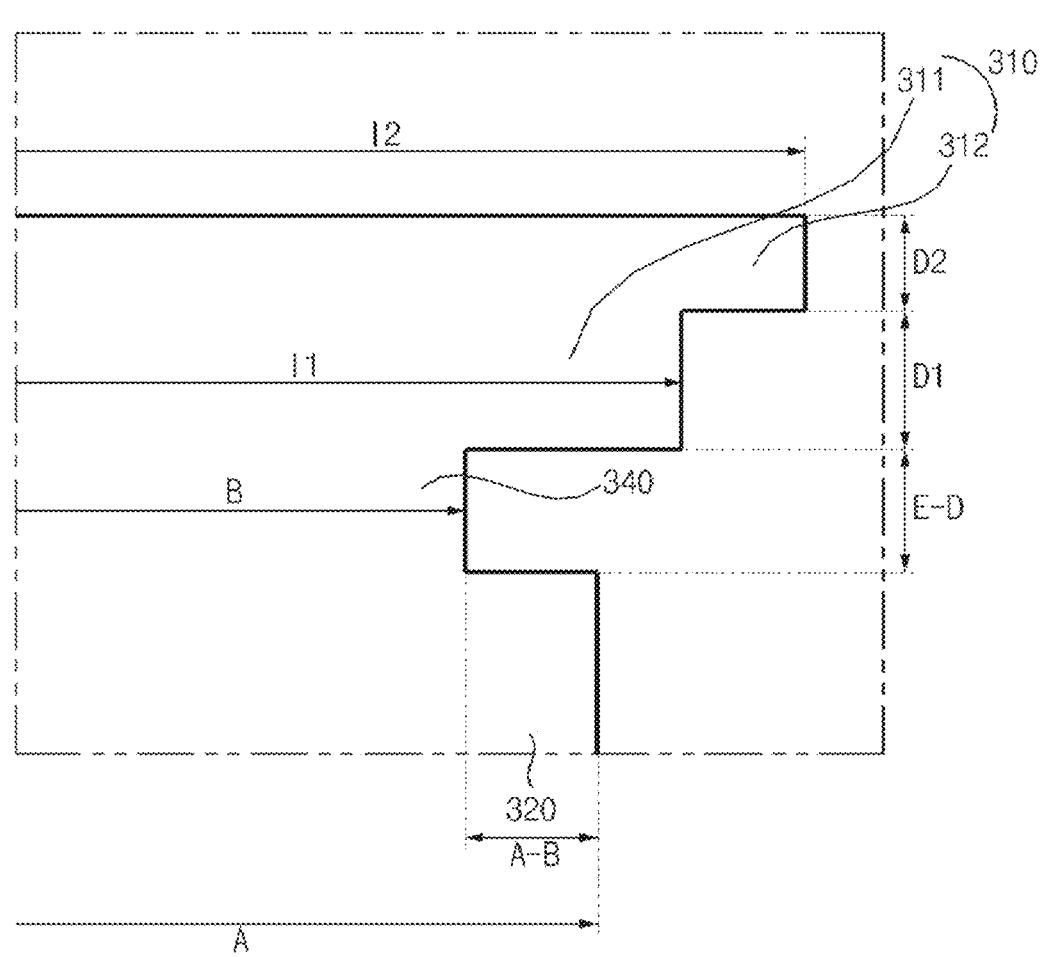

Referring to FIGS. 39 and 40, the head 310 may be constructed so as to have multiple steps 311 and 312. The head 310 may include a first head portion 311 and a second head portion 312. The first head portion 311 may have a diameter I1 and a thickness D1, and the second head portion 312 may have a diameter 12 and a thickness D2. The second head portion 312 may be positioned on the first head portion 311. The second head portion 312 may form the upper portion of the head 310, and the first head portion 311 may form the lower portion of the head 310. The diameter 12 of the second head portion 312 may be larger than the diameter I1 of the first head portion 311. The thickness D1 of the first head portion 311 may be greater than the thickness D2 of the second head portion 312. The diameter I1 of the first head portion 311 may be larger than the diameter A of the shaft body 320. The diameter A of the shaft body 320 may be larger than the diameter B of the neck 340.

The thickness D or D1+D2 may be greater than the thickness E-D of the neck 340. The thickness D or D1+D2 of the head 310 may be greater than the thickness of the front skin 132.

For example, when the skins 132 and 133 include aluminum, the thickness of the front skin 132 may be 0.5 mm, the thickness of the rear skin 133 may be 0.5 mm, and the thickness of the core 131 may be 3 mm.

In another example, the skins 132 and 133 include iron, the thickness of the front skin 132 may be 0.2 to 0.3 mm, the thickness of the rear skin 133 may be 0.2 to 0.3 mm, and the thickness of the core 131 may be 3 mm.

For example, the thickness D1 of the first head portion 311 may be 0.8 to 1.2 mm, and the thickness D2 of the second head portion 312 may be 0.4 to 0.8 mm. For example, the thickness E-D of the neck 340 may be 0.8 to 1.3 mm.

The diameter A of the shaft body 320 may be larger than the diameter B of the neck 340. For example, the difference A-B between the diameter A of the shaft body 320 and the diameter B of the neck 340 may be 0.8 mm.

Figure 41:
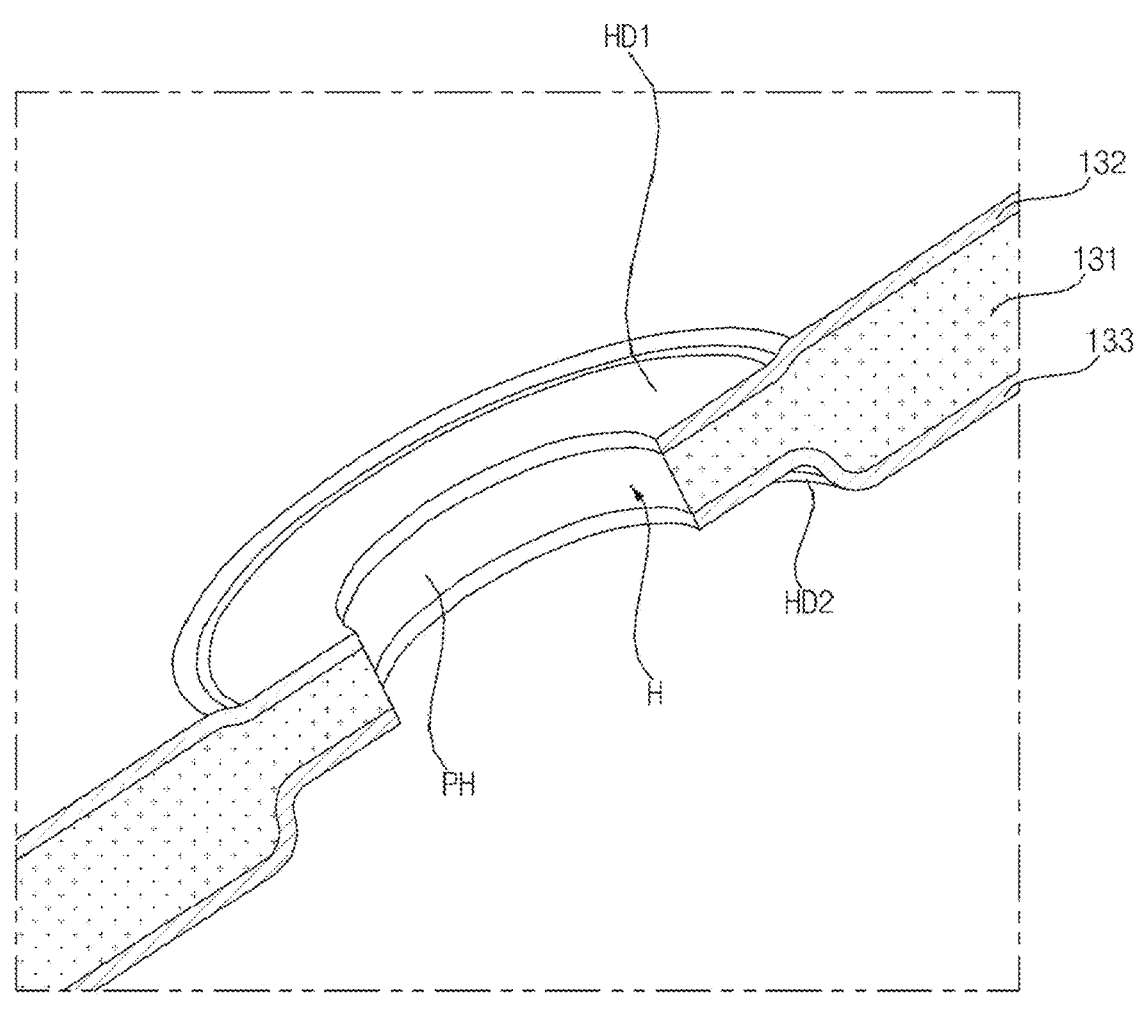
Figure 42:
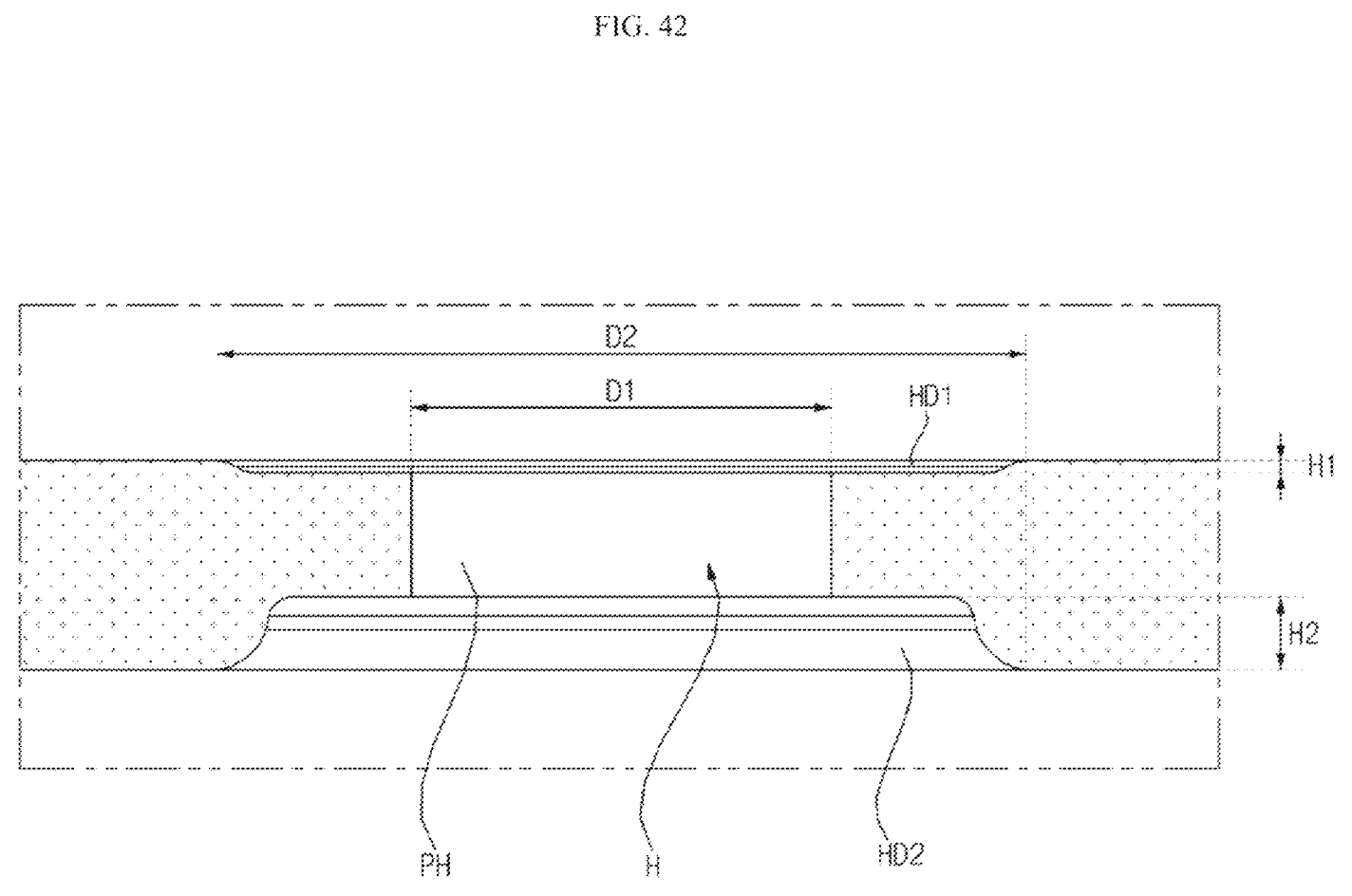

Referring to FIGS. 41 and 42, the fastening hole H may include a through hole PH, a first press portion HD1, and a second press portion HD2. The shaft body 320 of the fastening member 300 (see FIG. 32) may be inserted into the through hole PH. The diameter D1 of the through hole PH may correspond to the diameter A (see FIG. 39) of the shaft body 320. For example, the diameter D1 of the through hole PH may be 7.5 to 8.5 mm. In another example, the diameter D1 of the through hole PH may be 8.1 mm.

The first press portion HD1 may be formed by depressing the front skin 132. The second press portion HD2 may be formed by depressing the rear skin 133. The depth H2 of the second press portion HD2 may be greater than the depth H1 of the first press portion HD1. For example, the depth H1 of the first press portion HD1 may be 0.4 mm, and the depth H2 of the second press portion HD2 may be 1.8 mm.

The diameter D2 of the first press portion HD1 may correspond to the diameter D2 of the second press portion HD2. For example, the diameter D2 of the first press portion HD1 and/or the diameter D2 of the second press portion HD2 may be 15 to 16 mm. In another example, the diameter D2 of the first press portion HD1 and/or the diameter D2 of the second press portion HD2 may be 15.8 mm.

The diameters I1 and 12 of the head 310 of the fastening member 300 (see FIG. 39) may be in a range between the diameter D1 of the through hole PH and the diameter D2 of the first press portion HD1.

Figure 43:
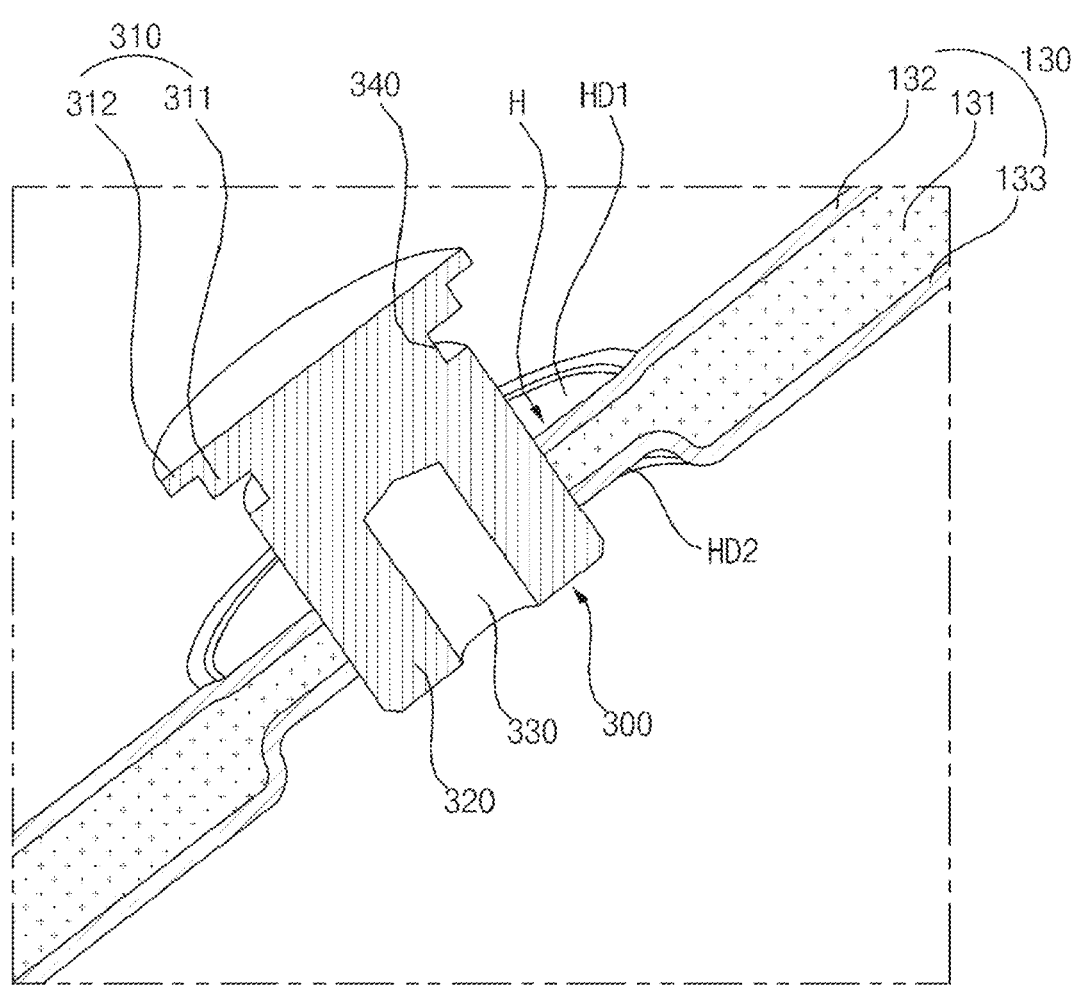
Figure 44:
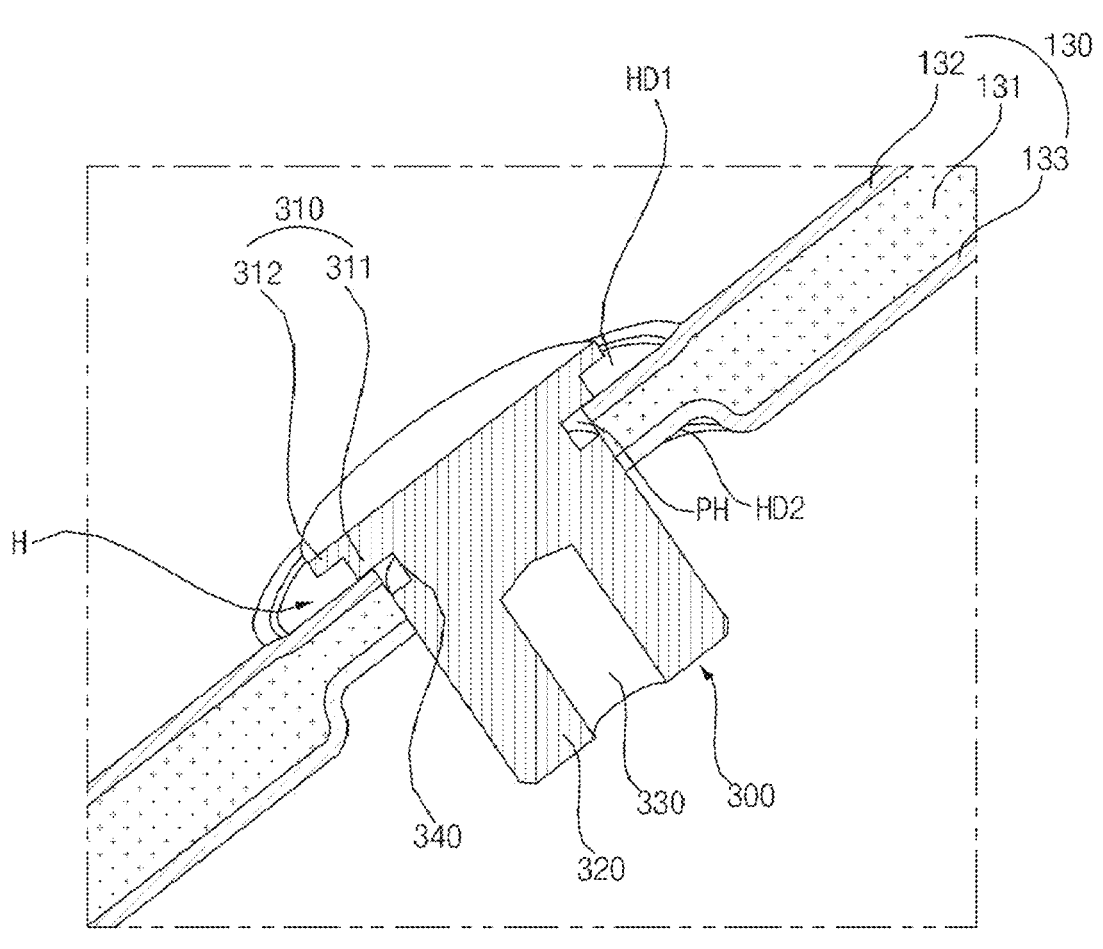
Figure 45:
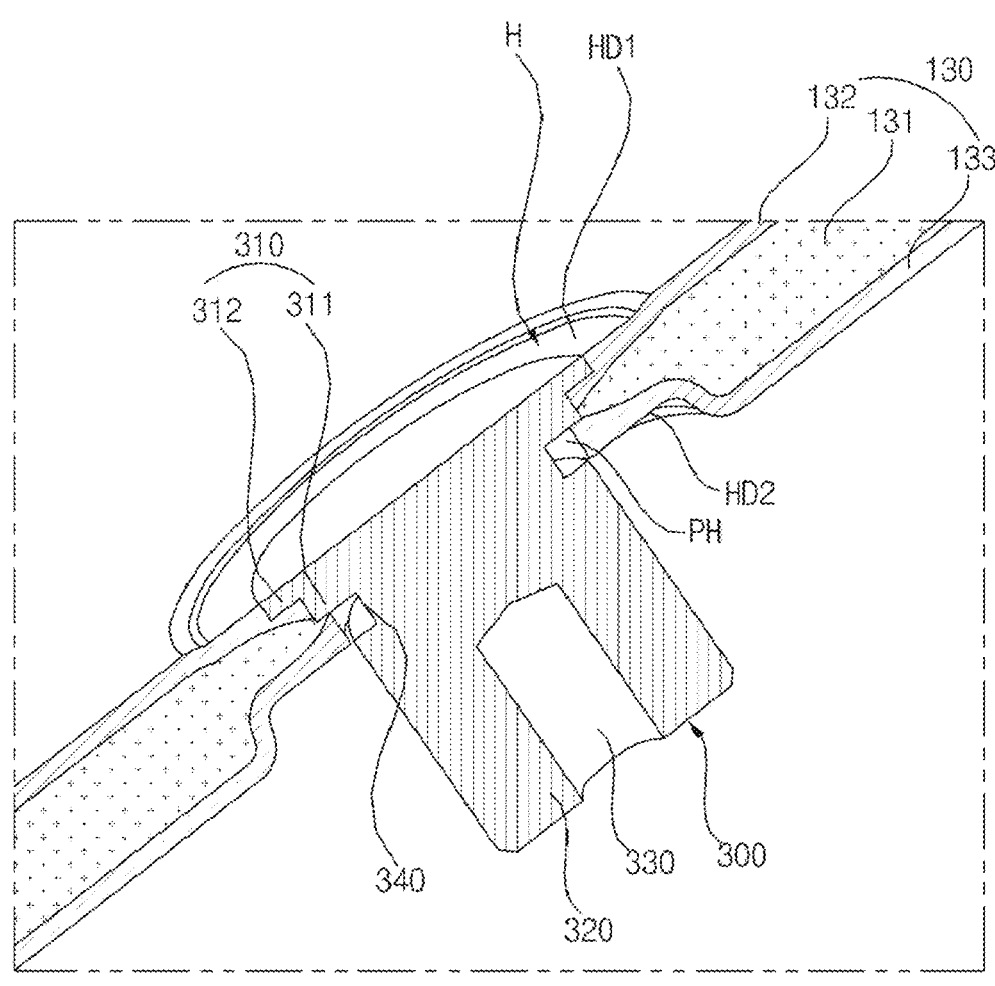

Referring to FIGS. 43 to 45, the first press portion HD1 and the second press portion HD2 may be formed through the press process, which is described with reference to FIG. 32, after the fastening member 300 is inserted into the fastening hole H. The first and second press portions HD1 and HD2 formed on the composite panel 130, which are shown in FIGS. 43 and 44, may be formed through a process described with reference to FIG. 45.

The fastening member 300 may be inserted into the fastening hole H. Here, the shaft body 320 of the fastening member 300 may pass through the through hole PH in the fastening hole H. When the fastening member 300 passes through the through hole PH, the head 310 of the fastening member 300 may catch on the front skin 132.

Through the press process, which is described with reference to FIG. 32, the head 310 of the fastening member 300 may be pushed to the front skin 132 and the core 131. By virtue of the press process, the first press portion HD1 may be formed on the front skin 132 around the head 310 of the fastening member 300, and the second press portion HD2 may be formed on the rear skin 133 around the shaft body 320 of the fastening member 300.

Figure 46:
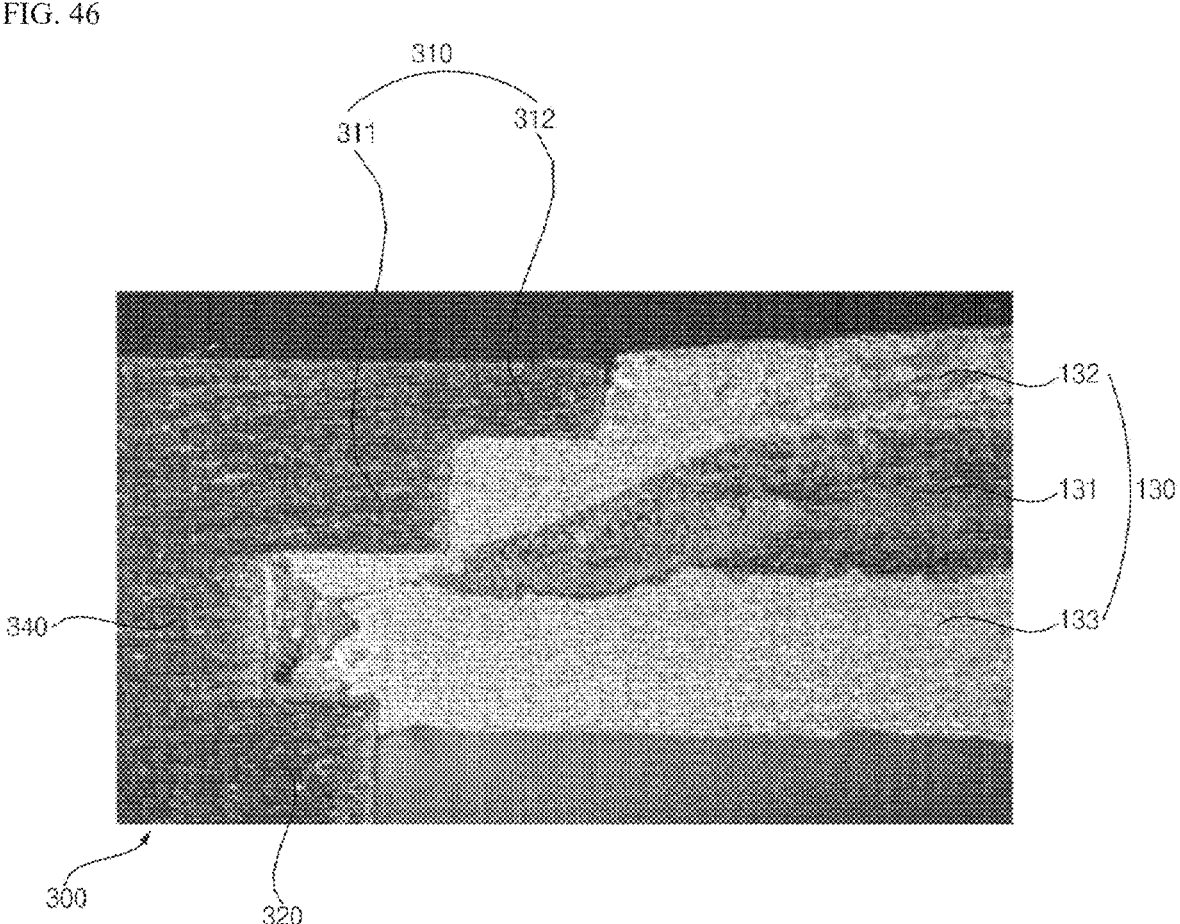

Referring to FIG. 46, when the fastening member 300 is coupled to the composite panel 130, the head 310, the neck 340 and/or the shaft body 320 of the fastening member 300 may come into contact with the front skin 132, the rear skin 133 and/or the core 131 of the composite panel 130.

The front skin 132 may be pushed to the head 310 and the neck 340, and the rear skin 133 may be pushed to the neck 340. The core 131 may be compressed, and may be forcibly pressed between the front skin 132 and the rear skin 133.

The front surface of the front skin 132 may be flush with the outer surface of the second head portion 312. The front skin 132 may be pushed to the stepped portion of the lower surface of the head 310 and be coupled thereto. The front skin 132 may come into the lateral surface and the lower surface of the second head portion 312 and the lateral surface and the lower surface of the first head portion 311. A portion of the front skin 132 may be pushed to the neck 340, and may come into contact with the lower surface of the first head portion 311 and the lateral surface of the neck 340.

The rear skin 133 may be pushed to the neck 340, and may come into contact with the lateral surface of the neck 340 and/or the lateral surface of the shaft body 320.

Not only the horizontal fastening force of the fastening member 300 with respect to the composite panel 130 but also the vertical fastening force of the fastening member 300 with respect to the composite panel 130 may be improved. The horizontal fastening force may be a force resisting a moment applied to the fastening member 300. The vertical fastening force may be a force resisting a force applied in the longitudinal direction of the fastening member 300.

As a result, the fastening member 300 may be firmly coupled to the composite panel 130 having a thin thickness.

Figure 47:
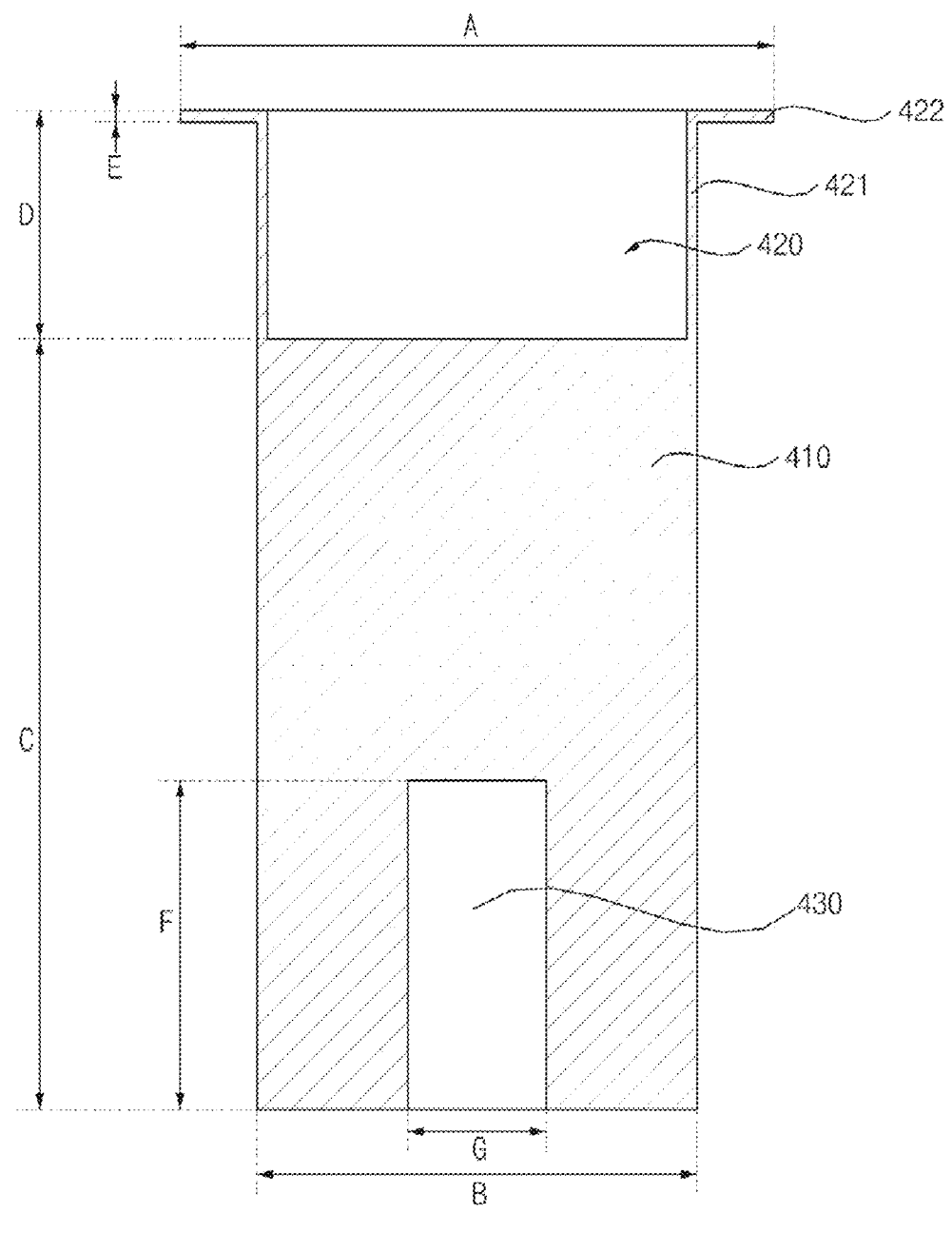
Figure 48:
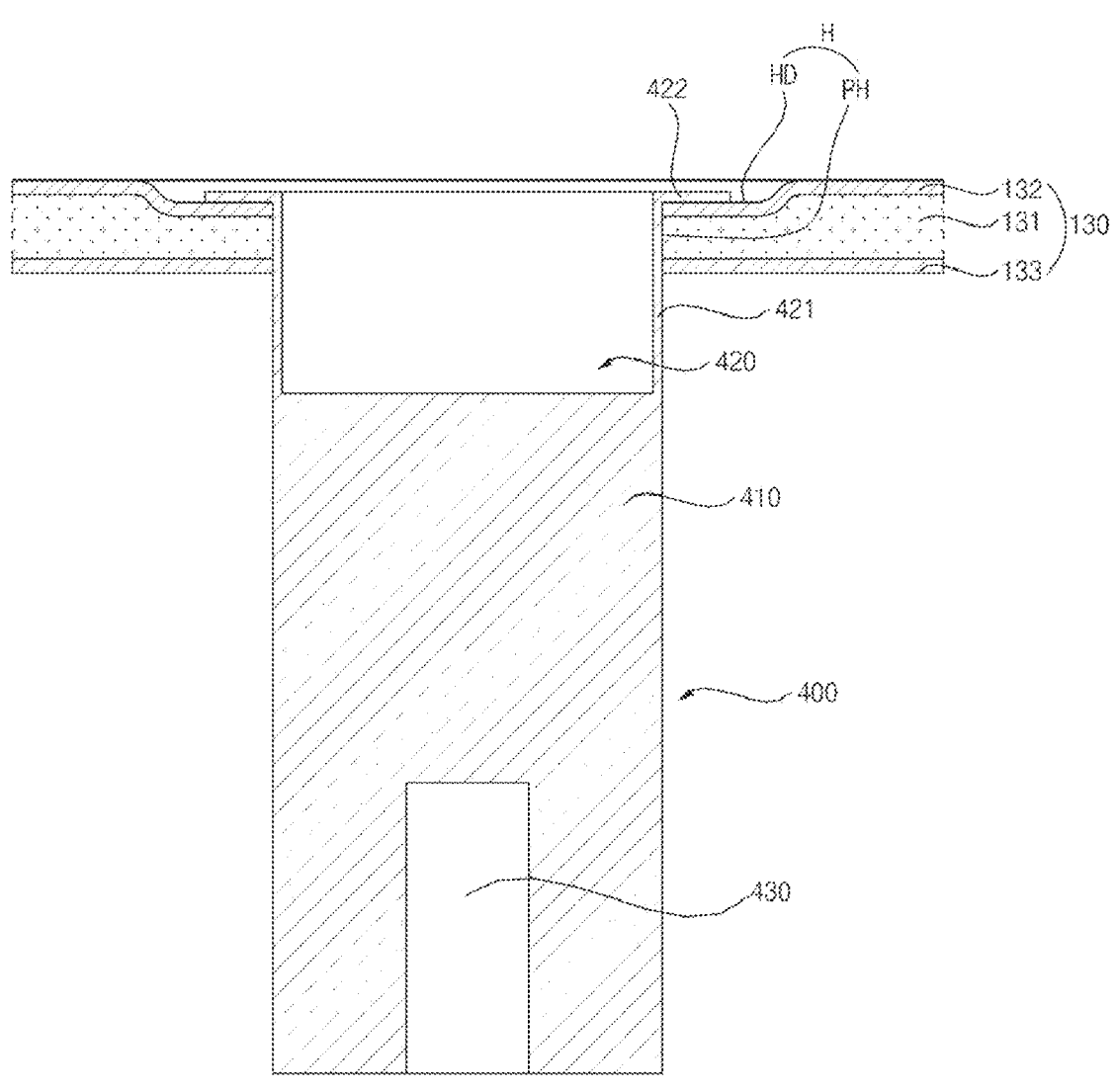

Referring to FIGS. 47 and 48, the fastening member 400 may include a shaft body 410, a coupling head 420, and a shaft hole 430. The shaft body 410 may have the shape of a circular cylinder, and the shaft hole 430 may extend long into the shaft body 410 in the longitudinal direction of the shaft body 410. The shaft hole 430 may be formed by removing the interior portion of the shaft body 410.

The coupling head 420 may include a head body 421 and a head flange 422. The head body 421 may have the shape of a cylinder, and the head flange 422 may have the shape of a disc which extends from the upper end of the head body 421 in a radial direction of the head body 421. The coupling head 420 may be deformed by external force.

The coupling head 420 may have a length D and a diameter B. The head flange 422 of the coupling head 420 may have a thickness E and a diameter A. The shaft body 410 may have a length C and a diameter B. The shaft hole 430 may have a length F and a diameter G.

For example, the length C of the shaft body 410 may be 35 mm, and the diameter B of the shaft body 410 may be 20 mm. The length D-E of the head body 421 may be 10 mm, the diameter B of the head body 421 may be 20 mm. The thickness E of the head flange 422 may be 0.5 mm, and the diameter A of the head flange 422 may be 27 mm.

The composite panel 130 may include the fastening hole H. The fastening hole H may include the through hole PH and the press portion HD. The press portion HD may be formed by depressing the front skin 132 of the composite panel 130 and thus compressing the core 131. The press portion HD may be depressed from the front surface of the skin 132 so as to form a stepped portion.

Figure 49:
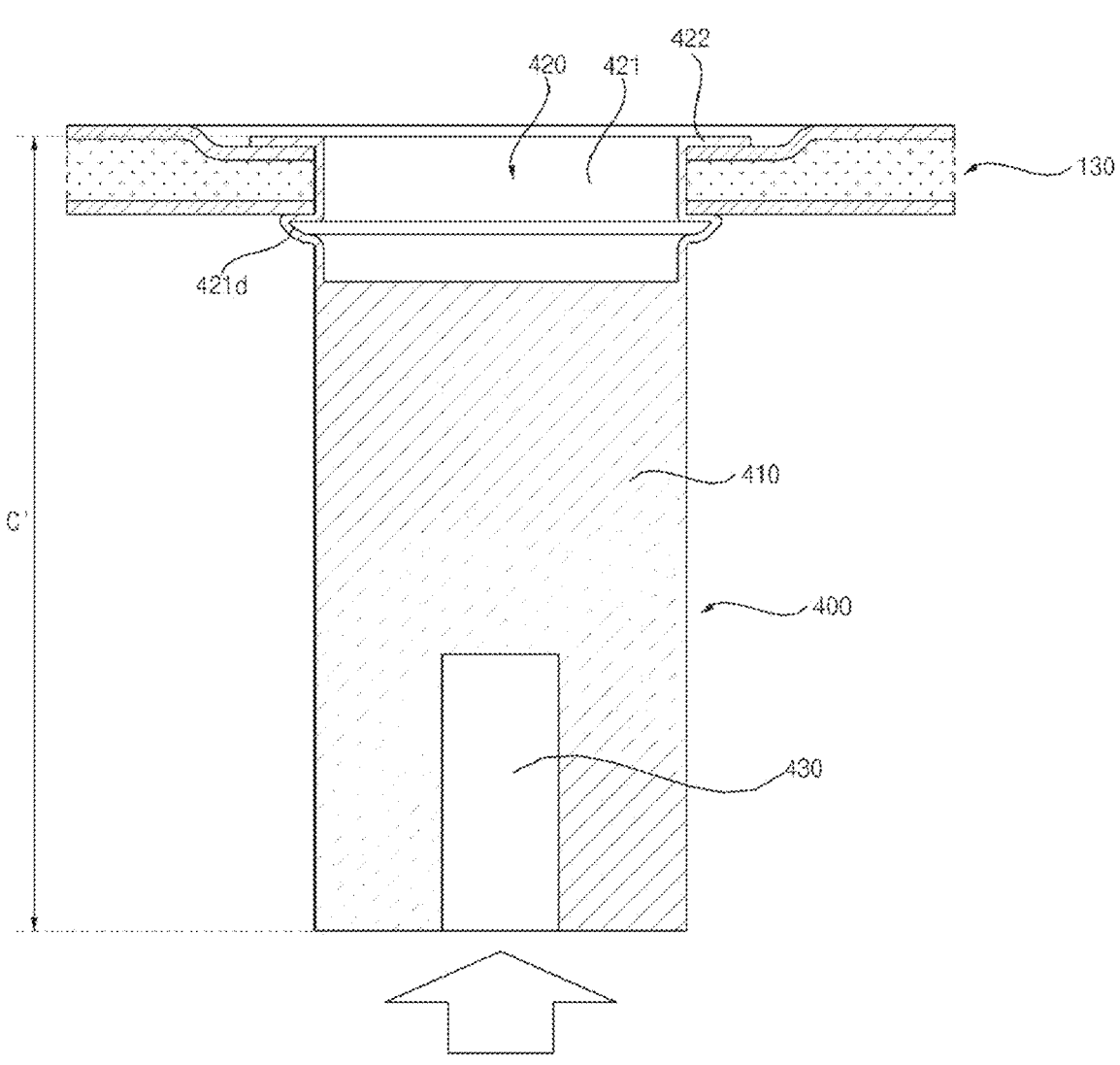

Referring to FIG. 49 in conjunction with FIG. 48, when the fastening member 400 is coupled to the composite panel 130, the shaft body 410 may be inserted into the through hole PH, and the head flange 422 may be positioned at the press portion HD. The head flange 422 may be supported by the front skin 132 of the press portion HD or be in contact with the front skin 132.

When force is applied in the longitudinal direction of the shaft body 410, the head body 421 having the shape of a cylinder may be deformed and crumpled, thereby forming a head rim 421*d* having an outside diameter larger than the outside diameter of the head body 421. The head rim 421*d* may be referred to as a rivet rim 421*d*.

Consequently, not only the horizontal fastening force but also the vertical fastening force of the fastening member 400 with respect to the composite panel 130 may be improved. The horizontal fastening force may be a force resisting a moment applied to the fastening member 400. The vertical fastening force may be a force resisting a force applied in the longitudinal direction of the fastening member 400.

Consequently, the fastening member 400 may be firmly coupled to the composite panel 130 having a thin thickness.

Referring to FIGS. 1 to 49, the display device includes a display panel, a composite panel coupled to the display panel, and a fastening member coupled to the composite panel. The composite panel includes a front skin defining a front surface of the composite panel, a rear skin defining a rear surface of the composite panel and opposed to the front skin, a core positioned between the front skin and the rear skin and including fibers, and a fastening hole formed through the front skin, the rear skin, and the core. The fastening member includes a shaft body disposed in the fastening hole, and a head connected to the shaft body and pushed into one of the front skin or the rear skin. One of front skin or the rear skin is in contact with a lateral surface of the head.

The fastening member may further include a neck connecting the shaft body to the head, and one of the front skin or the rear skin may be pushed to the neck between the head and the shaft body.

The fastening member may have a circular cylinder shape overall, a diameter of the head may be larger than a diameter of the shaft body, and the diameter of the shaft body may be larger than a diameter of the neck.

The head may include a first head portion connected to the neck and a second head portion connected to the first head portion and forming an upper surface of the fastening member, and a diameter of the second head portion may be larger than a diameter of the first head portion.

The head may include a stepped portion formed at the first head portion and the second head portion, and one of the front skin or the rear skin may be in contact with the stepped portion.

The core may be compressed at portion thereof adjacent to the head and may increase in thickness in a radial direction of the shaft body.

The front skin, the rear skin, and the core may be forcibly pushed to the neck between the head and the shaft body, and may be in contact with at least one of a lower surface of the head, a lateral surface of the neck, and an upper surface of the shaft body.

A thickness of the first head portion may be greater than a thickness of the second head portion, and a thickness of the neck may be greater than a thickness of the first head portion.

The fastening member may further include a shaft hole which is formed by removing an interior portion of the shaft body in a longitudinal direction of the shaft body from an end of the shaft body which defines a lower surface of the fastening member, and a length of the shaft body may be greater than a length of the shaft hole.

The head of the fastening member may be forcibly pushed to the front skin, the composite panel may further include a first press portion which is formed by depressing the front skin around the head of the fastening member and a second press portion which is formed by depressing the rear skin around the shaft body of the fastening member, and a depth of the second press portion may be greater than a depth of the first press portion.

An outer surface of the head may be flush with an outer surface of the front skin forming the first press portion.

A diameter of the shaft body may correspond to a diameter of the fastening hole, and a diameter of the head may be larger than a diameter of the shaft body. The fastening member may be a PEM nut.

A thickness of the neck may be greater than a thickness of the head. A thickness of the neck may be less than a thickness of the head.

The effects of the display device according to the present disclosure will be described.

According to at least one embodiment of the present disclosure, it is possible to ensure structural rigidity of a large-sized and ultra-thin display device.

According to at least one embodiment of the present disclosure, it is possible to ensure structural rigidity of a display device.

According to at least one embodiment of the present disclosure, it is possible to improve flatness of a frame of a display device.

According to at least one embodiment of the present disclosure, it is possible to improve a coupling structure of a display device.

According to at least one embodiment of the present disclosure, it is possible to improve durability and stability of a coupling structure between a composite panel and a fastening member.

The additional scope of applicability of the present disclosure will be apparent from the above detailed description. However, those skilled in the art will appreciate that various modifications and alterations are possible, without departing from the idea and scope of the present disclosure, and therefore it should be understood that the detailed description and specific embodiments, such as the preferred embodiments of the present disclosure, are provided only for illustration.

Certain embodiments or other embodiments of the disclosure described above are not mutually exclusive or distinct from each other. Any or all elements of the embodiments of the disclosure described above may be combined with each other in configuration or function.

For example, a configuration "A" described in one embodiment of the disclosure and the drawings and a configuration "B" described in another embodiment of the disclosure and the drawings may be combined with each other. That is, even if the combination of the configurations is not explicitly described, the combination is possible except in the case where it is stated that the combination is impossible.

Although embodiments have been described with reference to a number of illustrative embodiments thereof, it should be understood that numerous other modifications and embodiments that fall within the scope of the principles of this disclosure can be devised by those skilled in the art. More particularly, various variations and modifications are possible in the component parts and/or arrangements within the scope of the disclosure, the drawings and the appended claims. In addition to variations and modifications in the component parts and/or arrangements, alternative uses will also be apparent to those skilled in the art.

What is claimed is:

1. A display device comprising:
a display panel;
a rear cover coupled to the display panel; and
a fastening member coupled to the rear cover,
wherein the rear cover comprises:
a front skin forming a front surface of the rear cover;
a rear skin forming a rear surface of the rear cover and facing the front skin;
a core positioned between the front skin and the rear skin and including fibers; and
a fastening hole formed through the front skin, the rear skin, and the core,
wherein the fastening member comprises:
a shaft body disposed in the fastening hole; and
a head connected to the shaft body and pushed into one of the front skin or the rear skin,
wherein one of the front skin or the rear skin is in contact with a lateral surface of the head,
wherein the fastening member further comprises a neck connecting the shaft body to the head,
wherein one of the front skin or the rear skin is pushed to the neck between the head and the shaft body,
wherein the fastening member has a circular cylinder shape overall,
wherein a diameter of the head is larger than a diameter of the shaft body, and the diameter of the shaft body is larger than a diameter of the neck, and
wherein the front skin, the rear skin, and the core are forcibly pushed to the neck between the head and the shaft body, and are in contact with at least one of a lower surface of the head, a lateral surface of the neck, or an upper surface of the shaft body.

2. The display device according to claim 1, wherein the head comprises:
a first head portion connected to the neck; and
a second head portion connected to the first head portion and forming an upper surface of the fastening member, and
wherein a diameter of the second head portion is larger than a diameter of the first head portion.

3. The display device according to claim 2, wherein the head comprises a stepped portion formed between a lateral surface of the first head portion and a lateral surface of the second head portion, and
wherein one of the front skin or the rear skin is in contact with the stepped portion.

4. The display device according to claim 3, wherein the core is compressed at a portion adjacent to the head and thicknesses of the core gradually increase in a radial direction of the shaft body.

5. The display device according to claim 2, wherein a thickness of the first head portion is greater than a thickness of the second head portion, and wherein a thickness of the neck is greater than a thickness of the first head portion.

6. The display device according to claim 5, wherein the fastening member further comprises a shaft hole which is formed by removing an inner portion of the shaft body in a longitudinal direction of the shaft body from an end of the shaft body forming a lower surface of the fastening member, and wherein a length of the shaft body is greater than a length of the shaft hole.

7. The display device according to claim 1, wherein the head of the fastening member is forcibly pushed to the front skin, wherein the rear cover further comprises:

a first press portion depressed down from the front surface of the front skin around the head of the fastening member; and a second press portion depressed down from the rear surface of the rear skin around the shaft body of the fastening member, and wherein a depth of the second press portion is greater than a depth of the first press portion.

8. The display device according to claim 7, wherein an outer surface of the head is polished with an outer surface of the front skin forming the first press portion.

9. The display device according to claim 1, wherein a diameter of the shaft body corresponds to a diameter of the fastening hole, and wherein a diameter of the head is larger than a diameter of the shaft body.

10. The display device according to claim 1, wherein a thickness of the neck is greater than a thickness of the head.

11. The display device according to claim 1, wherein a thickness of the neck is less than a thickness of the head.

12. The display device according to claim 1, wherein the fastening member is a PEM nut.

13. A display device comprising:

a display panel;

a rear cover coupled to the display panel; and a fastening member coupled to the rear cover, wherein the rear cover comprises:

a front skin forming a front surface of the rear cover;

a rear skin forming a rear surface of the rear cover and facing the front skin;

a core positioned between the front skin and the rear skin and including fibers; and a fastening hole formed through the front skin, the rear skin, and the core, wherein the fastening member comprises:

a shaft body disposed in the fastening hole; and a head connected to the shaft body and pushed into one of the front skin or the rear skin, wherein one of the front skin or the rear skin is in contact with a lateral surface of the head, wherein the head of the fastening member is forcibly pushed to the front skin, wherein the rear cover further comprises:

a first press portion depressed down from the front surface of the front skin around the head of the fastening member; and a second press portion depressed down from the rear surface of the rear skin around the shaft body of the fastening member, and wherein a depth of the second press portion is greater than a depth of the first press portion.

14. The display device according to claim 13, wherein an outer surface of the head is polished with an outer surface of the front skin forming the first press portion.

* * * * *